United States Patent
Miura et al.

(10) Patent No.: US 7,735,034 B2
(45) Date of Patent: Jun. 8, 2010

(54) SIMULATION MODEL FOR A SEMICONDUCTOR DEVICE DESCRIBING A QUASI-STATIC DENSITY OF A CARRIER AS A NON-QUASI-STATIC MODEL

(75) Inventors: Mitiko Miura, Higashihiroshima (JP); Noriaki Nakayama, Ebina (JP)

(73) Assignee: Semiconductor Technology Academic Research Center, Yokohama-shi (JP)

( * ) Notice: Subject to any disclaimer, the term of this patent is extended or adjusted under 35 U.S.C. 154(b) by 309 days.

(21) Appl. No.: 12/019,511

(22) Filed: Jan. 24, 2008

(65) Prior Publication Data
US 2008/0244477 A1    Oct. 2, 2008

Related U.S. Application Data

(62) Division of application No. 10/933,335, filed on Sep. 3, 2004, now Pat. No. 7,343,571.

(30) Foreign Application Priority Data

Sep. 10, 2003    (JP)    ............................ 2003-318947

(51) Int. Cl.
*G06F 17/50*    (2006.01)
(52) U.S. Cl. ..................... 716/4; 716/1; 716/6; 716/16; 716/17; 703/13; 703/14
(58) Field of Classification Search ............. 716/1, 716/4, 6, 7, 9, 16, 17; 703/13, 14; 324/318, 324/765; 251/709
See application file for complete search history.

(56) References Cited

U.S. PATENT DOCUMENTS

| 5,467,291 | A | * | 11/1995 | Fan et al. ..................... 703/14 |
| 5,652,716 | A | | 7/1997 | Battersby |
| 6,472,233 | B1 | | 10/2002 | Ahmed et al. |
| 6,490,706 | B2 | * | 12/2002 | Mattisson ..................... 716/1 |
| 6,526,556 | B1 | | 2/2003 | Stoica et al. |
| 6,553,340 | B1 | | 4/2003 | Kumashiro |
| 6,711,723 | B2 | | 3/2004 | Tsai et al. |
| 6,720,768 | B2 | | 4/2004 | Crozier et al. |
| 6,877,043 | B2 | | 4/2005 | Mallory et al. |
| 6,884,333 | B2 | | 4/2005 | Landau |
| 2003/0170898 | A1 | | 9/2003 | Gundersen et al. |

OTHER PUBLICATIONS

Noriaki Nakayama, et al. "A Self-Consistent Non-Quasi-Static MOSFET Model for Circuit Simulation Based on Transient Carrier Response," Jpn. J. Appl. Phys. vol. 42 Part 1, No. 4B, Apr. 2003, pp. 2132-2136.

(Continued)

*Primary Examiner*—Helen Rossoshek
(74) *Attorney, Agent, or Firm*—Oblon, Spivak, McClelland, Maier & Neustadt, L.L.P.

(57) ABSTRACT

There is disclosed a simulation model and method for designing a semiconductor device being used for a simulation apparatus for designing a semiconductor device that includes using assuming units as to carrier transient density and current flow of electrodes along with a non-quasi-static model describing unit of the simulation apparatus. A simulation apparatus and computer readable medium with a simulation program for executing the method are also included.

24 Claims, 30 Drawing Sheets

OTHER PUBLICATIONS

"A MOSFET Model for Circuit Simulation Based on Carrier-Transit Delay," Noriaki Nakayama, Prepared in Jun. 2003, Presented at the Public Hearing on Dissertations of the Graduate School of Advanced Sciences of Matter, Hiroshima University, Jul. 25, 2003.

Wu et al., "Non-quasi-static models including all injection levels and DC, AC, and transient emitter crowding in bipolar transistors," Jan. 1991, Electron Devices, IEEE Transactions on, vol. 38, Issue 1, pp. 167-177.

Choi et al., "A time dependent hydrodynamic device simulator SNU-2D with new discretization scheme and algorithm" Jul. 1994, Computer-Aided Design of Integrated Circuits and Systems, IEEE Transactions on, vol. 13, Issue 7, pp. 899-908.

Enz, "An MOS Transistor model for RF IC design valid in all regions of operation," Jan. 2002, Microwave Theory and Techniques, IEEE Transactions on, vol. 50, Issue 1, Part 2, pp. 342-359.

Chai et al., "Comparison of quasi-static and non-quasi-static capacitance models for the four-terminal MOSFET," Sep. 1987, Electron Device Letters, IEEE, vol. 8, Issue 9, pp. 377-379.

Soo-Young Oh, et al. "Transient Analysis of MOS Transistors", IEEE Journal of Solid-State Circuits, vol. SC-15, No. 4, Aug. 1980, pp. 636-643.

* cited by examiner

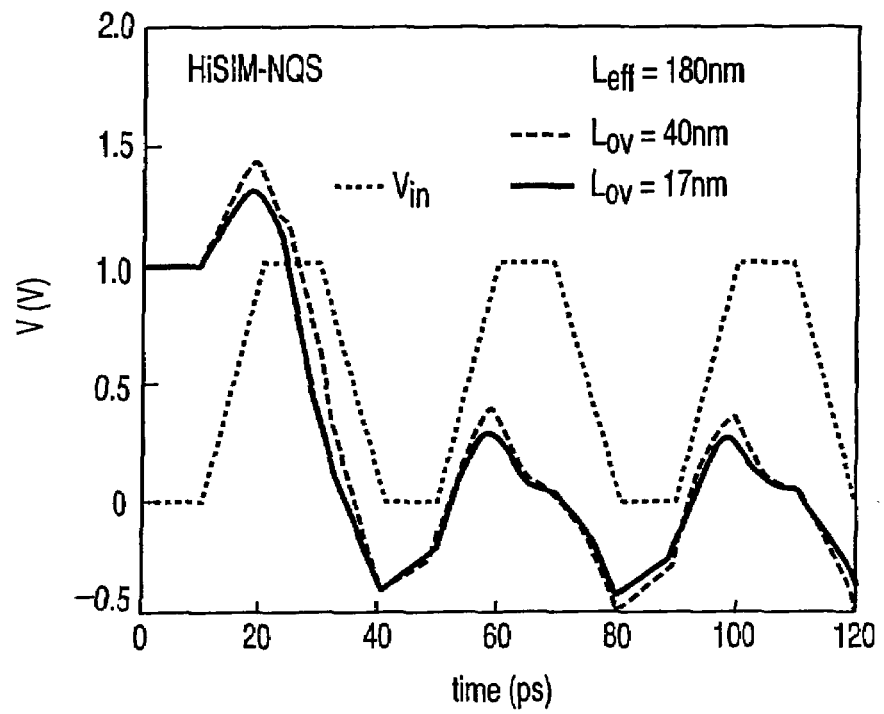
F I G. 2A
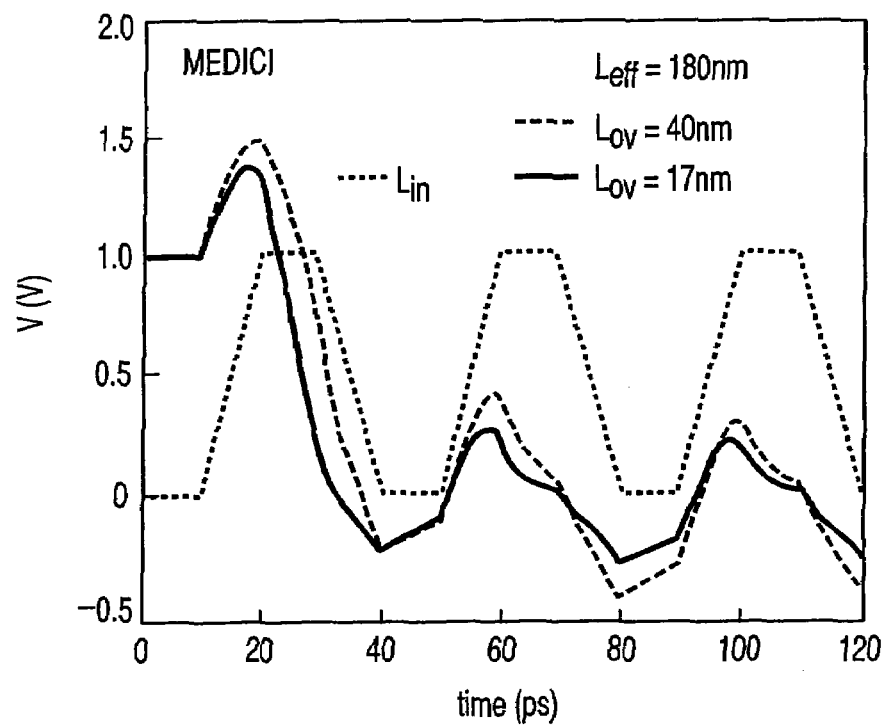
F I G. 2B

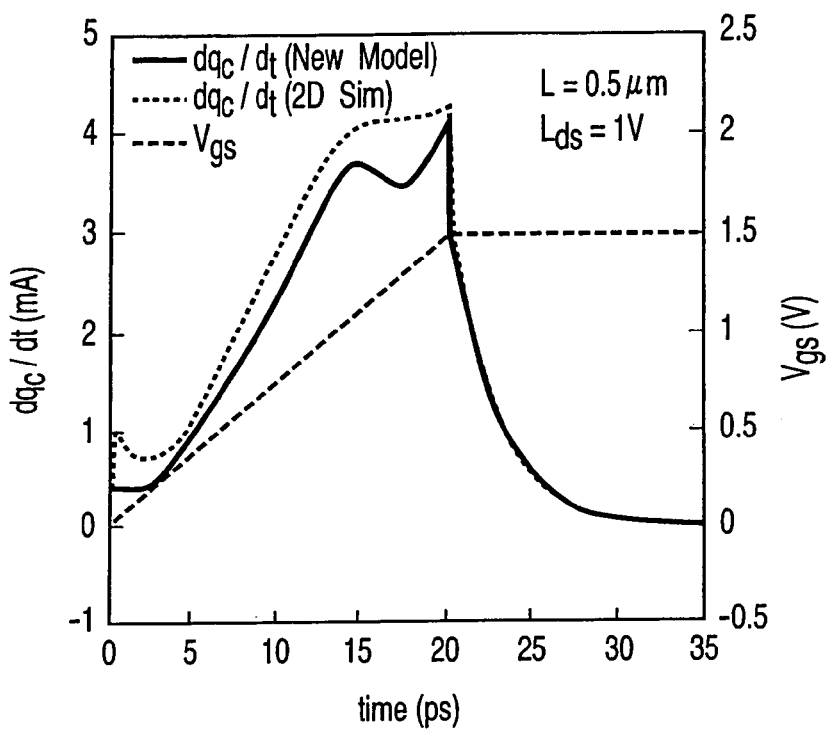
F I G. 27
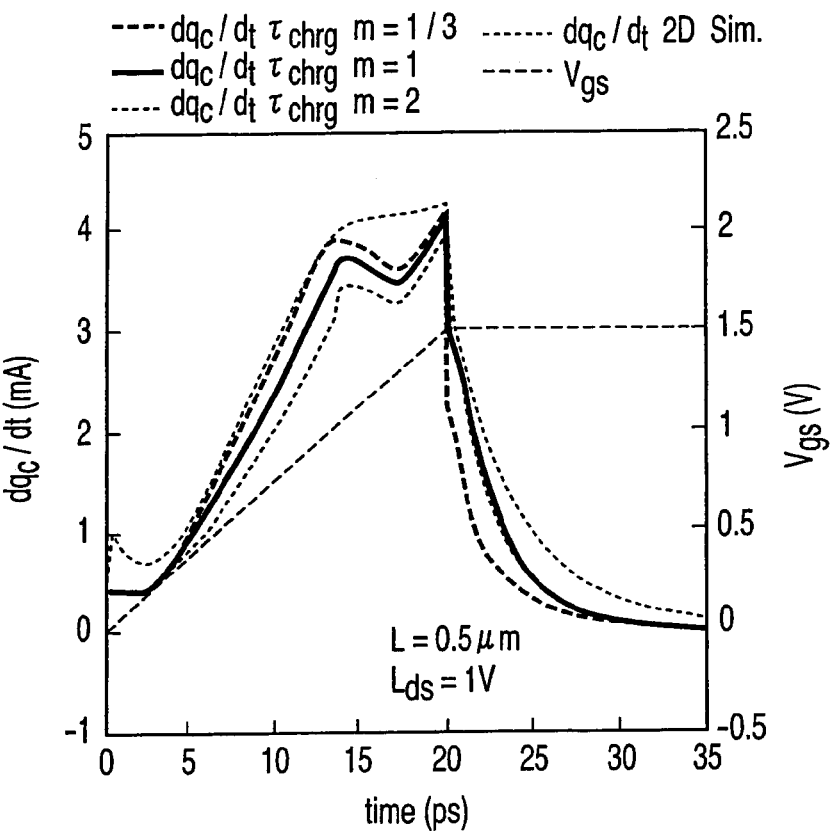
F I G. 28

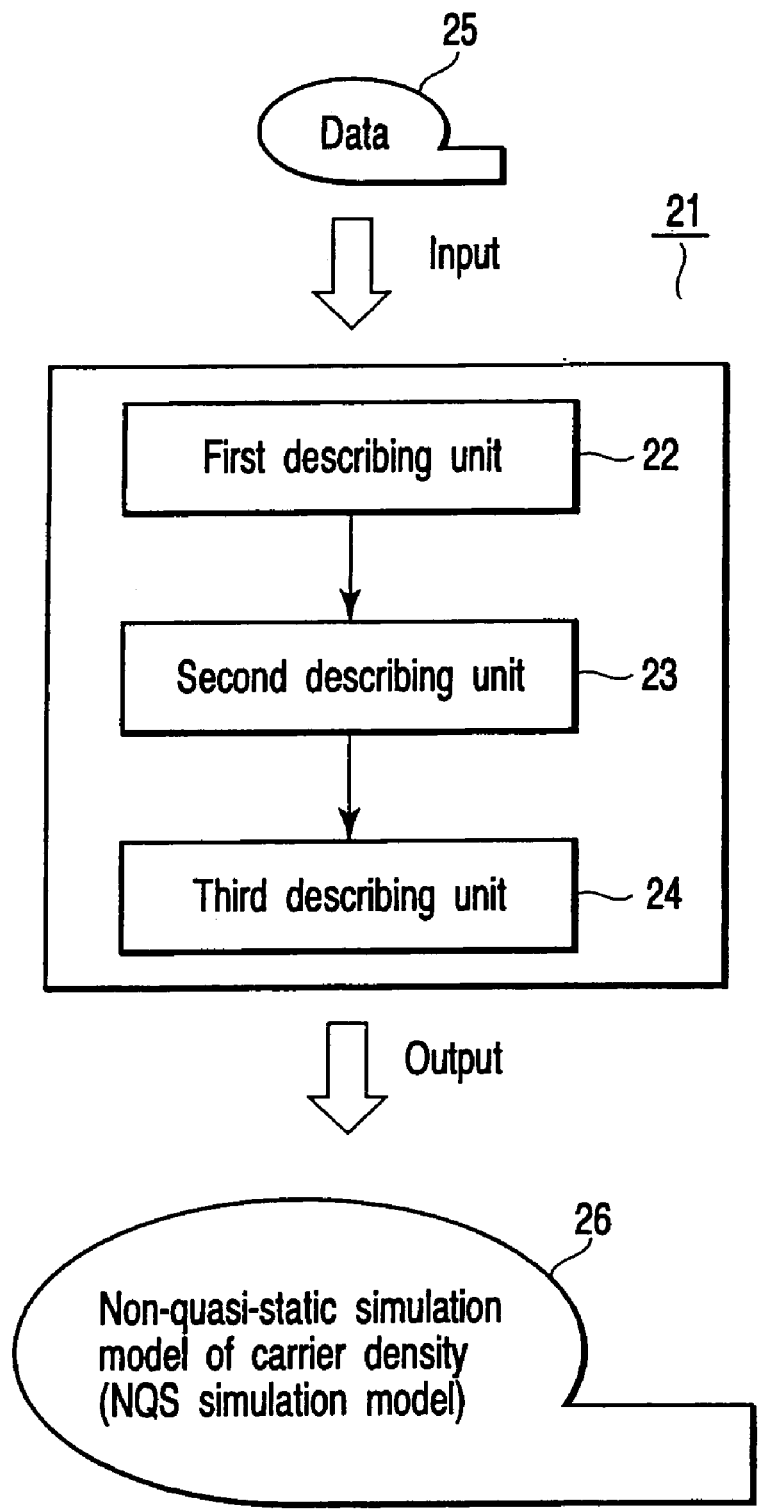
F I G. 38

SIMULATION MODEL FOR A SEMICONDUCTOR DEVICE DESCRIBING A QUASI-STATIC DENSITY OF A CARRIER AS A NON-QUASI-STATIC MODEL

CROSS-REFERENCE TO RELATED APPLICATIONS

This application is a Divisional application of Ser. No. 10/933,335 filed Sep. 3, 2004 based upon and claims the benefit of priority from the prior Japanese Patent Application No. 2003-318947, filed on Sep. 10, 2003; the entire contents of which are incorporated herein by reference.

BACKGROUND OF THE INVENTION

1. Field of the Invention

The present invention relates to a technique for designing a semiconductor device comprising at least one semiconductor element having at least two electrodes, particularly to a simulation model for designing a semiconductor device in which reproducibility of a behavior in a transition state of a carrier in each electrode and between the electrodes during a high-speed operation of a semiconductor element, an apparatus for simulating the designing of a semiconductor device, a method of simulating the designing of a semiconductor device, a computer-readable recording medium in which a program for simulating the designing of a semiconductor device, a semiconductor device designed using them, and a method of manufacturing the semiconductor device.

2. Description of the Related Art

When a semiconductor device is manufactured, in general, an operation of a designed semiconductor device is usually predicted beforehand by simulation prior to actual manufacturing of the semiconductor device. In general, the operation of the semiconductor device is reproduced by the simulation to thereby confirm and inspect whether or not an actually manufactured semiconductor device exerts its performance as desired.

Here, a case where the high-speed operation of a metal-oxide-semiconductor field-effect transistor (MOSFET) is reproduced by simulation will be described with respect to a semiconductor device comprising, for example, a MOSFET which is one type of an semiconductor element. In this case, a simulation model capable of analyzing and reproducing a behavior of a carrier in a source/drain and channel of the MOSFET with high precision is required in order to raise the precision of the simulation. A passage time (passage delay) of the carrier which runs to the drain from the source via the channel needs to be considered in order to obtain the simulation model. As the simulation model for designing the semiconductor device in consideration of the passage delay of the carrier passed through the channel, a large number of simulation models, so-called non-quasi-static models (NQS models), have heretofore been proposed. The NQS simulation model has been described, for example, in Jpn. J. Appl. Phys. Vol. 42 (2003) pp. 2132-2136 Part 1, No. 4B, April 2003.

For example, as a first non-quasi-static model, there is a model in which an actual transistor (MOSFET) is virtually divided into a plurality of small transistors, and resistance is held between the transistors to thereby represent delay of carrier running. As a second non-quasi-static model, there is a model in which resistances having different values are virtually arranged between source and gate and between gate and drain to thereby represent the delay in carrier running. Furthermore, as a third non-quasi-static model, there is a model in which a relaxing time is introduced in forming a charge in the channel, and the time is solved using a virtual equivalent apparatus. As a typical example of the third non-quasi-static model, there is a model called the Berkeley short-channel IGFET model (BSIM) which has been most frequently used in the world.

As described above, various non-quasi-static models have been proposed in order to predict or reproduce the high-speed operation of the MOSFET by the simulation with a high precision. However, a satisfactory result is not practically obtained in most of the models. For example, in the first non-quasi-static model, since the number of the transistors to be considered increases, a calculation time becomes enormous. Moreover, since a channel length changes with the number of divided channels in the first non-quasi-static model, it is not clear whether or not all the divided and integrated transistors have the same characteristics as those of the whole transistor before divided. In the second non-quasi-static model, estimation of each resistance value is not clear. Further in the third non-quasi-static model, it is difficult to converge the device. Moreover, in the third non-quasi-static model, a charge loss in a channel region generated by an NQS effect in consideration of the delay in the carrier running in the channel region cannot be described.

Moreover, this problem does not necessarily occur only in the MOSFET. The above-described problem could be caused generally in the semiconductor element having at least two electrodes concerned with transmission/reception of the carrier, for example, in a bipolar transistor or the like.

As described above, in the conventional non-quasi-static simulation model, it has heretofore been difficult to predict or reproduce the behavior of the carrier in the semiconductor device including the semiconductor element within a practically allowable time and with a high precision regardless of a stationary or transient state. It is substantially impossible to especially predict or reproduce the behavior of the carrier in the semiconductor element or the semiconductor device which operates at a high speed using the simulation model with the high precision. Moreover, needless to say, it is clearly difficult to simulate the operations of the semiconductor element and the semiconductor device within the practically allowable time and with high precision by a simulation apparatus, simulation method, or simulation program using the above-described simulation model. Additionally, there is a possibility that performances of the semiconductor element and the semiconductor device designed or manufactured using the simulation model, simulation apparatus, simulation method, and simulation program are largely inferior to desired performances.

BRIEF SUMMARY OF THE INVENTION

The present invention has been developed in order to solve the above-described problems, and an object is to provide a simulation model for designing a semiconductor device, capable of predicting or reproducing an operation of a semiconductor element quickly within a practically allowable time regardless of a high/low operation speed with a high precision by enhancement of analysis precision of a behavior of a carrier in at least one place in one electrode to the other electrode not only in a stationary state but also in a transient state with respect to at least one semiconductor element having at least two electrodes.

Another object is to provide a simulation apparatus for designing a semiconductor device, capable of simulating an operation of a semiconductor element quickly within a practically allowable time regardless of a high/low operation speed with a high precision using the simulation model for designing the semiconductor device, a method of simulating the designing of the semiconductor device, and a computer-readable recording medium recording a simulation program for designing the semiconductor device, which allows a computer to execute simulation for designing the semiconductor device.

A further object is to provide a semiconductor device comprising at least one semiconductor element capable of exerting a function as desired, and a method of manufacturing the semiconductor device, capable of efficiently and easily manufacturing the semiconductor device by at least one of designing and inspecting of the semiconductor element, performed using the simulation model for designing the semiconductor device, the simulation apparatus for designing the semiconductor device, the simulation method for designing the semiconductor device, or the simulation program for designing the semiconductor device, which is recorded in a computer-readable recording medium and which allows a computer to execute the simulation for designing the semiconductor device.

According to an aspect of the present invention, there is provided a simulation model for designing a semiconductor device, comprising:

adding at least a part of a difference between a density of a carrier described in a quasi-static manner with respect to a voltage applied between first and second electrodes at a predetermined first time and a density of the carrier described in a transient state at a predetermined second time before the first time to the density of the carrier described in the transient state at the second time in accordance with a delay by the carrier running between the first and second electrodes from the first time until the second time to thereby describe the density of the carrier at the first time in the transient state with respect to at least one semiconductor element having at least two first and second electrodes;

describing a current flowing between the first and second electrodes as a sum of a current flowing between the first and second electrodes in the quasi-static manner, and a displacement current which is a ratio of a change of the quasi-static density of the carrier with time between the first and second electrodes; and assuming that the density of the carrier in the transient state satisfies the current flowing between the first and second electrodes to thereby describe the quasi-static density of the carrier as a non-quasi-static model.

According to another aspect of the invention, there is provided a simulation model for designing a semiconductor device being used for a simulation apparatus for designing a semiconductor device, comprising:

assuming that, with respect to at least one semiconductor element having at least two first and second electrodes, a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and the $q(t_i)$, $q(t_{i-1})$, $Q(t_i)$ and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$, and these processes are processed by a first assuming unit included in the simulation apparatus;

assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and the $I(t_i)$, $I_{DC}$, and $dq(t_i)/dt$ satisfy the following second equation at the time $t_i$: $I(t_i)=I_{DC}+dq(t_i)/dt$, and these processes are processed by a second assuming unit included in the simulation apparatus; and substituting the $q(t_i)$ obtained from the first equation into the second equation to thereby describe the $Q(t_i)$ as a non-quasi-static model, and this process is the processed by a non-quasi-static model describing unit included in the simulation apparatus.

In these simulation models for designing the semiconductor device, the carrier density and current from one electrode to the other electrode of the semiconductor element can be described in a general-purpose manner regardless of a stationary state, a transient state, a static state, or a quasi-static state. Moreover, the delay of the carrier from one electrode to the other electrode of the semiconductor element does not have to be distinguished by a type of mechanism. Accordingly, analysis precision of the behavior of the carrier in at least one place from one electrode to the other electrode of the semiconductor element can be enhanced not only in the stationary state but also in the transient state. Additionally, a possibility that the time required for predicting or reproducing the operation of the semiconductor element unnecessarily increases can be almost eliminated.

As described above, according to the simulation model for designing the semiconductor device according to the aspects of the present invention, with respect to at least one semiconductor element having at least two electrodes, the analysis precision of the behavior of the carrier in at least one place from one electrode to the other electrode can be enhanced not only in the stationary state but also in the transient state. Additionally, the possibility that the time required for predicting or reproducing the operation of the semiconductor element unnecessarily increases can be almost eliminated. As a result, in the simulation model for designing the semiconductor device according to one and the other embodiments of the present invention, the operation of the semiconductor element can be predicted or reproduced quickly within a practically allowable time and with a high precision regardless of a high/low operation speed.

According to still another aspect of the invention, there is provided a simulation apparatus for designing a semiconductor device, comprising:

a first describing unit which adds at least a part of a difference between a density of a carrier described in a quasi-static manner with respect to a voltage applied between first and second electrodes at a predetermined first time and a density of the carrier described in a transient state at a predetermined second time before the first time to the density of the carrier described in the transient state at the second time in accordance with a delay by the carrier running between the first and second electrodes from the first time until the second time to thereby describe the density of the carrier at the first time in the transient state with respect to at least one semiconductor element having at least two first and second electrodes;

a second describing unit to describe a current flowing between the first and second electrodes as a sum of a current flowing between the first and second electrodes in the quasi-static manner, and a displacement current which is a ratio of a change of the quasi-static density of the carrier with time between the first and second electrodes; and a third describing unit which assumes that the density of the carrier in the transient state satisfies the current flowing between the first and second electrodes to thereby describe the quasi-static density of the carrier as a non-quasi-static model.

According to still another aspect of the invention, there is provided a simulation apparatus for designing a semiconductor device, comprising:

a first assuming unit which assumes that, with respect to at least one semiconductor element having at least two first and second electrodes, a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and the $q(t_i)$, $q(t_{i-1})$, $Q(t_i)$, and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$;

a second assuming unit which assumes that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and the $I(t_i)$, $I_{DC}$, and $dq(t_i)/dt$ satisfy the following second equation at the time $t_i$: $I(t_i)=I_{DC}+dq(t_i)/dt$; and a non-quasi-static model describing unit which substitutes the $q(t_i)$ obtained from the first equation into the second equation to thereby describe the $Q(t_i)$ as a non-quasi-static model.

These simulation apparatuses for designing the semiconductor devices comprise a process unit which describes the density of the carrier in at least one place from one electrode to the other electrode of the semiconductor element as the non-quasi-static model using the simulation model for designing the semiconductor device according to the present invention. Therefore, the carrier density and current from one electrode to the other electrode of the semiconductor element can be described in the general-purpose manner regardless of the stationary state, transient state, static state, or quasi-static state. Moreover, the delay of the carrier from one electrode to the other electrode of the semiconductor element does not have to be distinguished by the type of the mechanism. Accordingly, the analysis precision of the behavior of the carrier in at least one place from one electrode to the other electrode of the semiconductor element is enhanced not only in the stationary state but also in the transient state. Additionally, there is hardly a possibility that the time required for predicting or reproducing the operation of the semiconductor element unnecessarily increases.

According to still another aspect of the invention, there is provided a simulation method for designing a semiconductor device, comprising:

adding at least a part of a difference between a density of a carrier described in a quasi-static manner with respect to a voltage applied between first and second electrodes at a predetermined first time and a density of the carrier described in a transient state at a predetermined second time before the first time to the density of the carrier described in the transient state at the second time in accordance with a delay by the carrier running between the first and second electrodes from the first time until the second time to thereby describe the density of the carrier at the first time in the transient state with respect to at least one semiconductor element having at least two first and second electrodes;

describing a current flowing between the first and second electrodes as a sum of a current flowing between the first and second electrodes in the quasi-static manner, and a displacement current which is a ratio of a change of the quasi-static density of the carrier with time between the first and second electrodes;

assuming that the density of the carrier in the transient state satisfies the current flowing between the first and second electrodes to thereby describe the quasi-static density of the carrier as a non-quasi-static model; and analyzing electric characteristics of the semiconductor element using the non-quasi-static model.

According to still another aspect of the invention, there is provided a simulation method for designing a semiconductor device, comprising:

assuming that, with respect to at least one semiconductor element having at least two first and second electrodes, a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and the $q(t_i)$, $q(t_{i-1})$, $Q(t_i)$ and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$, and these processes are processed by a first assuming unit included in the simulation apparatus;

assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and the $I(t_i)$, $I_{DC}$, and $dq(t_i)/dt$ satisfy the following second equation at the time $t_i$: $I(t_i)=I_{DC}+dq(t_i)/dt$, and these processes are processed by a second assuming unit included in the simulation apparatus;

substituting the $q(t_i)$ obtained from the first equation into the second equation to thereby describe the $Q(t_i)$ as a non-quasi-static model, and this process is processed by a non-quasi-static model describing unit included in the simulation apparatus; and analyzing electric characteristics of the semiconductor element using the non-quasi-static model.

In the simulation method for designing the semiconductor device, the density of the carrier from one electrode to the other electrode of the semiconductor element is described as the non-quasi-static model using the simulation model for designing the semiconductor device according to the present invention. Moreover, the electric characteristics of the semiconductor element are analyzed using the non-quasi-static model. That is, the carrier density and current in at least one place from one electrode to the other electrode of the semiconductor element can be described and analyzed in the general-purpose manner regardless of the stationary state, transient state, static state, or quasi-static state. Moreover, the delay of the carrier from one electrode to the other electrode of the semiconductor element does not have to be distinguished by the type of the mechanism. Accordingly, the analysis precision of the behavior of the carrier in at least one place from one electrode to the other electrode of the semiconductor element can be enhanced not only in the stationary state but also in the transient state. Additionally, the possibility that the time required for predicting or reproducing the operation of the semiconductor element unnecessarily increases can be almost eliminated.

According to still another aspect of the invention, there is provided a computer-readable recording medium recording a simulation program for designing a semiconductor device, the program allowing a computer to execute:

a first describing process of adding at least a part of a difference between a density of a carrier described in a quasi-static manner with respect to a voltage applied between first and second electrodes at a predetermined first time and a density of the carrier described in a transient state at a predetermined second time before the first time to the density of the carrier described in the transient state at the second time in accordance with a delay by the carrier running between the first and second electrodes from the first time until the second time to thereby describe the density of the carrier at the first time in the transient state with respect to at least one semiconductor element having at least two first and second electrodes;

a second describing process of describing a current flowing between the first and second electrodes as a sum of a current flowing between the first and second electrodes in the quasi-static manner, and a displacement current which is a ratio of a change of the quasi-static density of the carrier with time between the first and second electrodes; and a third describing process of assuming that the density of the carrier in the transient state satisfies the current flowing between the first and second electrodes to thereby describe the quasi-static density of the carrier as a non-quasi-static model.

According to still another aspect of the invention, there is provided a computer-readable recording medium recording a simulation program for designing a semiconductor device being used for a simulation apparatus for designing a semiconductor device, the program allowing a computer to execute:

a first assuming process of assuming that, with respect to at least one semiconductor element having at least two first and second electrodes, a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and the $q(t_i)$, $q(t_{i-1})$, $Q(t_i)$, and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$;

a second assuming process of assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and the $I(t_i)$, $I_{DC}$, and $dq(t_i)/dt$ satisfy the following second equation at the time $t_i$: $I(t_i)=I_{DC}+dq(t_i)/dt$; and a non-quasi-static model describing process of substituting the $q(t_i)$ obtained from the first equation into the second equation to thereby describe the $Q(t_i)$ as a non-quasi-static model.

In these computer-readable recording mediums, the simulation program for designing the semiconductor device is recorded to allow the computer to describe the density of the carrier in at least one place from one electrode to the other electrode of the semiconductor element as the non-quasi-static model using the simulation model for designing the semiconductor device according to the present invention, when allowing the computer to execute simulation for designing the semiconductor device. Moreover, in the simulation program for designing the semiconductor device, the computer is allowed to analyze the electric characteristics of the semiconductor element using the non-quasi-static model. That is, in the simulation program for designing the semiconductor device, recorded in the recording mediums, the computer can be allowed to describe and analyze the carrier density and current from one electrode to the other electrode of the semiconductor element in the general-purpose manner regardless of the stationary state, transient state, static state, or quasi-static state. Additionally, the computer does not have to distinguish the delay of the carrier from one electrode to the other electrode of the semiconductor element by the type of the mechanism. Accordingly, the analysis precision of the behavior of the carrier in at least one place from one electrode to the other electrode of the semiconductor element by the computer can be enhanced not only in the stationary state but also in the transient state. Additionally, the possibility that the time required for the predicting or reproducing process of the operation of the semiconductor element by the computer unnecessarily increases can be almost eliminated.

Thus, according to the simulation apparatus for designing the semiconductor device, the simulation method for designing the semiconductor device, and the computer-readable recording medium in which the simulation program for designing the semiconductor device is recorded according to the other aspect of the present invention, with respect to at least one semiconductor element having at least two electrodes, the density of the carrier in at least one place from one electrode to the other electrode can be described as the non-quasi-static model using the simulation model for designing the semiconductor device according to the present invention. As a result, the simulation apparatus for designing the semiconductor device, the simulation method for designing the semiconductor device, and the computer-readable recording medium in which the simulation program for designing the semiconductor device is recorded according to the other aspect of the present invention are capable of simulating the operation of the semiconductor element quickly within the practically allowable time and with the high precision regardless of the high/low operation speed.

According to still another aspect of the invention, there is provided a semiconductor device comprising:

at least one semiconductor element having at least two first and second electrodes, at least one of designing and inspecting of the semiconductor element being performed using a simulation model for designing the semiconductor device, the simulation model for designing the semiconductor device, comprising:

adding at least a part of a difference between a density of a carrier described in a quasi-static manner with respect to a voltage applied between first and second electrodes at a predetermined first time and a density of the carrier described in a transient state at a predetermined second time before the first time to the density of the carrier described in the transient state at the second time in accordance with a delay by the carrier running between the first and second electrodes from the first time until the second time to thereby describe the density of the carrier at the first time in the transient state;

describing a current flowing between the first and second electrodes as a sum of a current flowing between the first and second electrodes in the quasi-static manner, and a displacement current which is a ratio of a change of the quasi-static density of the carrier with time between the first and second electrodes; and assuming that the density of the carrier in the transient state satisfies the current flowing between the first and second electrodes to thereby describe the quasi-static density of the carrier as a non-quasi-static model.

According to still another aspect of the invention, there is provided a semiconductor device comprising:

at least one semiconductor element having at least two first and second electrodes, at least one of designing and inspecting of the semiconductor element being performed using a simulation model for designing the semiconductor device being used for a simulation apparatus for designing a semiconductor device, the simulation model for designing the semiconductor device, comprising:

assuming that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and the $q(t_i)$, $q(t_{i-1})$, $Q(t_i)$ and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$, and these processes are processed by a first assuming unit included in the simulation apparatus;

assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and the $I(t_i)$, $I_{DC}$, and $dq(t_i)/dt$ satisfy the following second equation at the time $t_i$: $I(t_i)=I_{DC}+dq(t_i)/dt$, and these processes are processed by a second assuming unit included in the simulation apparatus; and substituting the $q(t_i)$ obtained from the first equation into the second equation to thereby describe the $Q(t_i)$ as a non-quasi-static model, and this process is processed by a non-quasi-static-model describing unit included in the simulation apparatus.

According to still another aspect of the invention, there is provided a semiconductor device comprising:

at least one semiconductor element having at least two first and second electrodes, at least one of designing and inspecting of the semiconductor element being performed using a simulation apparatus for designing the semiconductor device, the simulation apparatus for designing the semiconductor device, comprising:

a first describing unit which adds at least a part of a difference between a density of a carrier described in a quasi-static manner with respect to a voltage applied between first and second electrodes at a predetermined first time and a density of the carrier described in a transient state at a predetermined second time before the first time to the density of the carrier described in the transient state at the second time in accordance with a delay by the carrier running between the first and second electrodes from the first time until the second time to thereby describe the density of the carrier at the first time in the transient state;

a second describing unit to describe a current flowing between the first and second electrodes as a sum of a current flowing between the first and second electrodes in the quasi-static manner, and a displacement current which is a ratio of a change of the quasi-static density of the carrier with time between the first and second electrodes; and a third describing unit which assumes that the density of the carrier in the transient state satisfies the current flowing between the first and second electrodes to thereby describe the quasi-static density of the carrier as a non-quasi-static model.

According to still another aspect of the invention, there is provided a semiconductor device comprising:

at least one semiconductor element having at least two first and second electrodes, at least one of designing and inspecting of the semiconductor element being performed using a simulation apparatus for designing the semiconductor device, the simulation apparatus for designing the semiconductor device, comprising:

a first assuming unit which assumes that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and the $q(t_i)$, $q(t_{i-1})$, $Q(t_i)$, and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$;

a second assuming unit which assumes that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and the $I(t_i)$, $I_{DC}$, and $dq(t_i)/dt$ satisfy the following second equation at the time $t_i$: $I(t_i)=I_{DC}+dq(t_i)/dt$; and a non-quasi-static model describing unit which substitutes the $q(t_i)$ obtained from the first equation into the second equation to thereby describe the $Q(t_i)$ as a non-quasi-static model.

According to still another aspect of the invention, there is provided a semiconductor device comprising:

at least one semiconductor element having at least two first and second electrodes, at least one of designing and inspecting of the semiconductor element being performed by a simulation method for designing the semiconductor device, the simulation method for designing the semiconductor device, comprising:

adding at least a part of a difference between a density of a carrier described in a quasi-static manner with respect to a voltage applied between first and second electrodes at a predetermined first time and a density of the carrier described in a transient state at a predetermined second time before the first time to the density of the carrier described in the transient state at the second time in accordance with a delay by the carrier running between the first and second electrodes from the first time until the second time to thereby describe the density of the carrier at the first time in the transient state;

describing a current flowing between the first and second electrodes as a sum of a current flowing between the first and second electrodes in the quasi-static manner, and a displacement current which is a ratio of a change of the quasi-static density of the carrier with time between the first and second electrodes;

assuming that the density of the carrier in the transient state satisfies the current flowing between the first and second electrodes to thereby describe the quasi-static density of the carrier as a non-quasi-static model; and analyzing electric characteristics of the semiconductor element using the non-quasi-static model.

According to still another aspect of the invention, there is provided a semiconductor device comprising:

at least one semiconductor element having at least two first and second electrodes, at least one of designing and inspecting of the semiconductor element being performed by a simulation method for designing the semiconductor device being executed by a simulation apparatus for designing a semiconductor device, the simulation method for designing the semiconductor device, comprising:

assuming that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and the $q(t_i)$, $q(t_{i-1})$, $Q(t_i)$, and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$, and the processes are processed by a first assuming unit included in the simulation apparatus;

assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and the $I(t_i)$, $I_{DC}$, and $dq(t_i)/dt$ satisfy the following second equation at the time $t_i$: $I(t_i)=I_{DC}+dq(t_i)/dt$, and these processes are processed by a second assuming unit in the simulation apparatus;

substituting the $q(t_i)$ obtained from the first equation into the second equation to thereby describe the $Q(t_i)$ as a non-quasi-static model, and this process is processed by a non-quasi-static model describing unit in the simulation apparatus; and analyzing electric characteristics of the semiconductor element using the non-quasi-static model, and this process is processed by the simulation apparatus.

According to still another aspect of the invention, there is provided a semiconductor device comprising:

at least one semiconductor element having at least two first and second electrodes, at least one of designing and inspecting of the semiconductor element being performed by a computer operating based on a simulation program for designing the semiconductor device, which is read from a computer-readable recording medium, the recording medium recording the simulation program for designing the semiconductor device, which allows the computer to execute:

a first describing process of adding at least a part of a difference between a density of a carrier described in a quasi-static manner with respect to a voltage applied between first and second electrodes at a predetermined first time and a density of the carrier described in a transient state at a predetermined second time before the first time to the density of the carrier described in the transient state at the second time in accordance with a delay by the carrier running between the first and second electrodes from the first time until the second time to thereby describe the density of the carrier at the first time in the transient state;

a second describing process of describing a current flowing between the first and second electrodes as a sum of a current flowing between the first and second electrodes in the quasi-static manner, and a displacement current which is a ratio of a change of the quasi-static density of the carrier with time between the first and second electrodes; and a third describing process of assuming that the density of the carrier in the transient state satisfies the current flowing between the first and second electrodes to thereby describe the quasi-static density of the carrier as a non-quasi-static model.

According to still another aspect of the invention, there is provided a semiconductor device comprising:

at least one semiconductor element having at least two first and second electrodes, at least one of designing and inspecting of the semiconductor element being performed by a computer operating based on a simulation program for designing the semiconductor device being used for a simulation apparatus for designing a semiconductor device as the computer, which is read from a computer-readable recording medium, the recording medium recording the simulation program for designing the semiconductor device, which allows the computer to execute:

a first assuming process processed by a first assuming unit included in the simulation apparatus of assuming that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and the $q(t_i)$, $q(t_{i-1})$, $Q(t_i)$ and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$;

a second assuming process processed by a second assuming unit included in the simulation apparatus of assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and the $I(t_i)$, $I_{DC}$, and $dq(t_i)/dt$ satisfy the following second equation at the time $t_i$: $I(t_i)=I_{DC}+dq(t_i)/dt$; and a non-quasi-static model describing process processed by a non-quasi-static model describing unit included in the simulation apparatus of substituting the $q(t_i)$ obtained from the first equation into the second equation to thereby describe the $Q(t_i)$ as a non-quasi-static model.

Each of these semiconductor devices has at least one semiconductor element having at least two first and second electrodes. Moreover, at least one of the designing and the inspecting of the semiconductor element is performed using at least one of the simulation model for designing the semiconductor device, the simulation apparatus for designing the semiconductor device, the simulation method for designing the semiconductor device, and the simulation program for designing the semiconductor device, which is recorded in the computer-readable recording medium. That is, according to the other aspects of the present invention, the semiconductor device comprises at least one semiconductor element with respect to which at least one of the designing and inspecting is performed by high-precision analysis of the behavior of the carrier in the semiconductor element not only in the stationary state but also in the transient state.

Thus, in the semiconductor device according to the aspect of the present invention, at least one of the designing and the inspecting is performed with respect to at least one semiconductor element having at least two first and second electrodes using at least one of the simulation model for designing the semiconductor device, the simulation apparatus for designing the semiconductor device, the simulation method for designing the semiconductor device, and the simulation program for designing the semiconductor device, which is recorded in the computer-readable recording medium. As a result, the semiconductor devices according to the other aspects of the present invention can exert the performances as desired.

According to still another aspect of the invention, there is provided a method of manufacturing a semiconductor device, comprising:

performing at least one of designing and inspecting with respect to at least one semiconductor element having at least two first and second electrodes using a simulation model for designing the semiconductor device, the simulation model for designing the semiconductor device, comprising:

adding at least a part of a difference between a density of a carrier described in a quasi-static manner with respect to a voltage applied between first and second electrodes at a predetermined first time and a density of the carrier described in a transient state at a predetermined second time before the first time to the density of the carrier described in the transient state at the second time in accordance with a delay by the carrier running between the first and second electrodes from the first time until the second time to thereby describe the density of the carrier at the first time in the transient state;

describing a current flowing between the first and second electrodes as a sum of a current flowing between the first and second electrodes in the quasi-static manner, and a displacement current which is a ratio of a change of the quasi-static density of the carrier with time between the first and second electrodes; and assuming that the density of the carrier in the transient state satisfies the current flowing between the first and second electrodes to thereby describe the quasi-static density of the carrier as a non-quasi-static model.

According to still another aspect of the invention, there is provided a method of manufacturing a semiconductor device, comprising:

performing at least one of designing and inspecting with respect to at least one semiconductor element having at least two first and second electrodes using a simulation model for designing the semiconductor device being used for a simulation apparatus for designing the semiconductor device, the simulation model for designing the semiconductor device, comprising:

assuming that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and the $q(t_i)$, $q(t_{i-1})$, $Q(t_i)$, and $\tau$ satisfy the following first equation for a time $(t_i - t_{i-1})$ from the time $t_{i-1}$ until the time $t_i$: $q(t_i)=q(t_{i-1})+(t_i-t_{i-1})/\tau[Q(t_i)-q(t_{i-1})]$, and these processes are processed by a first assuming unit included in the simulation apparatus;

assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and the $I(t_i)$, $I_{DC}$, and $dq(t_i)/dt$ satisfy the following second equation at the time $t_i$: $I(t_i)=I_{DC}+dq(t_i)/dt$, and these processes are performed by a second assuming unit included in the simulation apparatus; and substituting the $q(t_i)$ obtained from the first equation into the second equation to thereby describe the $Q(t_i)$ as a non-quasi-static model, and this process is performed by a non-quasi-static model describing unit in the simulation apparatus.

According to still another aspect of the invention, there is provided a method of manufacturing a semiconductor device, comprising:

performing at least one of designing and inspecting with respect to at least one semiconductor element having at least two first and second electrodes using a simulation apparatus for designing the semiconductor device, the simulation apparatus for designing the semiconductor device, comprising:

a first describing unit which adds at least a part of a difference between a density of a carrier described in a quasi-static manner with respect to a voltage applied between first and second electrodes at a predetermined first time and a density of the carrier described in a transient state at a predetermined second time before the first time to the density of the carrier described in the transient state at the second time in accordance with a delay by the carrier running between the first and second electrodes from the first time until the second time to thereby describe the density of the carrier at the first time in the transient state;

a second describing unit to describe a current flowing between the first and second electrodes as a sum of a current flowing between the first and second electrodes in the quasi-static manner, and a displacement current which is a ratio of a change of the quasi-static density of the carrier with time between the first and second electrodes; and a third describing unit which assumes that the density of the carrier in the transient state satisfies the current flowing between the first and second electrodes to thereby describe the quasi-static density of the carrier as a non-quasi-static model.

According to still another aspect of the invention, there is provided a method of manufacturing a semiconductor device, comprising:

performing at least one of designing and inspecting with respect to at least one semiconductor element having at least two first and second electrodes using a simulation apparatus for designing the semiconductor device, the simulation apparatus for designing the semiconductor device, comprising:

a first assuming unit which assumes that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and the $q(t_i)$, $q(t_{i-1})$, $Q(t_i)$, and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$;

a second assuming unit which assumes that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and the $I(t_i)$, $I_{DC}$, and $dq(t_i)/dt$ satisfy the following second equation at the time $t_i$: $I(t_i)=I_{DC}+dq(t_i)/dt$; and a non-quasi-static model describing unit which substitutes the $q(t_i)$ obtained from the first equation into the second equation to thereby describe the $Q(t_i)$ as a non-quasi-static model.

According to still another aspect of the invention, there is provided a method of manufacturing a semiconductor device, comprising:

performing at least one of designing and inspecting with respect to at least one semiconductor element having at least two first and second electrodes using a simulation method for designing the semiconductor device, the simulation method for designing the semiconductor device, comprising:

adding at least a part of a difference between a density of a carrier described in a quasi-static manner with respect to a voltage applied between first and second electrodes at a predetermined first time and a density of the carrier described in a transient state at a predetermined second time before the first time to the density of the carrier described in the transient state at the second time in accordance with a delay by the carrier running between the first and second electrodes from the first time until the second time to thereby describe the density of the carrier at the first time in the transient state;

describing a current flowing between the first and second electrodes as a sum of a current flowing between the first and second electrodes in the quasi-static manner, and a displacement current which is a ratio of a change of the quasi-static density of the carrier with time between the first and second electrodes;

assuming that the density of the carrier in the transient state satisfies the current flowing between the first and second electrodes to thereby describe the quasi-static density of the carrier as a non-quasi-static model; and analyzing electric characteristics of the semiconductor element using the non-quasi-static model.

According to still another aspect of the invention, there is provided a method of manufacturing a semiconductor device, comprising:

performing at least one of designing and inspecting with respect to at least one semiconductor element having at least two first and second electrodes using a simulation method for designing the semiconductor device being executed by a simulation apparatus for designing a semiconductor device, the simulation method for designing the semiconductor device, comprising:

assuming that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and the $q(t_i)$, $q(t_{i-1})$, $Q(t_i)$ and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$, and these processes are processed by a first assuming unit included in the simulation apparatus;

assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and the $I(t_i)$, $I_{DC}$, and $dq(t_i)/dt$ satisfy the following second equation at the time $t_i$: $I(t_i)=I_{DC}+dq(t_i)/dt$, and these processes are processed by a second assuming unit included in the simulation apparatus;

substituting the $q(t_i)$ obtained from the first equation into the second equation to thereby describe the $Q(t_i)$ as a non-quasi-static model, and this process is processed by a non-quasi-static model describing unit in the simulation apparatus; and analyzing electric characteristics of the semiconductor element using the non-quasi-static model, and this process is processed by the simulation apparatus.

According to still another aspect of the invention, there is provided a method of manufacturing a semiconductor device, comprising:

performing at least one of designing and inspecting with respect to at least one semiconductor element having at least two first and second electrodes by a computer operating based on a simulation program for designing the semiconductor device, which is read from a computer-readable recording medium, the recording medium recording the simulation program for designing the semiconductor device, which allows the computer to execute:

a first describing process of adding at least a part of a difference between a density of a carrier described in a quasi-static manner with respect to a voltage applied between first and second electrodes at a predetermined first time and a density of the carrier described in a transient state at a predetermined second time before the first time to the density of the carrier described in the transient state at the second time in accordance with a delay by the carrier running between the first and second electrodes from the first time until the second time to thereby describe the density of the carrier at the first time in the transient state;

a second describing process of describing a current flowing between the first and second electrodes as a sum of a current flowing between the first and second electrodes in the quasi-static manner, and a displacement current which is a ratio of a change of the quasi-static density of the carrier with time between the first and second electrodes; and a third describing process of assuming that the density of the carrier in the transient state satisfies the current flowing between the first and second electrodes to thereby describe the quasi-static density of the carrier as a non-quasi-static model.

According to still another aspect of the invention, there is provided a method of manufacturing a semiconductor device, comprising:

performing at least one of designing and inspecting with respect to at least one semiconductor element having at least two first and second electrodes by a computer operating based on a simulation program for designing the semiconductor device being used for a simulation apparatus for designing the semiconductor device, which is read from a computer-readable recording medium, the recording medium recording the simulation program for designing the semiconductor device, which allows the computer to execute:

a first assuming process processed by a first assuming unit included in the simulation apparatus of assuming that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and the $q(t_i)$, $q(t_{i-1})$, $Q(t_i)$, and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$;

a second assuming process performed by a second assuming unit included in the simulation apparatus of assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and the $I(t_i)$, $I_{DC}$, and $dq(t_i)/dt$ satisfy the following second equation at the time $t_i$: $I(t_i)=I_{DC}+dq(t_i)/dt$; and a non-quasi-static model describing process processed by a non-quasi-static model describing unit included in the simulation apparatus of substituting the $q(t_i)$ obtained from the first equation into the second equation to thereby describe the $Q(t_i)$ as a non-quasi-static model.

In these methods of manufacturing the semiconductor devices, at least one of the designing and the inspecting is performed with respect to at least one semiconductor element having at least two first and second electrodes using at least one of the simulation model for designing the semiconductor device, the simulation apparatus for designing the semiconductor device, the simulation method for designing the semiconductor device, and the simulation program for designing the semiconductor device, which is recorded in the computer-readable recording medium according to the present invention. That is, according to the methods of manufacturing the semiconductor devices according to the other aspects of the present invention, the behavior of the carrier in the semiconductor element is quickly and easily analyzed not only in the stationary state but also in the transient state with the high precision, and at least one of the designing and the inspecting of the semiconductor device can be quickly and easily performed with the high precision.

Thus, in the methods of manufacturing the semiconductor devices according to the other aspects of the present invention, at least one of the designing and the inspecting is performed with respect to at least one semiconductor element having at least two first and second electrodes using at least one of the simulation model for designing the semiconductor device, the simulation apparatus for designing the semiconductor device, the simulation method for designing the semiconductor device, and the simulation program for designing the semiconductor device, which is recorded in a computer-readable recording medium, according to the present invention. As a result, in the methods of manufacturing the semiconductor devices according to the other aspects of the present invention, the semiconductor device capable of exerting its performance as desired.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 2A and 2B are graphs showing simulation results of voltage applications in the simulation model and a two-dimensional device simulation apparatus according to the first embodiment;

FIG. 27 is a graph showing calculation results of displacement currents by the simulation model according to the third embodiment and two-dimensional device simulation;

FIG. 28 is a graph showing dependence of the displacement current on the charging delay by the simulation model according to the third embodiment and calculation results of the displacement currents by the two-dimensional simulation;

FIG. 38 is a block diagram simplifying and schematically showing the simulation apparatus for designing the semiconductor device according to a fifth embodiment;

DETAILED DESCRIPTION OF THE INVENTION

Embodiments according to the present invention will be described hereinafter with reference to the drawings.

First Embodiment

Figure 1:
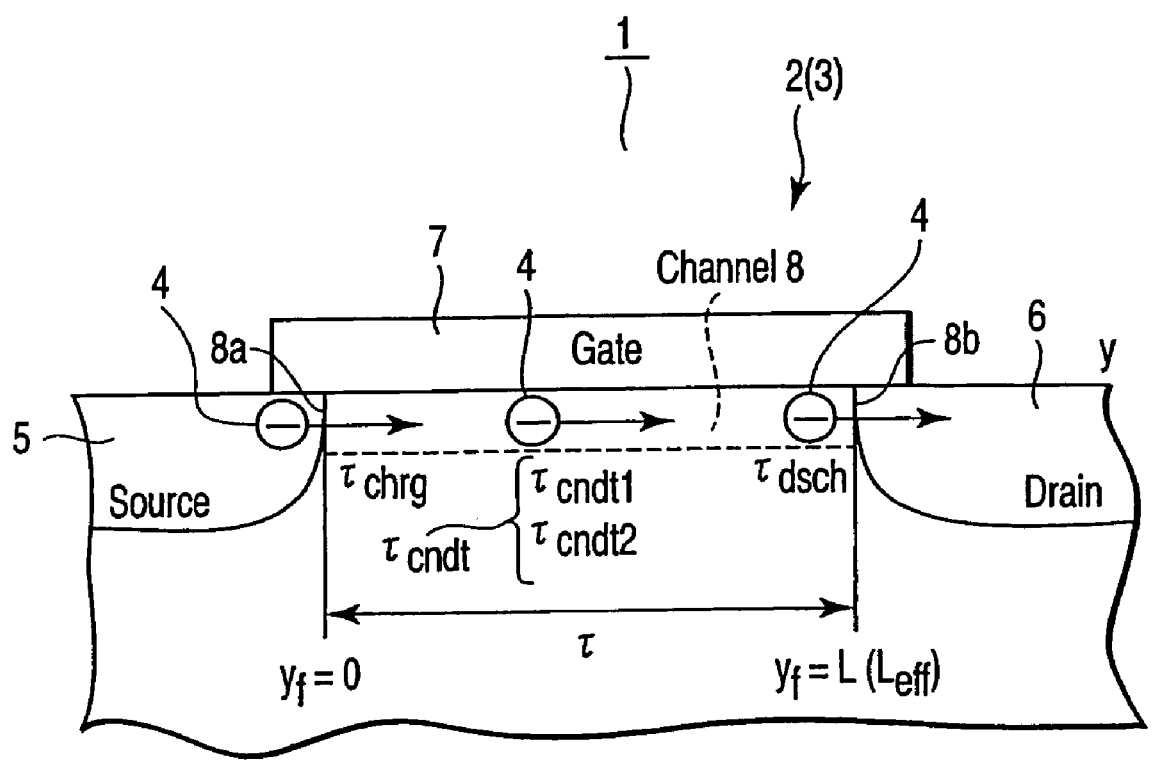
FIG. 1 is a diagram schematically showing origin of an NQS effect of a simulation model for designing a semiconductor device according to a first embodiment.
Figure 3:
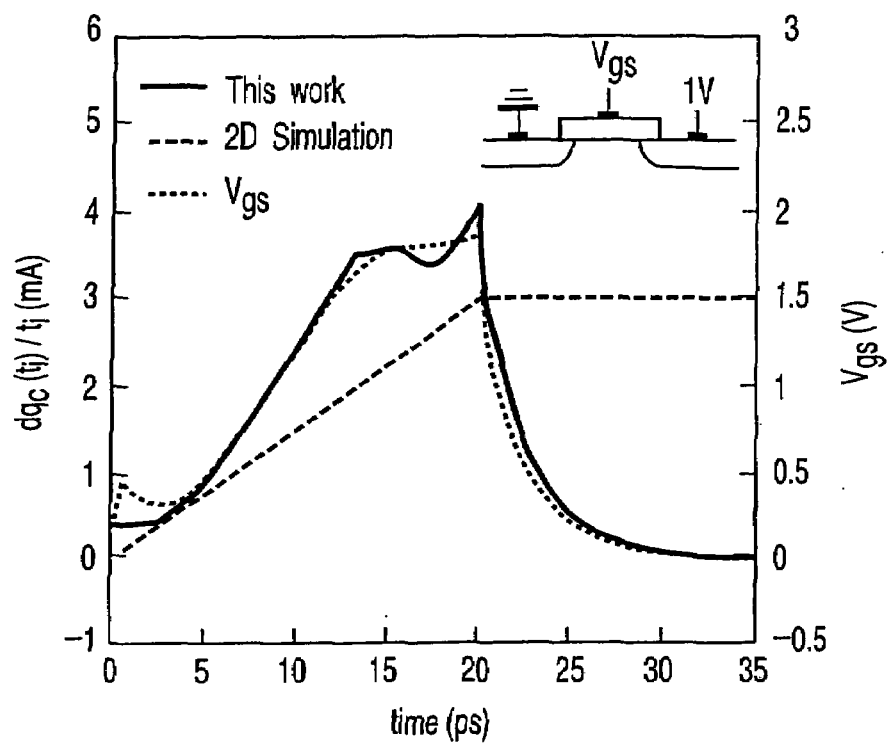
FIG. 3 is a graph showing simulation results of displacement currents in the simulation model and the two-dimensional device simulation apparatus according to the first embodiment.
Figure 4:
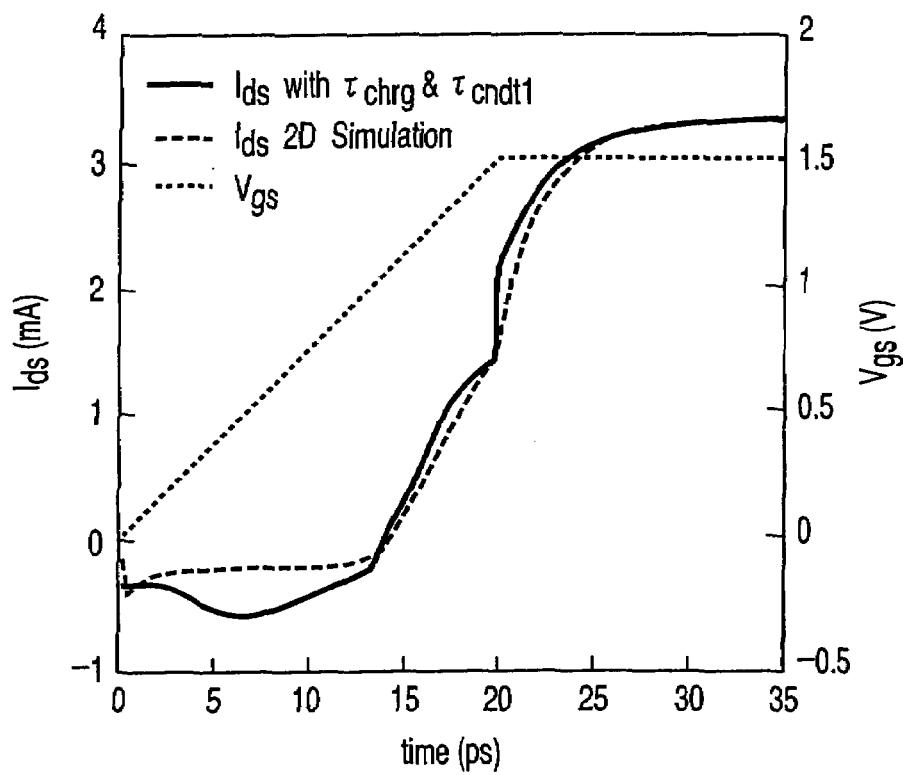
FIG. 4 is a graph showing simulation results of transient drain currents in the simulation model and the two-dimensional device simulation apparatus according to the first embodiment.
Figure 5:
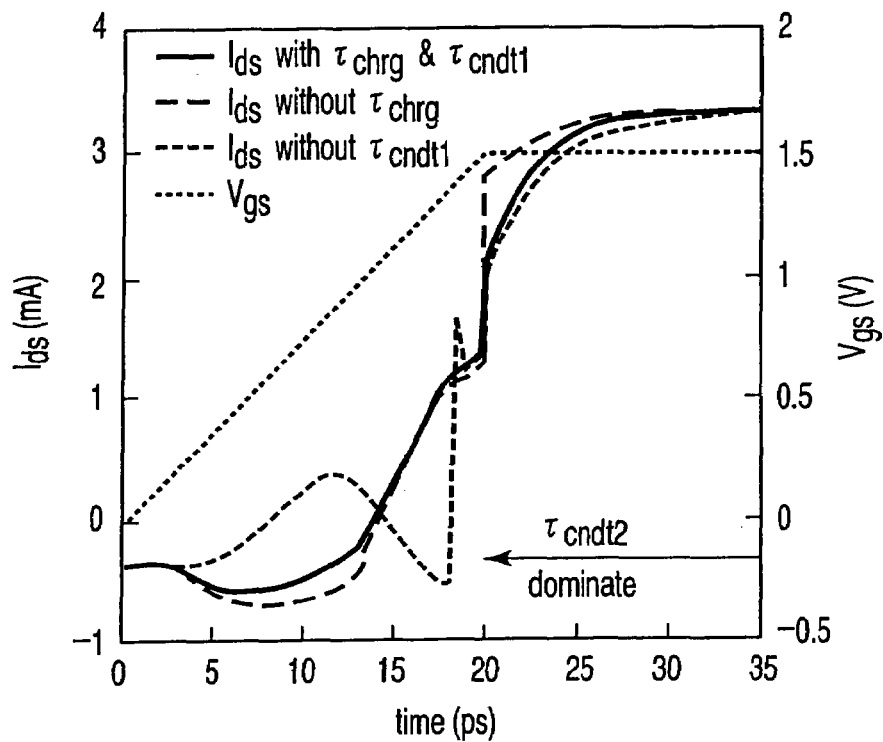
FIG. 5 is a graph showing a function of each delay model in transient carrier transport in the simulation model according to the first embodiment.
Figure 6:
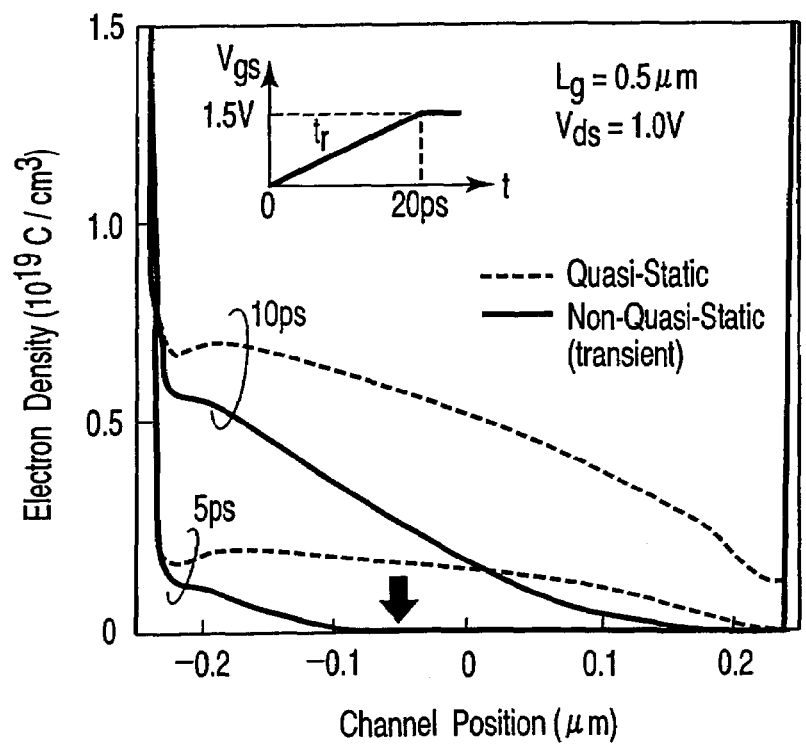
FIG. 6 is a graph showing calculation results of carrier concentrations in a transient state and quasi-static approximation.

First, a first embodiment according to the present invention will be described with reference to FIGS. 1 to 6. FIG. 1 is a diagram schematically showing origin of an NQS effect of a simulation model for designing a semiconductor device according to the present embodiment. FIGS. 2A and 2B are graphs showing simulation results of voltage applications in the simulation model and a two-dimensional device simulation apparatus according to the present embodiment. FIG. 3 is a graph showing simulation results of displacement currents in the simulation model and the two-dimensional device simulation apparatus according to the present embodiment. FIG. 4 is a graph showing simulation results of transient drain currents in the simulation model and the two-dimensional device simulation apparatus according to the present embodiment. FIG. 5 is a graph showing a function of each delay model in transient carrier transport in the simulation model according to the present embodiment. FIG. 6 is a graph showing calculation results of carrier concentrations in a transient state and quasi-static approximation.

In the present embodiment, the simulation model for designing the semiconductor device comprising at least one semiconductor element having at least two first and second electrodes will be described as the simulation model for designing the semiconductor device. Concretely, the simulation model for designing the semiconductor device, comprising at least one metal-oxide-semiconductor field-effect transistor (MOSFET) which is one type of the semiconductor element, will be described. Especially, a non-quasi-static model (NQS model) for designing a semiconductor circuit (semiconductor element) will be described. In the model, a passing delay ($\tau$) of a carrier between a source and a drain, generated during a high-speed operation of the MOSFET, is considered, and the model is capable of simulating (reproducing) the high-speed operation of the MOSFET with a high precision quickly. That is, the NQS simulation model for designing the MOSFET having the high precision and speed will be described.

In a general two-dimensional simulation apparatus (2D device simulator) for designing a semiconductor device (not shown), three basic device equations including Poisson distribution, current density equation, and current continuity equation are simultaneously solved. However, since this method is very time-consuming, the method is not suitable for practical circuit simulation. Therefore, even a large circuit is simplified in such a manner that simulation can be performed within a practically allowable time. A passing time of the carrier via a channel has heretofore been ignored based on quasi-static (QS) approximation in the circuit simulation. However, as shown in FIG. 6, in the QS approximation, very many errors are generated in the simulation with respect to a high-speed circuit operation (fast switching) of the MOSFET. In FIG. 6, a quasi-static electron density and a non-quasi-static electron density are compared with each other at a switch-on time of a gate voltage $V_{gs}$ in the graph. A non-quasi-static (NQS) model in which the passing delay of the carrier between the source and the drain is considered is required in order to correctly predict or reproduce a circuit performance of the MOSFET operating at the high speed.

Among the basic device equations, a current continuity equation (1) describes an effect by the NQS model. The current continuity equation (1) is solved together with a current density equation (2):

$$\frac{dn(y,t)}{dt} = -\frac{1}{qW}\frac{dI(y,t)}{dy} \tag{1}$$

$$I(y,t) = qW\mu n(y,t)\frac{d\varphi(y,t)}{dy}, \tag{2}$$

wherein $I(y, t)$, $n(y, t)$, and $\varphi(y, t)$ are a current, an electron density, and a surface potential in a y position along the channel at a time t, respectively. Moreover, q, W, and μ denote an electric charge, a transistor width (channel width), and a mobility of carrier, respectively. The current continuity equation (1) is integrated from an original point (y=0) which is a source-side end portion of the channel to the position y along a longitudinal direction of the channel, and then substituted into the current density equation (2). Accordingly, the following equation (3) is obtained.

$$qW\int_0^y \frac{dn(y',t)}{dt}dy' = \int_0^y dI(y,t) \tag{3}$$
$$= -qW\mu n(y,t)\frac{d\varphi(y,t)}{dy} + I(0,t)$$

An equation (3) is integrated from the original point (y=0) to the drain-side end portion (y=L) of the channel again. Accordingly, the following equations (4a) and (4b) are obtained.

$$I(0,t) = \tag{4a}$$
$$I(L,t) = q\frac{W}{L}\mu\int_{\varphi_{s0}}^{\varphi_{sL}} n(y,t)d\varphi(y,t) + q\frac{W}{L}\int_0^L \int_0^y \frac{dn(y',t)}{dT}dy'dy$$

$$I(0,t) = I(L,t) = I_0(t) + \frac{dq_C(t)}{dt}, \tag{4b}$$

wherein L denotes a length of the channel. Moreover, $\varphi_{s0}$ and $\varphi_{sL}$ denote surface potentials in source and drain-side end portions of the channel. Furthermore, $q_c(t)$ is a total amount of channel charges at time development t. Equation (4b) indicates that the transient current flowing through the channel is constituted of a conduction current (first term of right side) and displacement current (second term). The conduction current is derived under a stationary state, when a change of a potential substantially quickly follows the change of the applied voltage. In the QS approximation, $q_c(t)$ is described as in the following equation (5).

$$q_c(t) = q_c(V(t)) \tag{5}$$

The present inventors have a purpose of enhancing the precision of analytic description concerning $q_c(t)$ in the same manner as in the above-described general NQS model. Moreover, the result well agrees with a result obtained by solving the current continuity equation (1) as described later. This respect will be described hereinafter in detail.

First, an NQS simulation model will be described with reference to FIG. 1. This is a simulation model developed by the present inventors in order to verify the NQS effect according to the present embodiment in consideration of the passing delay of the carrier. FIG. 1 schematically shows a delay structure which is an origin of the NQS effect of a simulation model 1 for designing and inspecting/designing a semiconductor device according to the present embodiment. In the present embodiment, as shown in FIG. 1, as the simulation model 1 for designing and inspecting the semiconductor device, a semiconductor device 3 comprising a MOSFET 2 which is one type of semiconductor element is used. The present inventors have developed the simulation model 1 based on a passing delay τ of carriers 4 constituted of three types of delay structures $\tau_{chrg}$, $\tau_{cndt}$, and $\tau_{dsch}$. The passing delay τ of the carrier 4 in the present embodiment shows a time for the electron 4 to change to a drain 6 which is a second electrode from a source 5 which is a first electrode of the MOSFET 2.

First, a delay (charging delay) in charging the carrier (electron) 4 into a channel 8 from the source 5 is modeled by $\tau_{chrg}$. Secondly, a delay (conductive delay) during passing of the carrier 4 through the channel 8 is modeled by $\tau_{cndt}$. In this case, $\tau_{cndt}$ is distinguished further as two different conductive delay. A first conductive delay determines a delay required for a head (tip) of the carrier 4 charged in the source 5 to reach a drain-side end portion (drain contact) 8b of the channel 8. The present inventors distinguish this delay as $\tau_{cndt1}$. When the head of the carrier 4 charged in the source 5 reaches the drain 6, $\tau_{cndt1}$ is governed by an electric field of the channel 8. In this case, $\tau_{cndt}$ is determined by the passing time of the carrier 4 which moves to the drain 6 from the source 5. The present inventors identify this delay as $\tau_{cndt2}$. Thirdly, when the carrier 4 enters the drain 6 from the channel 8, the carrier 4 models the delay (discharge delay) brought by electric charges discharged to the drain contact 8b by $\tau_{dsch}$. Accordingly, researches performed by the present inventors, contribution of $\tau_{dsch}$ to the NQS effect has hardly been recognized. Therefore, description of $\tau_{dsch}$ will be omitted below.

Next, the charging delay $\tau_{chrg}$ will be described. This delay $\tau_{chrg}$ satisfies a carrier concentration in a source-side end portion (source contact) 8a of the channel 8, which is determined by applied voltage V(t). Therefore, the density of the passing carrier in the source contact 8a in the channel 8 in time development $t_i$, $q_n(0, t_i)$ is described as in the following equation (6):

$$q_n(0, t_i) = q_n(0, t_{i-1}) + \frac{t_i - t_{i-1}}{\tau_{chrg}}[Q_n(0, t_i) - q_n(0, t_{i-1})], \quad (6)$$

wherein $q_n(0, t)$ denoting a transient passing carrier density is distinguished from $Q_n(0, t)$ denoting a carrier density under the stationary state. A basic idea lies in that an only part of electric charge $Q_n(0, t_i) - q_n(0, t_{i-1})$ required in the time development $t_i$ is added to an electric charge $q_n(0, t_{i-1})$ in the previous time development $t_{i-1}$ by the delay $\tau_{chrg}$. A part of this electric charge $Q_n(0, t_i) - q_n(0, t_{i-1})$ is represented by $(t_i - t_{i-1})/\tau_{chrg}$. It is to be noted that $(t_i - t_{i-1}) \leq \tau_{chrg}$.

Next, the first conductive delay $\tau_{cndt1}$ will be described. By the use of this first conductive delay $\tau_{cndt1}$, the position of the head of the carrier 4 in the channel 8 is described as in the following equation (7):

$$y_f = (t_i) = y_f(t_{i-1}) + \frac{t_i - t_{i-1}}{\tau_{cndt1}(t_i)} L \quad (7)$$

The carrier density in the channel 8 substantially linearly decreases toward $q_n(y_f, t_i)$ from a position $q_n(0, t_i)$ in the channel 8. With $0 < y_f(t_i) < L$, a total electric charge $q_c(t)$ in the channel 8 is described as in the following equation (8):

$$q_c(t_i) = \frac{1}{2} W q_n(0, t_i) y_f(t_i) \quad (8)$$

After the head of the carrier 4 reaches the drain 6, a transient carrier density $q_n(L, t_i)$ in the drain-side end portion 8b of the channel 8 is described as in the following equation (9) using the second conductive delay $\tau_{cndt2}$.

$$q_n(L, t_i) = q_n(L, t_{i-1}) + \frac{t_i - t_{i-1}}{\tau_{cndt2}}[Q_n(L, t_i) - q_n(L, t_{i-1})], \quad (9)$$

wherein $Q_n(L, t)$ denotes the carrier density in the drain-side end portion 8b of the channel 8 under the stationary state. Under this condition, $q_c(t)$ is described as in the following equation (10):

$$q_c(t_i) = \frac{1}{2}[q_n(0, t_i) + q_n(L, t_i)]L \quad (10)$$

The second conductive delay $\tau_{cndt2}$ determines a time (delay time) required for the carrier 4 to move to the drain 6 from the source 5.

The above-described NQS simulation model 1 of the present embodiment is included in a surface-potential-based simulation model HiSIM for the MOSFET described later in a fourth embodiment. Moreover, this HiSIM is incorporated so-called SPICE which is a representative example of the simulation apparatus for designing the semiconductor device (simulator for designing the semiconductor circuit) to execute SPICE simulation.

FIG. 3 shows simulation results of each displacement current $dq_c(t_i)/dt_i$ by the NQS simulation model 1 of the present embodiment and so-called MEDICI which is a representative 2D device simulator. Accordingly, the simulation results of both the displacement currents $dq_c(t_i)/dt_i$ are compared with each other, and the NQS simulation model 1 of the present embodiment is evaluated. According to the NQS simulation model 1 of the present embodiment, the charging delay $\tau_{chrg}$ was extracted together with the results of the 2D simulation under conditions of a gate length Lg=0.5 μm, drain voltage $V_{ds}$=1.0 V, and gate voltage $V_{gs}$=1.5 V in a rising time of 20 ps. This result very largely depends on the rising time of the gate voltage which is a control voltage constituting a pulse signal, applied to a gate 7 which is a third electrode of the MOSFET 2. It is to be noted that the analytic equation concerning the second conductive delay $\tau_{cndt2}$ is derived by integration of the speed via the channel 8, and this result is a function of a surface potential based on the applied voltage. The value of the first conductive delay $\tau_{cndt1}$ is determined by saturation speed. Thus, according to the NQS simulation model 1 of the present embodiment, satisfactory agreement with the result of the 2D simulation was obtained by the value of the estimated delay.

Moreover, FIG. 4 shows simulation results of each transient drain current $I(L, t_i)$ by the NQS simulation model 1 of the present embodiment and the MEDICI in the graph. Accordingly, the simulation results of both the transient drain currents $I(L, t_i)$ are compared with each other. According to the graph if FIG. 4, the NQS simulation model 1 of the present embodiment shows satisfactory agreement with the MEDICI even in the transient drain current $I(L, t_i)$.

Furthermore, FIG. 5 shows transient carrier movement by the NQS simulation model 1 of the present embodiment, that is, an operation of each delay modeled in arrangement of the transient drain currents. The charging delay $\tau_{chrg}$ indicates a condition that the carriers charged into the channel 8 from the source 5 decrease as the channel 8 is formed. When this delay is not considered, transient current reaction occurs in the same manner as transient current reaction by QS approximation. When the first conductive delay $\tau_{cndt1}$ is not considered, the carrier 4 moves only in a diffusing manner in an early stage of switch-on, and the channel 8 is slowly filled. As a result, the displacement current decreases.

Thus, in the NQS simulation model (NQS-MOSFET model) 1 of the present embodiment, importance of three different delay structures including the carrier delay reaction can be indicated. Moreover, this NQS simulation model 1 shows dependences of the arrangement of the carrier densities via the channel 8 both on the time and the position as delay functions. The NQS simulation model 1 of the present embodiment is based on the delay of the carrier passing, which is a cause for the channel arrangement at the switch-on time, and determines the dependence of the distribution of the carrier 4 via the channel 8 on the time. Moreover, when two different delay structures including the charging delay $\tau_{chrg}$ and the conductive delay $\tau_{cndt}$ are studied, the carrier distribution calculated by the NQS simulation model 1 can clearly solve the continuity equation. Accordingly, the NQS simulation model 1 of the present embodiment is capable of reproducing the carrier distribution with a precision which is as high as that of the simulation result by the 2D simulation model device. The NQS simulation model 1 of the present embodiment can be easily incorporated in the general circuit simulator. Moreover, it was possible to obtain satisfactory agreement of the simulation result of the transient drain current by the 2D simulation model device.

Moreover, as a result of further researches by the present inventors with respect to the above-described NQS simulation model 1 of the present embodiment, it has been found that the carrier density in the channel 8 at a predetermined time can be described by the following equation (11) regardless of the type of the delay model. Moreover, it has been found that the current flowing through the MOSFET at the predetermined time can be described by the following equation (12).

$$q(t_i) = q(t_{i-1}) + \frac{t_i - t_{i-1}}{\tau}[Q(t_i) - q(t_{i-1})] \quad (11)$$

$$I(t_i) = I_{DC} + \frac{dq(t_i)}{dt} \quad (12)$$

That is, first in the equation (11), the density of the carrier 4 is described in the quasi-static manner with respect to the voltage applied at a predetermined first time between the source 5 and the drain 6 of the MOSFET (transistor) 2. Moreover, the density of the carrier 4 is described in a transient state at a predetermined second time before the first time. Furthermore, at least a part of a difference between the densities of the carriers 4 is added to the density of the carrier 4 described in the transient state at the second time in accordance with the delay by the running of the carrier 4 between the source 5 and the drain 6 from the first time until the second time. Accordingly, the density of the carrier 4 at the first time is described in the transient state.

Next, in the equation (12), the current flowing between the source 5 and the drain 6 is described as a sum of the quasi-static current flowing between the source 5 and the drain 6 and the displacement current which is a change of the density of the carrier 4 between the source 5 and the drain 6 in the transient state.

Moreover, assuming that the density of the carrier 4 described in the transient state in the equation (11) satisfies the current of the equation (12), the quasi-static density of the carrier 4 of the equation (11) is described as a non-quasi-static model. That is, the carrier density described in the transient state in the equation (11) is solved assuming the QS state, and the solution is opened in the equation (12). Accordingly, the carrier density described in the transient state is finally obtained as the NQS state.

More concretely, first, it is assumed that a transient density at a predetermined time $t_i$ including the delay of the carrier 4 running between the source 5 and the drain 6 of the MOS transistor 2 is $q(t_i)$. A transient density of the carrier 4 at a predetermined time $t_{i-1}$ before the time $t_i$ is $q(t_{i-1})$. A density of the carrier 4 between the source 5 and the drain 6 in a quasi-static state assumed at the time $t_i$ is $Q(t_i)$. Further a time required for the carrier 4 to reach the drain 6 from the source 5 is $\tau$. Moreover, it is assumed that $q(t_i)$, $q(t_{i-1})$, $Q(t_i)$, and $\tau$ satisfy the first equation (11) for a time $(t_i-t_{i-1})$ from the time $t_{i-1}$ until the time $t_i$.

Next, it is assumed that a transient current flowing between the source 5 and the drain 6 at the time $t_i$ is $I(t_i)$. A quasi-static conduction current between the source 5 and the drain 6, determined by the voltage applied at the time $t_i$, is $I_{DC}$. Furthermore, a displacement current flowing between the source 5 and the drain 6 is $dq(t_i)/dt$. It is further assumed that $I(t_i)$, $I_{DC}$, and $dq(t_i)/dt$ satisfy the second equation (12) at the time $t_i$.

Moreover, $q(t_i)$ obtained from the first equation (11) is substituted into the second equation (12) to thereby describe $Q(t_i)$ as a non-quasi-static model.

In the NQS simulation model 1 of the present embodiment, the carrier density and current between the source 5 and the drain 6 of the MOS transistor 2 can be described in a general-purpose manner regardless of the stationary state, transient state, static state, or quasi-static state. Moreover, it is not necessary to distinguish the delay between the source 5 and the drain 6 by mechanism. Accordingly, analysis precision of behavior of the carrier 4 in the source 5, drain 6, and channel 8 of the MOS transistor 2 can be enhanced in not only the stationary state but also the transient state. Accordingly, a possibility that a time required for predicting or reproducing the operation of the semiconductor device increases can be almost eliminated.

FIG. 2A shows a simulation result of an extreme state by the NQS simulation model 1 of the present embodiment in the graph. Moreover, FIG. 2B shows a numerical simulation result of the extreme state by the MEDICI in the graph. As apparent from FIGS. 2A and 2B, according to the NQS simulation model 1 of the present embodiment, the simulation result having substantially the same high precision as that of the MEDICI can be obtained even in the extreme state. In general, in the numerical simulation, the precision is high, but a calculation time is enormous, and the simulation is not suitable for practical use. On the other hand, according to the NQS simulation model 1 of the present embodiment, as described above, the precision equivalent to that of the numerical simulation can be obtained within a practically allowable time.

As described above, according to the first embodiment, the analysis precision of the behavior of the carrier 4 in the source 5, drain 6, and channel 8 of the MOSFET 2 including not only the stationary state but also the transient state can be enhanced. Accordingly, the operation of the MOSFET 2 (semiconductor device 3) operating at a high speed can be predicted or reproduced quickly within the practically allowable time and with the high precision.

Second Embodiment

Next, a second embodiment according to the present invention will be described with reference to FIGS. 7 to 22.

Figure 7:
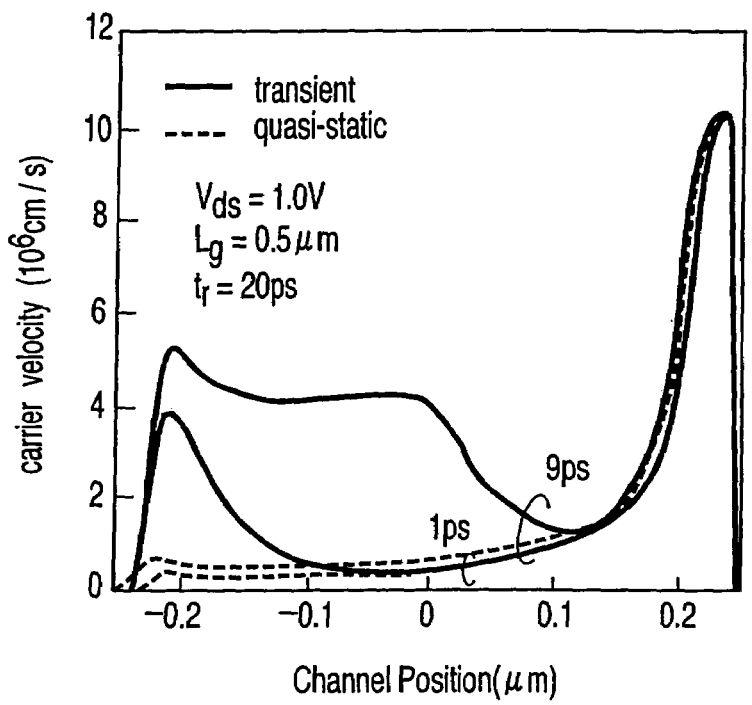
FIG. 7 is a graph showing velocities of carriers in lateral directions in the transient state and quasi-static approximation at a high-speed switching-on time.
Figure 8:
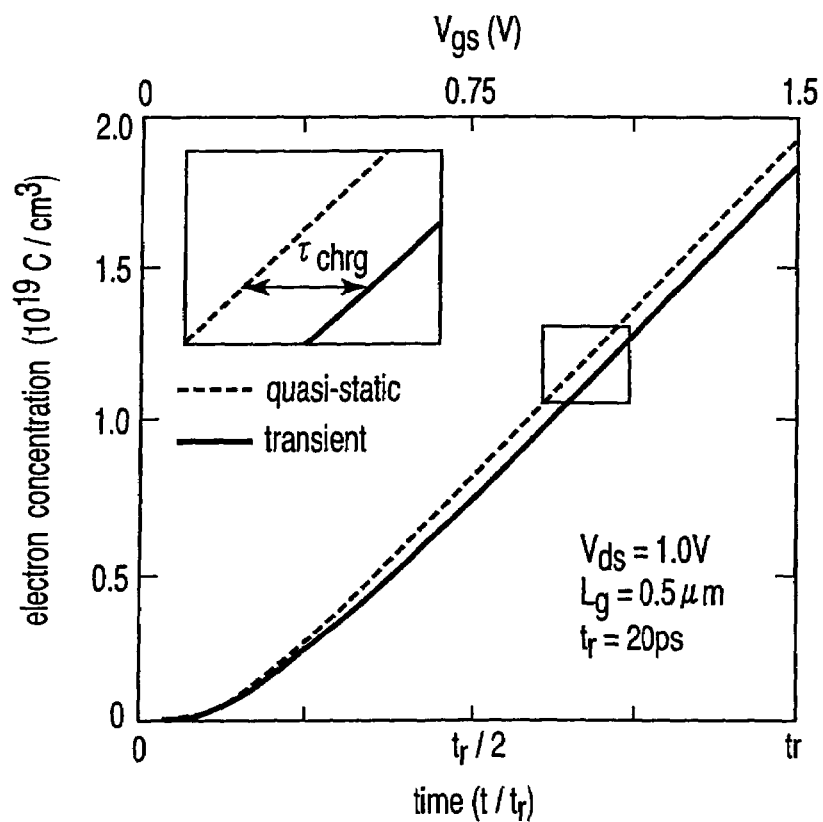
FIG. 8 is a graph showing carrier concentrations in the transient state and quasi-static approximation on the side of a source of a MOSFET having a design rule of 0.5 µm.
Figure 10:
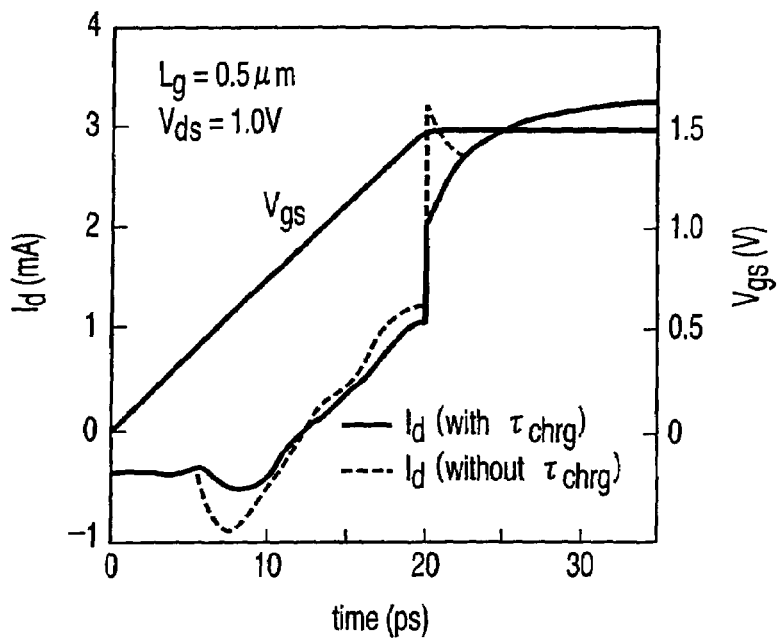
FIG. 10 is a graph showing a case where effects of the carrier charging delays are included and a case where the effects are not included in a simulation model according to a second embodiment.
Figure 11:
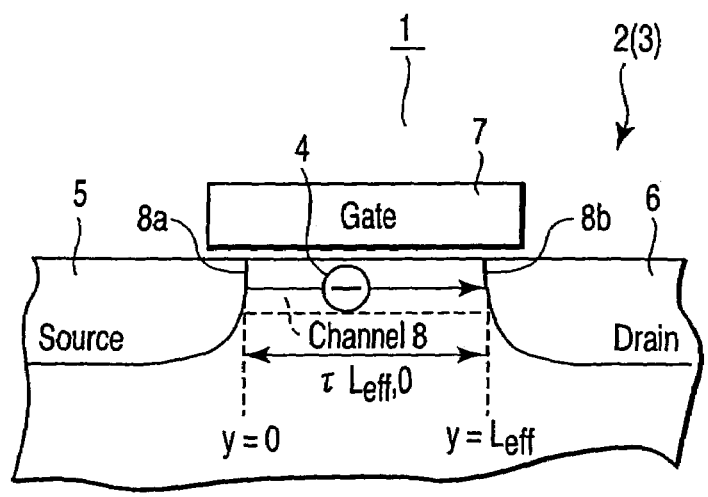
FIG. 11 is a diagram schematically showing analysis in a quasi-static state of a delay mechanism of the MOSFET as a comparative example of the second embodiment.
Figure 12:
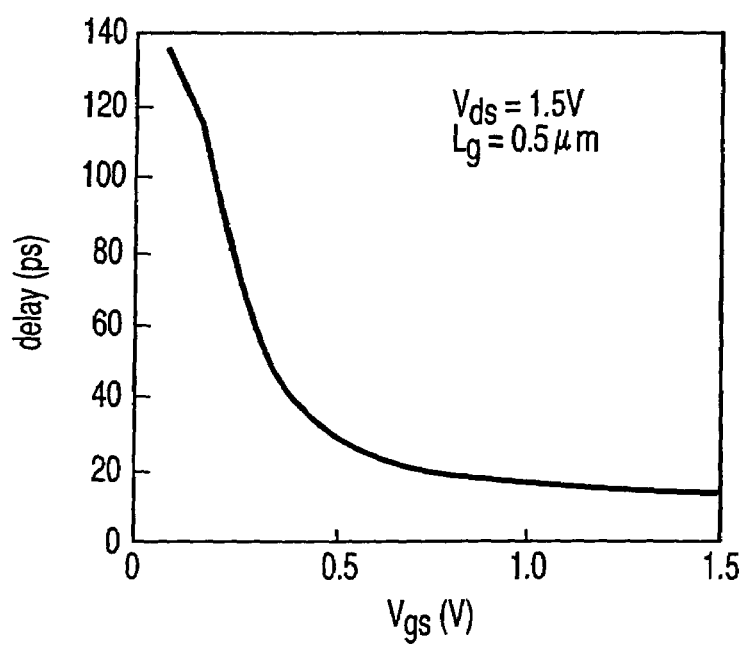
FIG. 12 is a graph showing a relation between a gate voltage and conductive delay.
Figure 13:
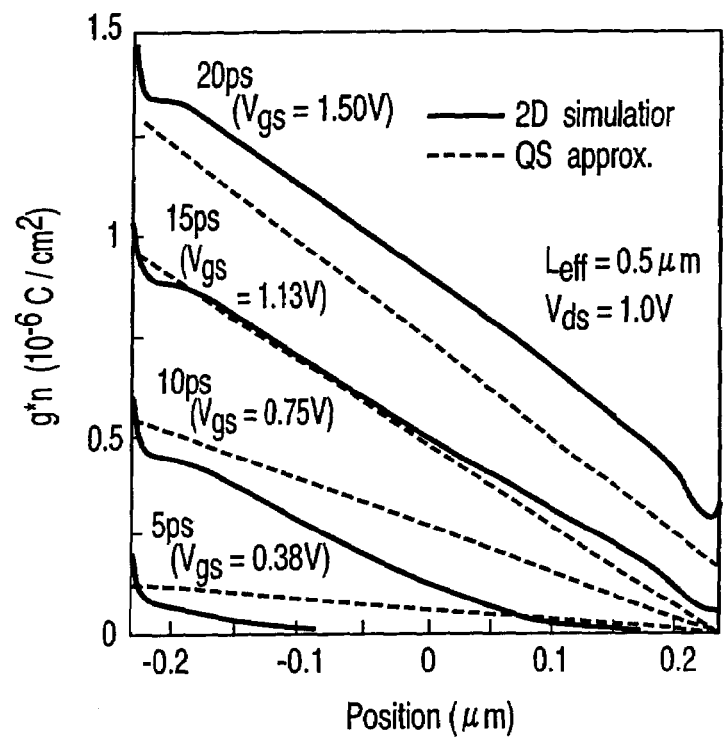
FIG. 13 is graph showing the carrier density distribution by the two-dimensional device simulation and circuit simulation using the quasi-static approximation.
Figure 14:
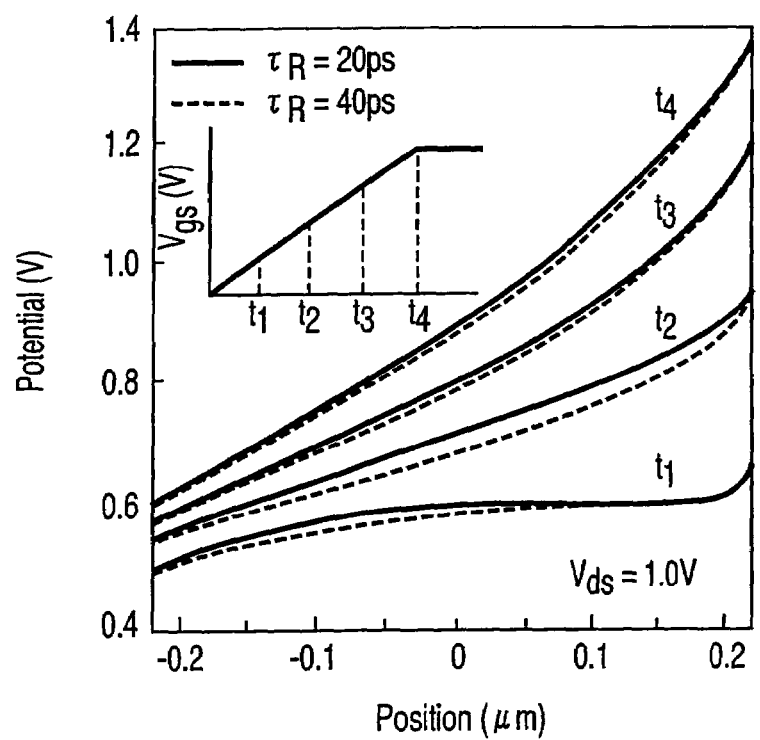
FIG. 14 is a graph showing responses of potentials of two types of switching speeds with respect to the plurality of different rising times of the gate voltage.
Figure 15A:
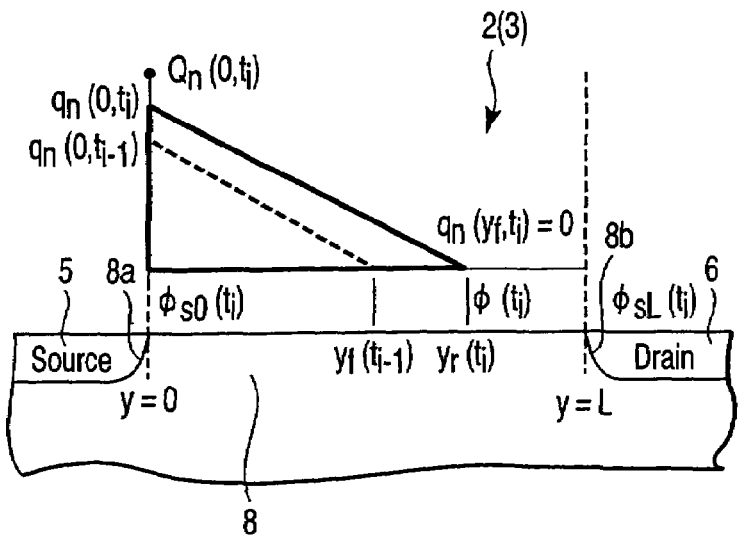
FIGS. 15A and 15B are diagrams schematically showing transient carrier density distributions in cases where transient carrier density in a drain-side end portion of a channel is 0 and is not 0.
Figure 15B:
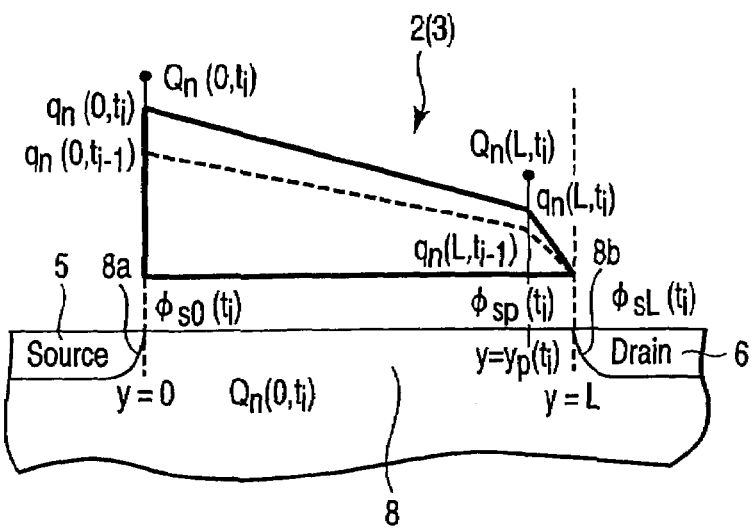
Figure 16:
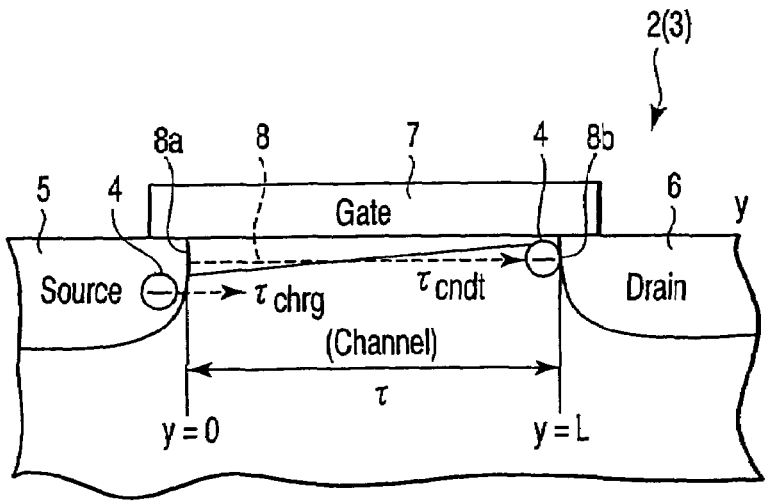
FIG. 16 is a diagram schematically showing the origin of the NQS effect as the comparative example of the second embodiment using two models of conductive delay and charging delay.
Figure 17:
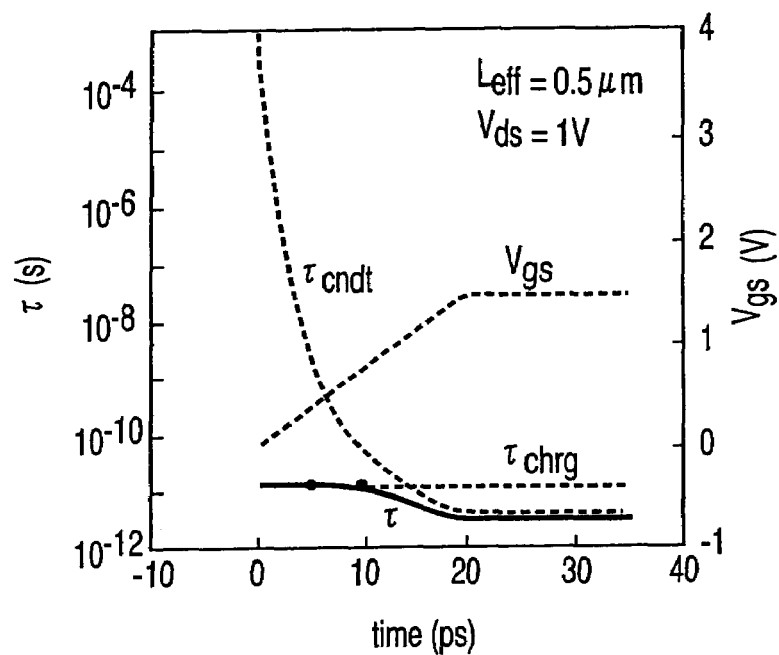
FIG. 17 is a graph showing calculation results of passing time, conductive delay, and charging delay.
Figure 18:
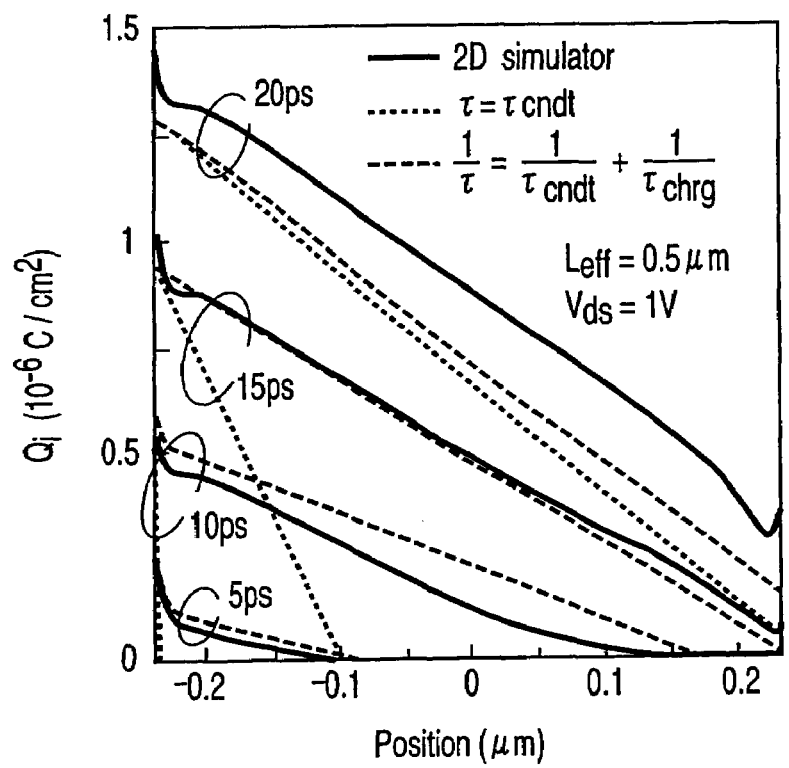
FIG. 18 is a graph showing three types of simulation results of charge densities with respect to the plurality of different rising times.
Figure 19:
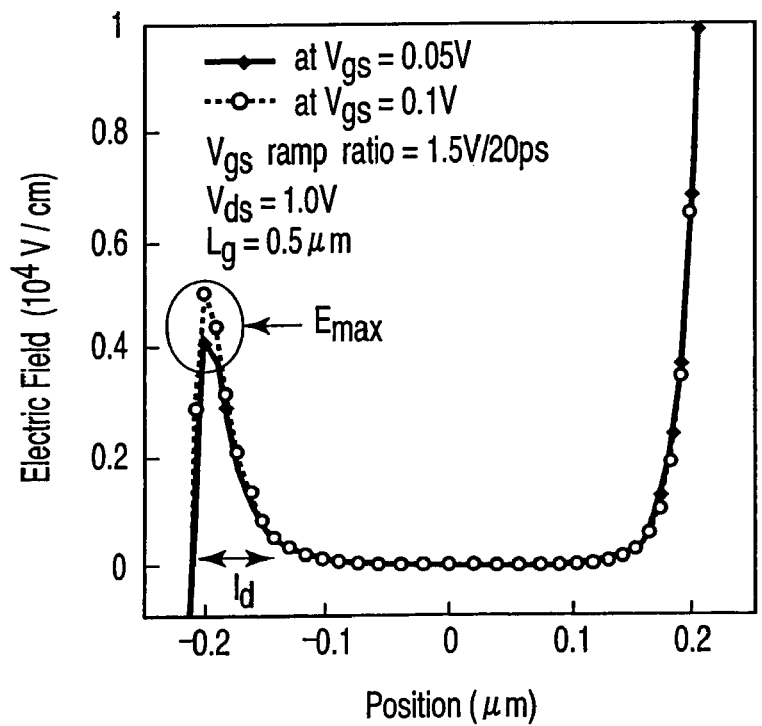
FIG. 19 is a diagram showing results of the two-dimensional device simulation of an electric field distribution in a direction along the channel.
Figure 20:
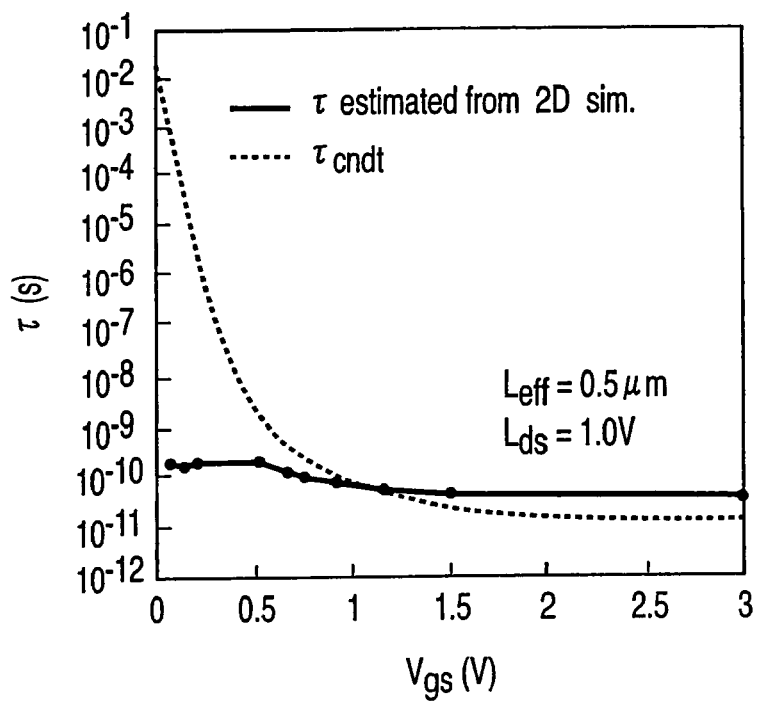
FIG. 20 is a graph showing the conductive delay and the delay time estimated from the two-dimensional device simulation.
Figure 21:
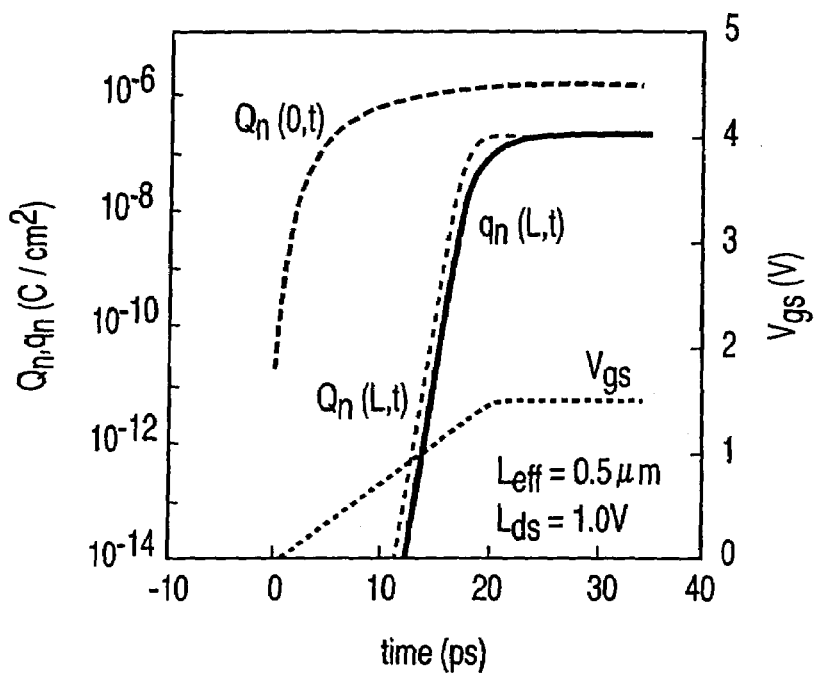
FIG. 21 is a diagram showing calculation results of the charge density in the drain-side end portion of the channel.
Figure 22:
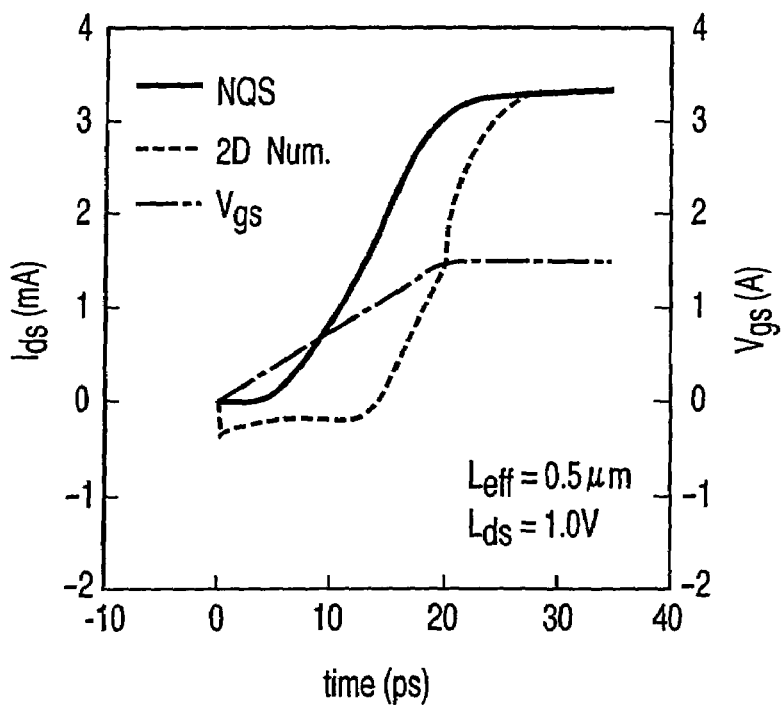
FIG. 22 is a graph showing simulation results of a drain current by approximations assuming a quasi-static state and a non-quasi-static state.

FIG. 7 is a graph showing velocities of carriers in lateral directions in the transient state and quasi-static approximation at a high-speed switch-on time. FIG. 8 is a graph showing carrier concentrations in the transient state and quasi-static approximation on the side of the source of the MOSFET having a design rule of 0.5 μm. FIGS. 9A, 9B, 9C, and 9D are graphs showing charging delays of the carriers at a plurality of different rising times, and carrier velocity distributions in the transient state and quasi-static approximation at the plurality of different rising times. FIG. 10 is a graph showing a case where effects of the carrier charging delays are included and a case where the effects are not included in a simulation model according to the present embodiment. FIG. 11 is a diagram schematically showing analysis in a quasi-static state of a delay mechanism of the MOSFET as a comparative example of the present embodiment. FIG. 12 is a graph showing a relation between a gate voltage and conductive delay. FIG. 13 is graph showing the carrier density distribution by the two-dimensional device simulation and circuit simulation using the quasi-static approximation. FIG. 14 is a graph showing responses of potentials of two types of switching speeds with respect to the plurality of different rising times of the gate voltage. FIGS. 15A and 15B are diagrams schematically showing transient carrier density distributions in cases where transient carrier density in a drain-side end portion of a channel is 0 and is not 0. FIG. 16 is a diagram schematically showing the origin of the NQS effect as the comparative example of the present embodiment using two models of conductive delay and charging delay. FIG. 17 is a graph showing calculation results of passing time, conductive delay, and charging delay. FIG. 18 is a graph showing three types of simulation results of charge densities with respect to the plurality of different rising times. FIG. 19 is a diagram showing results of the two-dimensional device simulation of an electric field distribution in a direction along the channel. FIG. 20 is a graph showing the conductive delay and the delay time estimated from the two-dimensional device simulation. FIG. 21 is a diagram showing calculation results of the charge density in the drain-side end portion of the channel. FIG. 22 is a graph showing simulation results of a drain current by approximations assuming a quasi-static state and a non-quasi-static state. It is to be noted that the same components as those of the first embodiment are denoted with the same reference numerals, and detailed description is omitted.

In this embodiment, a method of estimating $\tau_{chrg}$, which is one of the three delay structures described in the first embodiment, will be described. In the embodiment, the importance that $\tau_{chrg}$ has with respect to the results of simulation will also be described. Note that the three delay structures are $\tau_{chrg}$, $\tau_{cndt}(\tau_{cndt1}, \tau_{cndt2})$, and $\tau_{dsch}$.

First, a non-quasi-static MOSFET model (NQS-MOSFET model) having no self-contradiction concerning circuit simulation based on transient carrier response will be described.

The present inventors have developed basic concept of the NQS-MOSFET model concerning device simulation. This model is based on the delay of the carrier response, and dependences of carrier density along a channel 8 on time and position are incorporated. That is, the delay by running of the carrier 4, which is origin of NQS effect, is considered. Moreover, the present inventors have found that a result of this model is compared with that of two-dimensional device simulation (2D device simulation) while clearly solving continuity equation, and accordingly the carrier response delay is established by conductive delay and charging delay. Accordingly, researches performed by the present inventors, the developed model has been successful by application to verification of transient behavior of a drain current. A new NQS model proposed for the device simulation by the present inventors will be described hereinafter in detail. A channel passing time of the carrier is incorporated with a high precision by a method without any self-contradiction.

First, prior to the description of an NQS simulation model of the present embodiment, a basic equation concerning transient current for use in the NQS simulation model of the present embodiment will be described. As described in the first embodiment, a current continuity equation (1) is solved together with a current density equation (2) in order to include NQS effect in an NQS simulation model 1. Moreover, solution having a closed form concerning a drain current and a source current is derived from these current continuity equation (1) and current density equation (2) under moderate channel approximation. First, the current continuity equation (1) is integrated from a boundary 8a (y=0) between a source region 5 and a channel region 8 to a predetermined position (y=y) along the channel region 8. Moreover, an integrated value is substituted into the current density equation (2) to thereby solve the equation (3). Furthermore, this equation (3) is integrated from the boundary 8a (y=0) between the source region 5 and the channel region 8 to a boundary 8b (y=L) between the channel region 8 and a drain region 6 to thereby obtain the equations (4a) and (4b).

In these equations (4a) and (4b), L denotes a length of the channel region 8. Moreover, $\phi_{s0}$ and $\phi_{sL}$ denote surface potentials of the source-region-side end portion 8a and the drain-region-side end portion 8b. The equation (4b) indicates that a transient current comprises a conduction current (first term of right side) and a displacement current (second term of right side). Moreover, the conduction current is described under a stationary state.

A circuit simulator (not shown) solves the equation (4b) under quasi-static approximation (QS-approx.), and derives the following equation (13).

$$\frac{qdn(y,t)}{dt} = \frac{q\partial n(y,t)}{\partial V_G}\frac{dV_G}{dt} + \frac{q\partial n(y,t)}{\partial V_S}\frac{dV_S}{dt} + \frac{q\partial n(y,t)}{\partial V_D}\frac{dV_D}{dt}, \quad (13)$$

wherein $q\partial n(y,t)/\partial V_{(G,S,D)}$ determines capacities of a gate 7, the source 5, and the drain 6.

The present inventors have performed researches for a purpose of developing analytic description concerning n(y, t), that is, electron density in a position y along a longitudinal direction of the channel region 8 at a time t. The analytic description concerning this n(y, t) satisfies the current continuity equation (1). Validity of an n(y, t) model is verified by comparison of results of the following calculated transient drain current equation (14) with those of two-dimensional device simulation (2D device simulation).

$$I(0,t) = I(L,t) \approx q\frac{W}{L}\mu \int_{\varphi_{s0}}^{\varphi_{sL}} n(y,t)d\varphi(y,t) \quad (14)$$

Next, a new n(y, t) model according to the present embodiment will be described. When the new n(y, t) model is developed, derivation of a solution having a closed form of a charge density $q_n(y, t)=qn(y, t)$ usually executed by a series of a triangular function can be reduced. However, this requires a very enormous calculation time, and it is also difficult to independently determine a factor of the series.

FIG. 13 shows a result of comparison of a carrier density distribution $q_n(y, t)$ calculated by 2D device simulation with that calculated by device simulation using QS approximation, performed by the present inventors in the graph. A graph shown by a solid line in FIG. 13 shows a calculation result by the 2D device simulation, and a broken line in FIG. 13 shows a calculation result by the device simulation using the QS approximation. In these simulations, a drain voltage ($V_{ds}$) is fixed at 1 V, and a gate voltage ($V_{gs}$) is switched on in a rising time of 20 ps. The result of the 2D device simulation is a strict solution, and is not approximated. According to the result of the 2D simulation, the carrier 4 does not completely fill the channel region 8 to reach the drain region 6 up to 15 ps. On the other hand, in the device simulation using the QS approximation, a natural carrier response is indicated. As a result, even after 5 ps, the channel region is naturally and completely filled.

Next, a potential which quickly responds to the change of the gate voltage ($V_{gs}$) is approximated. Validity of the approximation is shown in FIG. 14 by comparison of potential responses simulated by a 2D device simulator (MEDICI) with respect to two different switch-on speeds. The graph shown by a solid line in FIG. 14 shows a result in a case where a switching speed $\tau_R$=20 ps, and the graph shown by a broken line in FIG. 14 shows a result in a case where a switching speed $\tau_R$=40 ps. As apparent from the respective graphs shown in FIG. 14, since potential distribution in time steps with respect to two different speeds are substantially equal, validity of this approximation is proved. In the respective graphs shown in FIGS. 2A and 2B, a slight difference observed in a middle part of the channel region is caused by different carrier responses.

Here, $q_n$ indicating a transient carrier density is distinguished from $Q_n$ indicating a carrier density in a stationary state. Modeling of $q_n$ is separately executed with respect to the following two conditions. One is a case where a head of a flow of the carrier 4 does not reach the drain region 6 in a time step $t_i$ as shown in FIG. 15A ($q_n(L, t_i)=0$). The other is a case where the head of the flow of the carrier 4 reaches the drain region 6 in the time step $t_i$ as shown in FIG. 15B ($q_n(L, t_i)>0$). In these two conditions, a channel charge density $Q_n(0, t_i)$ in a stationary state on a source region 5 side of the channel region 8, and a channel charge density in the stationary state on a drain region 6 side of the channel region 8 are distinguished. Approximation is introduced in which it is assumed that a transient carrier density $q_n(0, t_i)$ on the source region 5 side of the channel region 8 is equal to a carrier density $Q_n(0, t_i)$ in the stationary state on the source region 5 side of the channel region 8. This means that there is not any response delay on the source region 5 side of the channel region 8. The above-described two conditions will be individually described hereinafter.

First, a case where $q_n(L, t_i)=0$ will be described.

In this case, the carrier density $q_n(y, t_i)$ in the channel 8 is approximated to substantially linearly decrease to 0 from $Q_n(0, t_i)$ along the channel region 8. A position $y_f(t_i)$ in which the carrier density is equal to zero and which moves toward the drain region 6 from the source region 5 is modeled as in the following equation (15):

$$y_f(t_i) = y_f(t_{i-1}) + \frac{t_i - t_{i-1}}{\tau(t_i)} L, \tag{15}$$

wherein $\tau(t_i)$ denotes the passing delay of the carrier 4, required for movement from the source region 5 toward the drain region 6 in a time step $t_i$. Accordingly, the carrier density between y=0 and $y_f(t_i)$ is described as in the following equation (16):

$$q_n(y, t_i) = -\frac{Q_n(0, t_i)}{y_f(t_i)} + Q_n(0, t_i) \tag{16}$$

Here, when a potential distribution from the source-region-side end portion (source contact) 8a of the channel region 8 to the drain-region-side end portion (drain contact) 8b of the channel region 8 is approximated to linearly change to $\phi_{sL}(t_i)$ from $\phi_{s0}(t_i)$, the potential $\phi(t_i)$ in $y_f(t_i)$ is represented by the following equation (17):

$$\varphi(t_i) = [\varphi_{sL}(t_i) - \varphi_{s0}(t_i)] \frac{y_f(t_i)}{L} \tag{17}$$

By use of $\phi(t_i)$ obtained by the equation (17), the equation (14) can be analytically solved using $Q_n(0, t_i)$ as in the following equation (18):

$$I(0, T_i) = I(L, t_i) \tag{18}$$

$$= \frac{W}{L} \mu \int_{\varphi_{s0}(t_i)}^{\varphi_{sL}(t_i)} Q_i(y, t) d\varphi(y, t)$$

$$= \frac{W}{L} \mu \frac{Q_n(0, t_i) \cdot \varphi(t_i)}{2}$$

Next, a case where $q_n(L, t_i)>0$ will be described.

In this case, both linear condition and saturation condition including a pinch-off region in the channel region 8 need to be considered. A change of the carrier density in a pinch-off position $y_p(t_i)$ from time step $t_{i-1}$ until $t_i$ is represented by the following equation (19) in consideration of the passing delay.

$$q_n(y_p(t_i), t_i) = \tag{19}$$

$$q_n(y_p(t_{i-1}), t_{i-1}) + [Q_n(y_p(t_i), t_i) - q_n(y_p(t_{i-1}), t_{i-1})] \frac{t_i - t_{i-1}}{\tau(t_i)}$$

Moreover, a final carrier density is represented by two different equations which depend on the position, for example, the following equations (20a) and (20b).

$$q_n(y, t_i) = -\frac{Q_n(0, t_i) - q_n(y_p(t_i), t_i)}{y_p} + Q_n(0, t_i), \tag{20a}$$

$$0 \le y \le y_p(t_i)$$

$$q_n(y, t_i) = -\frac{q_n(y_p(t_i), t_i)}{L - y_p(t_i)} y + \frac{q_n(y_p(t_i), t_i)}{L - y_p(t_i)}, \tag{20b}$$

$$y_p(t_i) < y \le L$$

By the use of these equations (20a) and (20b), the equation (14) is analytically described as in the following equation (21):

$$I(0, t) = I(L, t) \tag{21}$$

$$= \frac{W}{L} \mu \int_0^L Q_i(y, t) d\varphi(y, t)$$

$$= \frac{W}{L} \mu \frac{1}{2} [\varphi_{sp}(t_i) - \varphi_{s0}(t_i)] \cdot [Q_{n0}(t_i) - q_n(t_i)] +$$

$$\frac{W}{L} \mu \frac{1}{2} [\varphi_{sL}(t_i) - \varphi_{sp}(t_i)] \cdot q_{nL}(t_i)$$

wherein $\phi_{sp}(t_i)$ is a surface potential in the pinch-off position $y_p(t_i)$.

Next, an NQS simulation model in which a carrier passing time is considered will be described.

The present inventors have developed the NQS simulation model based on the carrier passing time in order to consider a charge loss in the channel region, generated by the NQS effect. First, as shown in FIG. 16, description concerning a conductive delay $\tau_{cndt}$ caused by the passing time of the carrier 4 to the drain region 6 from the source region 5 was developed. This conductive delay $\tau_{cndt}$ is calculated from an averaged carrier speed in the channel region 8, and represented as a function of the surface potential as in the following equation (22):

$$\tau_{cndt} = \int_0^L \frac{1}{v(y)} dy \qquad (22)$$

$$= \int_0^L \frac{1}{\mu E(y)} dy$$

$$= \frac{1}{\mu} \int_0^L \frac{dy}{-\frac{d\varphi(y)}{dy}}$$

$$= \frac{\mu W^2}{\beta^2 I_D^2} \int_{\varphi_{s0}}^{\varphi_{sL}} \left[ \frac{C_{0x}\beta(V_g - \varphi_s) + C_{0x} -}{C_0(\beta\varphi_s - 1)^{\frac{1}{2}} + \frac{1}{2}C_0(\beta\varphi_s - 1)^{-\frac{1}{2}}} \right]^2 d\varphi_s,$$

$$\beta = \frac{q}{kT}, \quad C_0 = \sqrt{2}\, q N_A L_D,$$

wherein v(y), $I_D$, $c_{OX}$, k, T, $N_A$, and $L_D$ denote a carrier speed, drain current, oxide film capacity, Boltzmann constant, absolute temperature, acceptor concentration, and device length. FIG. 17 shows a conductive delay $\tau_{cndt}$ calculated by the equation (22) in a one-dot-chain-line graph. The carrier density $q_n(y, t)$ is calculated using calculated $\tau = \tau_{cndt}$. In this case, in the calculation of $q_n(y, t)$, the above-described $Q_n(0, t)$, $Q_n(L, t)$, $\phi_{s0}(t)$, $\phi_{sL}(t)$, and $\phi_{sp}(t)$ are required. In the first embodiment, these numerical values are obtained by an NQS simulation model HiSIM based on the description of the surface potential. Accordingly, a matching property in the description of the NQS model in consideration of the carrier passing time is held through the surface potential. This result is shown by a broken-line graph in FIG. 18. As apparent from the above-described FIG. 6, the carrier distribution calculated in a starting stage of switch-on cannot reproduce 2D simulation results. Even after 15 ps, the carrier 4 does not reach the drain region 6. This is because the calculated $\tau_{cndt}$ is excessively small as compared with the 2D simulation result. The calculated $\tau_{cndt}$ is derived from theory. In the theory, the carrier 4 obtains inertia from transport principle based on drift-diffusion.

When the carrier 4 is charged into the channel 8 from the source 5, an additional force to push the carrier 4 in the channel 8 to the drain 6 has to be included. FIG. 19 shows a 2D simulation result of an electric field distribution along the channel 9. The electric field in a channel direction is maximized in the source-side end portion 8a of the channel 8, and imparts inertia for entering the channel 8 to the carrier 4. A passing time for crossing a carrier depletion region $l_d$ is schematically calculated as in the following equation (23):

$$\tau = \frac{l_d}{v} = \frac{l_d}{E_{max} \cdot \mu}, \qquad (23)$$

wherein μ is mobility of the carrier 4.

FIG. 20 shows a passing delay τ estimated from the 2D simulator MEDICI in a solid-line graph. According to FIG. 20, the electric field distribution in the source-side end portion 8a of the channel 08 shown in FIG. 19 hardly depends on the applied voltage, and therefore characteristics of the passing delay τ which hardly depend on the time are observed. This inertia is assumed as a charging delay $\tau_{chrg}$ as described in the first embodiment, and is approximated to be substantially constant. The value τ obtained in the equation (23) depends on source/channel bonding conditions, and accordingly the value of $\tau_{chrg}$ is fitted to the 2D simulation result of the carrier distribution at t=5 ps and 10 ps, and obtained as about 13 ps. The final passing delay τ is represented by the following equation (24) by integrating two components $\tau_{cndt}$ and $\tau_{chrg}$ of the passing delay τ described in the first embodiment.

$$\frac{1}{\tau} = \frac{1}{\tau_{cndt}} + \frac{1}{\tau_{chrg}} \qquad (24)$$

In FIG. 17, the calculated $\tau_{chrg}$ and τ are plotted. By the use of the calculated τ, the carrier density distribution is calculated. The result is shown by a broken line in FIG. 18. As apparent from FIG. 18, according to the NQS simulation model of the present embodiment, it was possible to obtain a carrier distribution substantially similar to the 2D simulation result.

FIG. 21 shows calculation results of carrier densities in the drain-side end portion of the channel region 8, and $q_n(L, t)$ in order to verify the validity of the NQS simulation model of the present embodiment. The modeled $q_n(L, t)$ shows a clear response delay by comparison with $Q_n(L, t)$. Even after $V_{gs}$ reaches the stationary state, $q_n(L, t)$ smoothly converges to a final value as predicted. The drain current is calculated by the equations (18), (20a), and (20b) using the calculated $q_n(L, t)$. The calculation result is shown in FIG. 22. For comparison, the drain current calculated under QS approximation, and the simulation result are shown in FIG. 22. According to FIG. 22, it is seen that the NQS simulation model of the present embodiment reproduces 2D numerical simulation results very well. A response of initial rising of the NQS simulation model of the present embodiment is attributed to calculation excluding capacities. Negative $I_{ds}$ of the 2D simulation result is also generated by the charging capacity from the drain 6. Additionally, the charging capacity from the drain 6 is excluded from this calculation.

Thus, according to the NQS simulation model of the present embodiment, the NQS-MOSFET model including the data of the carrier response can be developed by the method without any self-contradiction. Moreover, the NQS simulation model of the present embodiment describes both the dependencies of the carrier 4 of the channel direction on the time and position as the functions of the passing delay τ of the carrier 4. This passing delay τ is modeled by the carrier passing time for integrating the conductive delay $\tau_{cndt}$ and the charging delay $\tau_{chrg}$. Moreover, the calculated carrier density distribution in the channel direction reproduces the 2D simulation result very well. Furthermore, it has been confirmed that the current calculated using the developed carrier distribution reproduces the effects of the 2D simulation.

Next, the delay mechanism concerning the transient carrier transport in the MOSFET under very fast switching will be described.

The present inventors researched the delay mechanism which dominates the transport of the carrier 4 in the channel 8 of the MOSFET 2 under conditions under which a gate input changes with time at a high speed. According to the research, it has been found that the carrier 4 undergoes a large force to enter the channel 8. It has been found that this constitutes the carrier delay mechanism of a new type which depends on time differentiating of the carrier concentration induced on the source 5 side of the channel 8. Moreover, it has been found that to introduce a new delay mechanism into the circuit simulation model is necessary for correctly predicting the drain current of the MOSFET 2 in an RF operation. This will be described hereinafter in detail.

First, a carrier delay component in high-speed MOSFET switching will be described.

The delay mechanism which describes the transport of the carrier 4 in the channel 8 has been a first problem with the development of the integration of the MOSFET 2 into the circuit operating in an RF region in recent years. In general, the channel-carrier transport is described by a time for which the carrier 4 moves in a certain segment in the channel 8. A delay time ($\tau_{y2,\ y1}$) is calculated by the following equation (25):

$$\tau_{y2,y1} = \int_{y1}^{y2} \frac{1}{v} dy, \quad (25)$$

wherein v denotes a carrier velocity in segments y1 and y2. The equation (25) is schematically shown in FIG. 11 with respect to the MOSFET 2. Here, integration is performed from the source 5 (y1=0) to the drain 6 (y2=$L_{eff}$). In the quasi-static (QS) analysis, a delay ($\tau_{Leff}$, 0) is simply attributed to stationary conduction of the carrier 4. This is hereinafter referred to as conduction delay ($\tau_{cndt}$). With an increase of the gate voltage ($V_g$), $\tau_{cndt}$ decreases by contribution of the increase of drift as shown in FIG. 12. However, when an input changing with time at a very high speed is applied, the carrier 4 behaves differently as compared with the quasi-static state. This is also proved even in the simulation using the 2D simulator MEDICI concerning the high-speed switch-on as shown in FIG. 6 used in the first embodiment. It is assumed in the quasi-static approximation that once a bias voltage is applied to the carrier 4, the carrier momentarily reaches equilibrium. In this case, needless to say, the calculated $\tau_{cndt}$ does not correctly represent the generation of the carrier 4 in the channel 8 at the bias voltage which changes with time at the high speed. Therefore, it is proved that the simple application of the conventional delay mechanism indicating the movement of the carrier 4 by the conduction is insufficient for the modeling of the response of the carrier 4 in such high-frequency operation. As shown in FIG. 1 used in the first embodiment, an additional delay mechanism is required for sufficiently describing the behavior of the carrier 4. The charging delay (injecting delay) $\tau_{chrg}$ and discharging delay (ejecting delay) $\tau_{dsch}$ which dominate the going-in/out of the carrier 4 with respect to the channel 8 are considered to be especially important. Here, the analysis of the charging delay of the carrier 4 which receives an excessive force for entering the channel region 8 is noted. Especially, it is clarified how this delay mechanism influences the transport of the carrier 4 for constructing the modeling of the transient delay concerning the circuit simulation.

First, a transient delay model concerning the analysis by the 2D simulation and the circuit simulation will be described.

In FIG. 7, when lateral (transverse direction) carrier 4 velocity characteristics during the high-speed switch-on are noted, an initial bump is observed in the vicinity of the source region 5. An excessively short rising time ($t_r$) is used for a purpose of verifying an important effect. When the carrier 4 is charged into the channel 8, the velocity increases, and, as clarified by this, the carrier 4 includes an additional moment. The effect of the additional moment, that is, the increased velocity substantially reaches $L_{eff}/2$. On the drain 6 side, the speed predicted by the quasi-static approximation is dominant. The additional moment is induced by an arising force required to store carrier distribution necessary for satisfying the continuity equation. The present inventors modeled the delay attributed to the charge injection by the delay time $\tau_{chrg}$ referred to as the charging delay for reaching the carrier concentration of the quasi-static approximation on the source 5 side of the channel 8 in a transient case.

FIG. 8 shows a 0.5 μmn MOSFET, and the result of the carrier concentration concerning a rising time of 20 ps which is an example. As shown in an inserted figure of FIG. 8, it is assumed that $\tau_{chrg}$ denotes a time delay required until the carrier density in the transient simulation reaches the value of the carrier density predicted by the QS simulation.

Figure 9A:
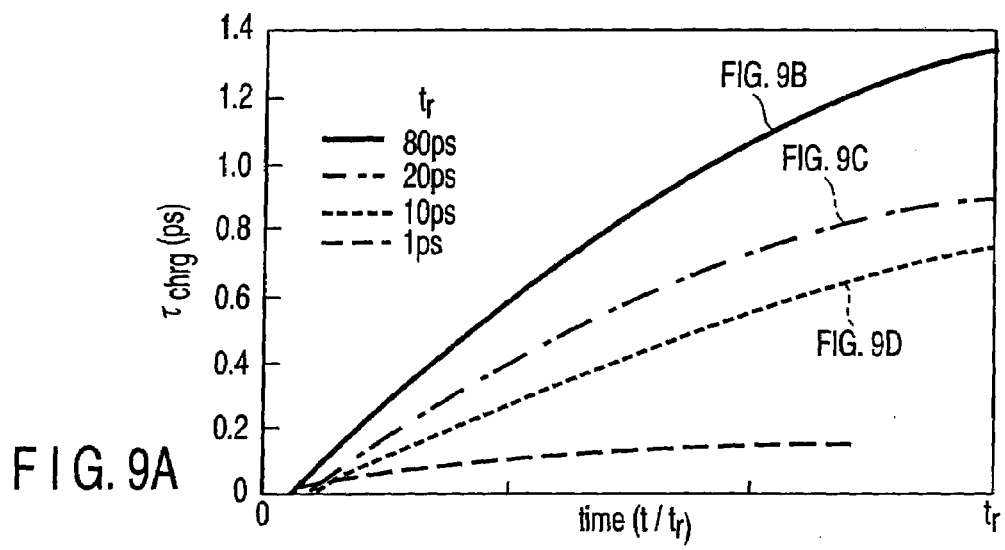
FIGS. 9A, 9B, 9C, and 9D are graphs showing charging delays of the carriers at a plurality of different rising times, and carrier velocity distributions in the transient state and quasi-static approximation at the plurality of different rising times.
Figure 9B:
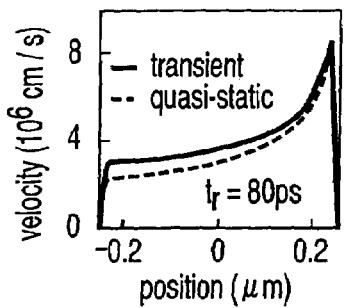
Figure 9C:
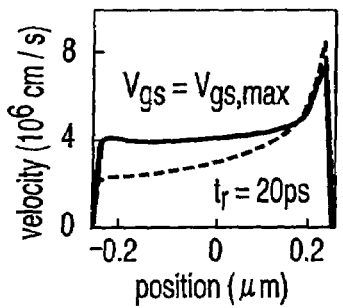
Figure 9D:
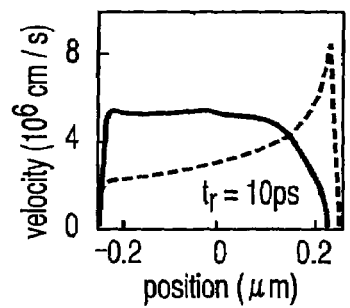

FIG. 9A summarizes $\tau_{chrg}$ obtained with respect to different $t_r$. It is recognized that $\tau_{chrg}$ decreases as the switch-on is accelerated. This means that the carrier 4 tends to have a larger additional moment before entering the channel 8, and the carrier is charged early in order to reach the carrier density required for satisfying the continuity equation under a high-speed change of a gate 7-source 5 voltage ($V_{gs}$). When $V_{gs}$ further increases to reach $V_{gs,max}$, the additional moment is relaxed, and the speed distribution in the channel 8 is relaxed in the stationary state. FIGS. 9B, 9C, and 9D show that the corresponding bump in the vicinity of the source region 5 in the speed distribution increases with a decrease of the switch-on time, and proves that the charged carrier 4 behaves as described above.

FIG. 8 shows an influence $\tau_{chrg}$ in the calculation of the drain current in a case where the transient delay model is executed with respect to the circuit simulation model HiSIM based on the surface potential concerning the MOSFET. $\tau_{chrg}$ is included as the delay which dominates the carrier concentration in the source 5, and the passing carrier delay in the channel 8 is determined by $\tau_{cndt}$ according to the equation (25). The contributions of both the delays cause the delay of the carrier concentration in the drain 6. Furthermore, $\tau_{cndt}$ prevents shortage of the carrier 4 in the channel 8. Another important observation in FIG. 8 is that $\tau_{chrg}$ influences the whole transport of the carrier 4 concerning especially short $t_r$. Since $t_r$ of 20 ps is already excessively early, the additional charging moment is not relaxed even after $V_{gs,max}$ reaches 20 ps. This brings smooth current movement in $V_{gs,max}$. The corresponding velocity distribution is applied to FIG. 7.

Thus, the delay model concerning the circuit simulation described here reproduces correct movement characteristics as performed by the current continuity equation (1).

As described above, according to the second embodiment, an effect similar to that of the first embodiment can be obtained. A more appropriate estimating method of $\tau_{chrg}$ can be obtained. Furthermore, importance of $\tau_{cndt}$ with respect to the simulation result has been confirmed.

Third Embodiment

Figure 23:
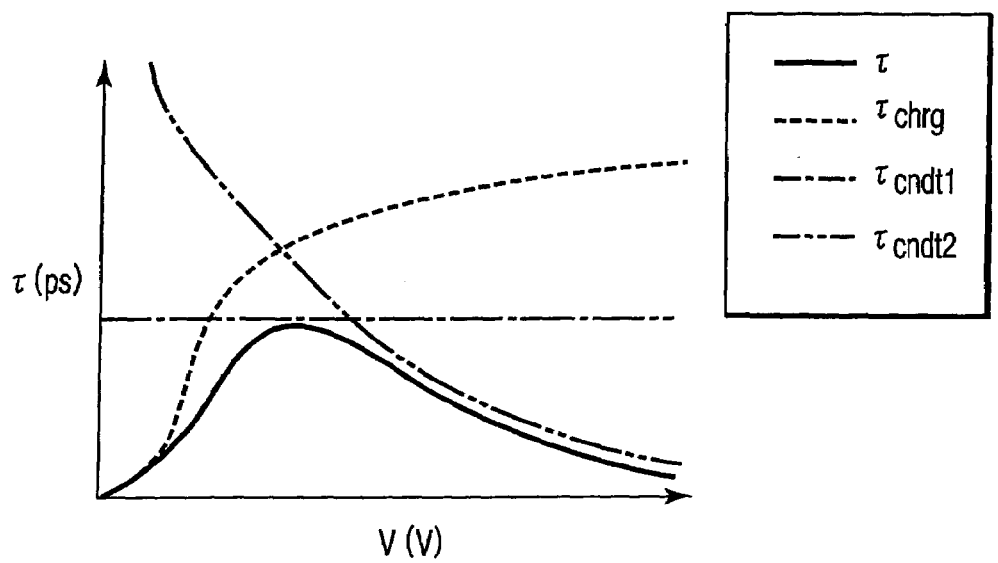
FIG. 23 is a graph showing a relation between each of passing delay, charging delay, and two types of conductive delays which are delay models according to a third embodiment, and voltages.
Figure 24:
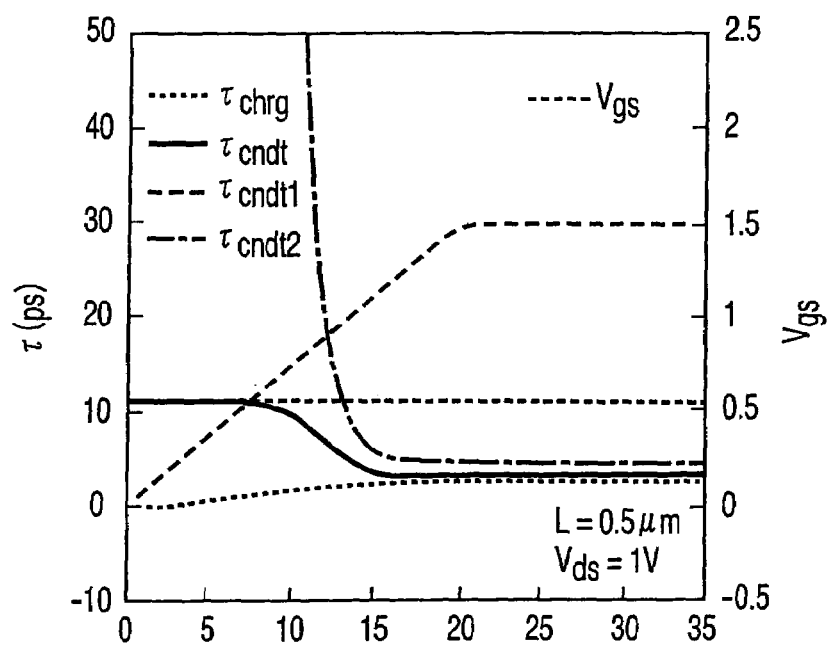
FIG. 24 is a graph showing calculation results of each carrier running time according to the third embodiment.
Figure 25:
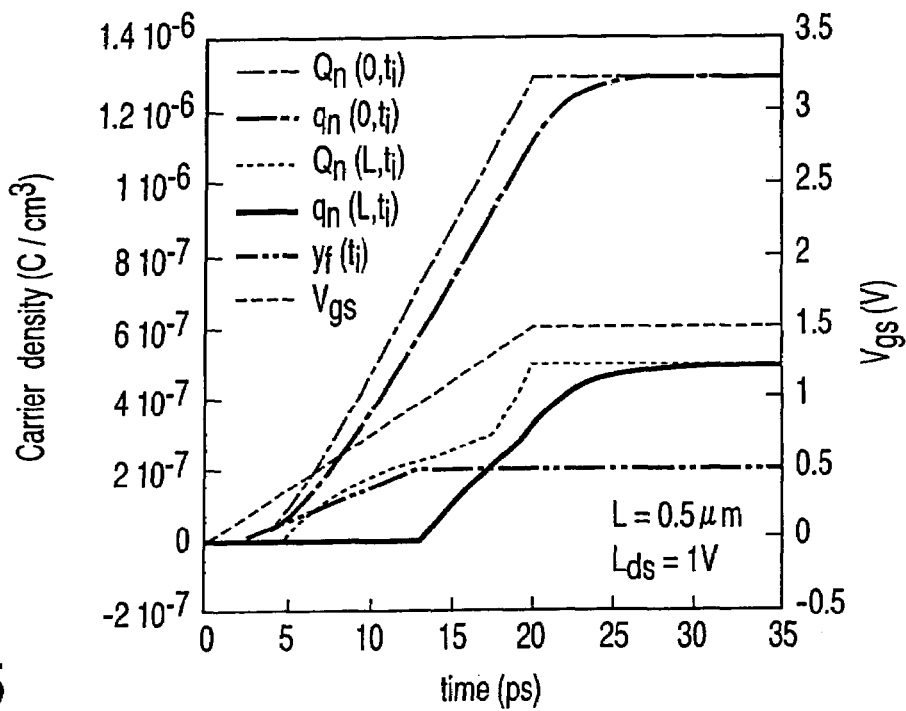
FIG. 25 is a graph showing calculation results of each transient carrier density by the simulation model according to the third embodiment.
Figure 26:
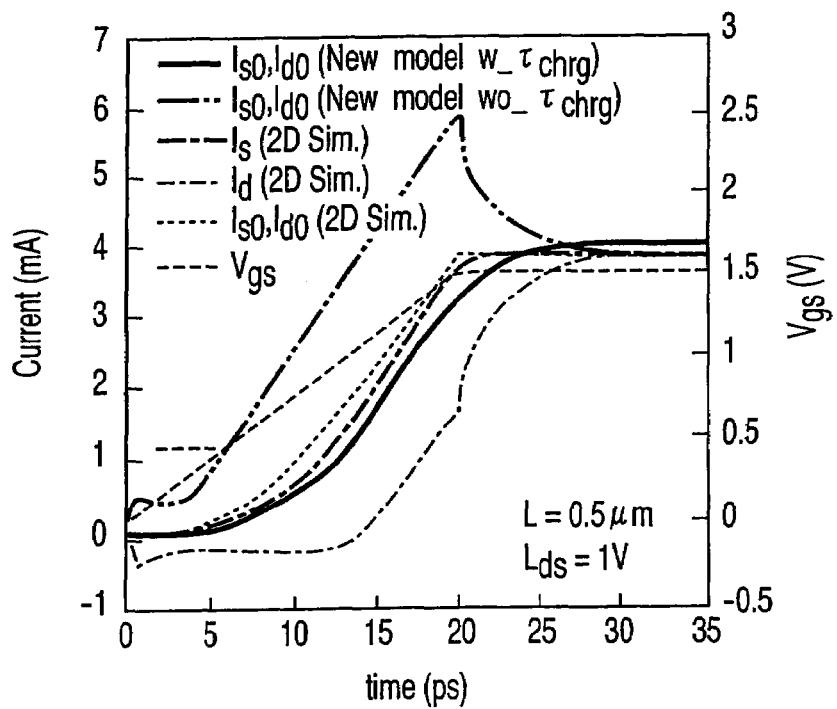
FIG. 26 is a graph showing calculation results of conduction currents by the simulation model according to the third embodiment and two-dimensional device simulation.
Figure 29:
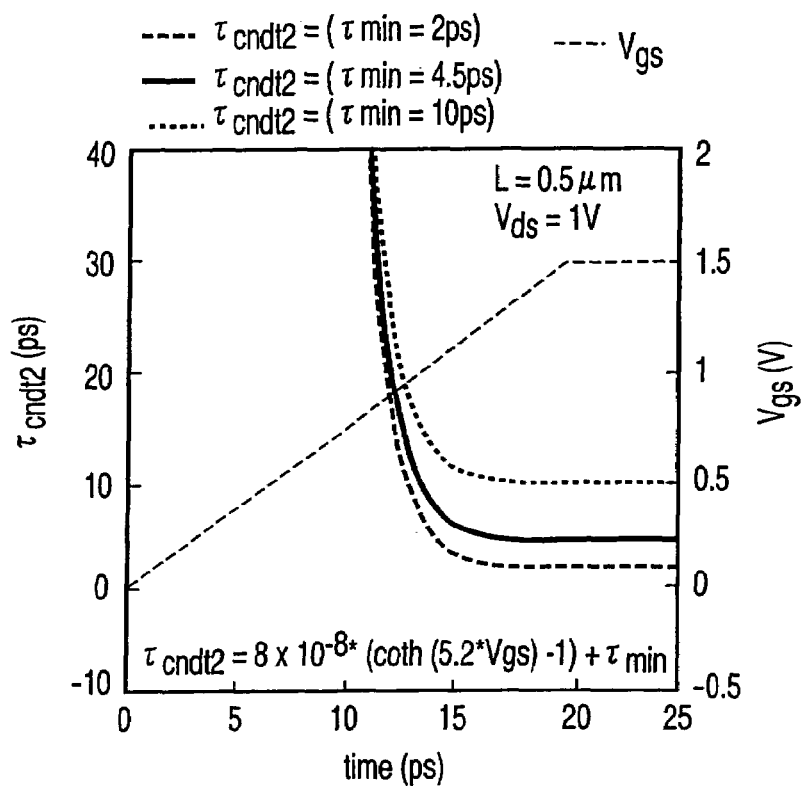
FIG. 29 is a graph showing characteristics of the conductive delay by the simulation model according to the third embodiment with respect to its minimum value.
Figure 30:
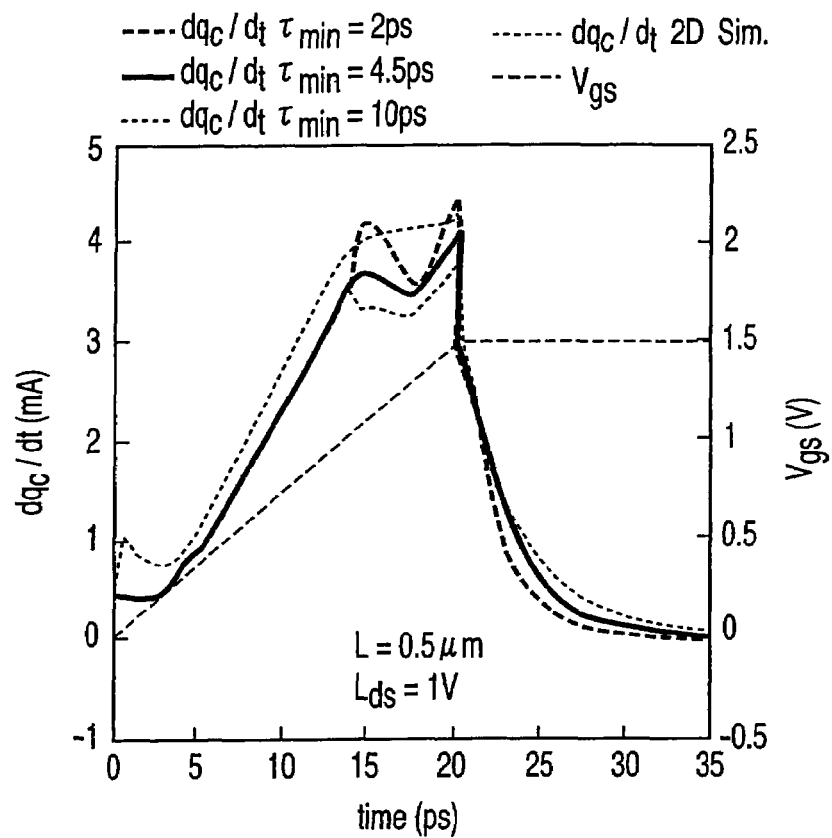
FIG. 30 is a graph showing dependence of the displacement current by the simulation model according to the third embodiment on the conductive delay, and calculation results of the displacement current by the two-dimensional device simulation.

Next, a third embodiment according to the present invention will be described with reference to FIGS. 23 to 30. FIG. 23 is a graph showing a relation between each of passing delay, charging delay, and two types of conductive delays which are delay models according to the present embodiment, and voltages. FIG. 24 is a graph showing calculation results of each carrier running time according to the present embodiment. FIG. 25 is a graph showing calculation results of each transient carrier density by the simulation model according to the present embodiment. FIG. 26 is a graph showing calculation results of conduction currents by the simulation model according to the present embodiment and two-dimensional device simulation. FIG. 27 is a graph showing calculation results of displacement currents by the simulation model according to the present embodiment and the two-dimensional device simulation. FIG. 28 is a graph showing dependence of the displacement current on the charging delay by the simulation model according to the present embodiment and calculation results of the displacement currents by the two-dimensional simulation. FIG. 29 is a graph showing characteristics of the conductive delay by the simulation model according to the present embodiment with respect to its minimum value. FIG. 30 is a graph showing dependence of the displacement current by the simulation model according to the present embodiment on the conductive delay, and calculation results of the displacement current by the two-dimensional device simulation. It is to be noted that the same components as those of the first and second embodiments are denoted with the same reference numerals, and detailed description is omitted.

In the present embodiment, concrete and detailed researches and considerations performed by the present inventors with respect to the NQS simulation model described in the first and second embodiments will be described hereinafter in detail.

First, the charging delay $\tau_{chrg}$ will be described. This $\tau_{chrg}$ has to include an additional force for pushing the carrier 4 toward the drain 6 from the channel 8, when the carrier 4 is charged into the channel 8 from the source 5. FIG. 19 used in the second embodiment shows an electric field distribution along the channel 8 by the two-dimensional simulation. A maximum electric field in the source-side end portion 8a of the channel 8 gives the channel 8 a force for passing the carrier 4. A running time for crossing a depletion region $l_d$ can be substantially described by the equation (23). Here, with regard to a case where a gate length is 0.5 μm, and $V_{ds}$=1.0 V, $\tau_{chrg}$ modeled from analysis by a two-dimensional simulator MEDICI is represented by the following equation (26):

$$\tau_{chrg} = [0.9 \times 10^{-12} \tanh\{1.5(V_{gs} - V_{TH})\} - 0.9 \times 10^{-12}] * 3.0, \quad (26)$$

where $\tau_{chrg}$ determines the transient carrier density in the source-side end portion 8a of the channel 8. Therefore, the transient carrier density in the source-side end portion 8a of the channel 8 is represented by the equation (6).

Next, first conductive delay $\tau_{cndt1}$ will be described. As described above, this $\tau_{cndt1}$ denotes a time required until a head position (tip position) $y_f$ of the carrier 4 reaches the drain 6 from the source 5 in a case where the source-side end portion 8a and the drain-side end portion 8b of the channel 8 are not filled with the carriers 4, and the channel 8 is not formed. According to researches performed by the present inventors, it has been found that a movement velocity of the head position $y_f$ of the carrier 4 is substantially constant regardless of the time. Therefore, the head position $y_f$ of the carrier 4 is represented by the equation (7).

Next, second conductive delay $\tau_{cndt2}$ will be described. As described above, this $\tau_{cndt2}$ denotes a conductive delay in a case where the source-side end portion 8a and the drain-side end portion 8b of the channel 8 are filled with the carriers 4, and the channel 8 is formed. This second conductive delay $\tau_{cndt2}$ is calculated from an average velocity of the carriers 4 in the channel 8, and is a function of a surface potential. This second conductive delay $\tau_{cndt2}$ can be represented by an equation in which $\tau_{cndt}$ is replaced with $\tau_{cndt2}$ in the equation (22). $\tau_{cndt2}$ denotes a time required until the carrier 4 discharged from the source 5 reaches the drain 6, and directly influences the transient carrier density of the drain 6. Therefore, an equation showing the transient carrier density of the drain 6 can be represented by an equation in which $\tau(t_i)$ of the equation (19) is replaced with $\tau_{cndt2}$.

In actual calculation of the carrier delay, $\tau_{cndt1}$ changes to $\tau_{cndt2}$ before/after the head of the carrier 4 reaches the drain 6. Then, $\tau_{cndt1}$ and $\tau_{cndt2}$ are represented by $\tau_{cndt}$ combined with a relation of the following equation (27) in such a manner as to obtain a smooth change in the calculation.

$$\frac{1}{\tau_{cndt}(t_i)} = \frac{1}{\tau_{cndt1}(t_i)} + \frac{1}{\tau_{cndt2}(t_i)} \quad (27)$$

Therefore, both $\tau(t_i)$ and $\tau_{cndt2}(t_i)$ of the equations (22) and (19) are replaced with $\tau_{cndt1}(t_i)$ to calculate the transient carrier density. By combination of the equation (27) with the equation (24), three types of delay models of the carrier for use in the NQS simulation model of the present embodiment can be represented by the following equation (28).

$$\frac{1}{\tau(t_i)} = \frac{1}{\tau_{cndt1}(t_i)} + \frac{1}{\tau_{cndt2}(t_i)} + \frac{1}{\tau_{chrg}} \quad (28)$$

A relation among three types of delay models of the carrier 4 for use in the NQS simulation model of the present embodiment is shown in the graph in FIG. 23.

Next, verification of validity of a transient carrier density distribution model by a conduction current using the NQS simulation model of the present embodiment will be described.

The displacement current of the equation (4a) is ignored, and the conduction current of the equation (14) is described by the transient carrier density distribution model. Then, the following equations (29) and (30) can be obtained in accordance with the state of the head of the carrier 4 in the MOSFET 2.

$$I(0, t) = I(L, t) \approx \frac{W}{L} \mu \int_{\varphi_{s0}(t_i)}^{\varphi_{sL}(t_i)} q_n(0, t) d\varphi(y, t) \quad (29)$$

$$= \frac{W}{L} \mu \frac{q_n(0, t_i) \cdot \varphi(t_i)}{2}$$

$$I(0, t) = I(L, t) \quad (30)$$

$$= \frac{W}{L} \mu \int_{\varphi_{s0}(t_i)}^{\varphi_{sL}(t_i)} q_n(0, t) d\varphi(y, t)$$

$$= \frac{W}{L} \mu \frac{1}{2} [\varphi_{sp}(t_i) - \varphi_{s0}(t_i)] \cdot$$

$$[Q_n(0, t_i) - q_n(L, t_i)] + \frac{W}{L} \mu \frac{1}{2}$$

$$[\varphi_{sL}(t_i) - \varphi_{sp}(t_i)] \cdot q_n(L, t_i)$$

The equation (29) is applied to a state in which the head of the carrier 4 does not reach the drain 6. The equation (30) is applied to a state in which the head of the carrier 4 reaches the drain 6. It is to be noted that in the calculation in this verification, it is assumed that calculation results of HiSIM in the stationary state at time $t_i$ are used as carrier densities $Q_n(0, t_i)$ and $Q_n(L, t_i)$ of the stationary state, and surface potentials $\phi_{s0}(t_i)$, $\phi_{sL}(t_i)$, and $\phi_{sp}(t_i)$.

First, a state in which the head of the carrier 4 does not reach the drain 6, that is, a case where $q_n(L, t_i)$=0 will be described. In this case, the equation (14) integration corresponds to an area of a triangle in FIG. 15A in which the ordinate indicates the carrier density, and the abscissa indicates the potential. This is represented by the equation (29). In the equation (29), φ(t$_i$) is calculated by the equation (17).

Next, a state in which the head of the carrier 4 reaches the drain 6, that is, a case where q$_n$(L, t$_i$)>0 will be described. In this case, the equation (14) integration corresponds to a sum of areas of a trapezium on the left side and a triangle on the right side in FIG. 15B used in the second embodiment, in which the ordinate indicates the carrier density, and the abscissa indicates the potential. This is represented by the equation (30).

In the present verification, charging delay τ$_{chrg}$ was calculated by the equation (26). According to researches performed by the present inventors, it has been seen from the first conductive delay τ$_{cndt1}$ that the head position y$_f$ of the carrier 4 starts moving at t=2.5 ps, and reaches the drain 6 at t=13.5 ps. Accordingly, in the present verification, τ$_{cndt1}$=(13.5−2.5) ps=11.0 ps is substantially constant. The first conductive delay τ$_{cndt2}$ was calculated in accordance with a case where τ$_{cndt}$ was replaced with τ$_{cndt2}$ in the equation (22).

FIG. 24 shows a calculation result of the above-described carrier running delay. A transient source carrier density q$_n$(0, t), a carrier head position y$_f$(t), and a transient drain carrier density q$_n$(L, t) were calculated using a carrier running time shown in FIG. 24 by the respective equations (6), (7), and (19). This result is shown in FIG. 25. For comparison, a source carrier density Q$_n$(0, t) in the stationary state, and a drain carrier density Q$_n$(L, t) in the stationary state are also plotted in FIG. 25. The carrier head position y$_f$ linearly increases as desired, and reaches the drain region 6 in the vicinity of 13 ps. A value of q$_n$(L, t) is 0 until about 13 ps, but thereafter increases, and a state in which the channel 8 is not formed is represented well. In comparison with Q$_n$(L, t), modeled q$_n$(0, t) and q$_n$(L, t) indicate clear response delays. Even after the gate voltage V$_{gs}$ reaches the stationary state, q$_n$(0, t) and q$_n$(L, t) smoothly converge toward an expected final value.

Moreover, FIG. 26 shows conduction currents calculated by two equations (29) and (30). It is to be noted that FIG. 26 also shows a source current, drain current, and conduction current for comparison. The current value varies at a time 35 ps in the vicinity of the stationary state, because the two-dimensional device simulator is not completely tuned. It is seen that a carrier delay is considered with respect to a conduction current I$_{do}$ by the two-dimensional simulation, and therefore delay is caused in the current in the NQS simulation model of the present embodiment. Additionally, as a whole tendency, it is seen that the NQS simulation model of the present embodiment reproduces the two-dimensional simulation well. A difference between Q$_n$(0, t$_i$) and q$_n$(0, t$_i$) shown in FIG. 25 indicates an influence of the charging delay τ$_{chrg}$. The effect is shown by a difference between a bold one-dot chain line without τ$_{chrg}$ and a bold solid line with τ$_{chrg}$ in FIG. 26. As apparent from FIG. 25, as the gate voltage increases, the effect of τ$_{chrg}$ with respect to q$_n$(0, t$_i$) increases. This effect appears in that the delay of the conduction current increases at and after 13 ps in FIG. 26.

Next, the verification of the validity of a transient carrier density distribution model by a displacement current using the NQS simulation model of the present embodiment will be described.

The equation (4b) is described only with respect to the displacement current. Then, the following equation (31) can be obtained.

$$q\frac{W}{L}\int_0^L \int_0^y \frac{dn(y',t)}{dt} dy' dy = \frac{qdn(y,t)}{dt} = \frac{dq_c(t)}{dt}, \quad (31)$$

wherein q$_c$(t) denotes a carrier charge amount in an MOSFET 2 at a time t. The calculation of q$_c$(t) of the equation (31) in the transient carrier density distribution model corresponds to the obtaining of the area of a triangle or a trapezium in FIGS. 15A and 15B in which the ordinate indicates a carrier density, and the abscissa indicates a distance in a channel direction. When q$_c$(t$_i$) at a time t$_i$ is described by the transient carrier density distribution model, the following two equations (32) and (33) are obtained in accordance with the state (position) of the carrier head in the MOSFET 2.

$$q_C(t_i) = W\frac{1}{2} q_n(0, t_i) y_f(t_i) \quad (32)$$

$$q_C(t_i) = W\frac{1}{2}[q_n(0, t_i) + q_n(L, t_i)]y_p(t_i) + W\frac{1}{2}q_n(L, t_i)[L - y_p(t_i)] \quad (33)$$

The equation (32) is applied to a state in which the head of the carrier 4 does not reach the drain 6. The equation (33) is applied to a state in which the head of the carrier 4 reaches the drain 6.

First, a state in which the head of the carrier 4 does not reach the drain 6, that is, a case where q$_n$(L, t$_i$)=0 will be described. In this case, q$_c$(t$_i$) corresponds to the area of the triangle whose width is assumed to be a carrier density q$_n$(0, t$_i$) and whose height is a carrier head position y$_f$(t$_i$) in FIG. 15A used in the second embodiment. This is represented by the equation (32).

Next, a state in which the head of the carrier 4 reaches the drain 6, that is, a case where q$_n$(L, t$_i$)>0 will be described. In this case, q$_c$(t$_i$) corresponds to a sum of areas of a trapezium on the left side, whose lower side is assumed to be a carrier density q$_n$(0, t$_i$) and whose upper side is a carrier density q$_n$(L, t$_i$) and whose height is a pinch-off distance y$_p$(t$_i$), and a triangle on the right side, whose lower side is assumed to be a carrier density q$_n$(L, t$_i$) and whose height is (L-y$_p$(t$_i$)) in FIG. 15A used in the second embodiment. This is represented by the equation (33).

It is to be noted that in this verification, a final equation of the equation (31) was calculated as in the following equation (34).

$$\frac{dq_C(t_i)}{dt} = \frac{q_C(t_i) - q_C(t_{i-1})}{t_i - t_{i-1}}, \quad (34)$$

wherein t$_{i-1}$ indicates a time before t$_i$.

FIG. 27 shows a calculation result of the displacement current in a case where a drain voltage V$_{ds}$=1.0 V (constant), and the gate voltage V$_{gs}$ is applied from 0 V to 1.5 V over 20 ps. The charging delay τ$_{chrg}$, and the conductive delays τ$_{cndt1}$, τ$_{cndt2}$ are conditions as shown in FIG. 24. In FIG. 27, the calculation result by the two-dimensional simulator is also plotted for comparison. A current value of the NQS simulation model of the present embodiment is different from that of the two-dimensional simulation for about 3 ps after start of gate voltage application, because an overlap capacity of a model parameter of HiSIM is different from that of the two-dimensional simulator.

Both the displacement currents linearly increase until 13 ps in a state in which the head of the carrier 4 does not reach the drain 6. Additionally, tilt of the NQS simulation model of the present embodiment is slightly moderate as compared with tilt of the two-dimensional simulator. The current value of the NQS simulation model of the present embodiment is smaller than that of the two-dimensional simulation at and after 13 ps at which the head of the carrier 4 reaches the drain 6 until 20 ps at which the increase of the gate voltage ends. According to the researches performed by the present inventors, an electron density distribution of and after 14 ps is rounded upwards in the two-dimensional simulation. On the other hand, the distribution is linearly approximated in the NQS simulation model of the present embodiment. Accordingly, in the NQS simulation model of the present embodiment, a charge change amount is calculated to be small as compared with the two-dimensional simulation. The NQS simulation model of the present embodiment matches the two-dimensional simulation very well at and after 20 ps at which the gate voltage becomes constant. That is, the validity of introduction of the conductive delays $\tau_{cndt1}$, $\tau_{cndt2}$ in the NQS simulation model of the present embodiment is supported.

FIG. 28 shows the result of the influence of the charging delay $\tau_{chrg}$ on the displacement current together with the result of the two-dimensional simulation. To change the value of $\tau_{chrg}$, a parameter m which changes the value of $\tau_{chrg}$ was added to the model equation (26) of $\tau_{chrg}$. This can be represented by the following equation (35).

$$\tau_{chrg}=[0.9\times10^{12}\tan h\{1.5(V_{gs}-V_{TH})\}-0.9\times10^{12}]*3.0*m \quad (35),$$

where ⅓, 1, 2 are set as values of m, and correspond to about 0.9 ps, 2.6 ps, 5.2 ps which are the values of $\tau_{chrg}$ at $V_{gs}=1.5$ V. When $\tau_{chrg}$ is small, the carrier 4 is momentarily charged into the channel 8 in accordance with the gate voltage $V_{gs}$. Therefore, a large displacement current flows while the gate voltage $V_{gs}$ rises. When the rising of the gate voltage $V_{gs}$ stops, the carriers charged in the channel do not increase any more, the carrier 4 flowing out of the drain 6 works, and the displacement current rapidly decreases. On the other hand, when $\tau_{chrg}$ is large, the carrier 4 is charged behind the rise of the gate voltage $V_{gs}$ during the rising of the gate voltage $V_{gs}$, and therefore the displacement current decreases. Additionally, it is seen that even when the rising of the gate voltage $V_{gs}$ stops, the carrier 4 continues to be charged into the channel 8, and therefore the decrease of the displacement current becomes moderate.

Next, the present inventors checked the influence of the conductive delay $\tau_{cndt2}$ on the displacement current. In this case, the equation (22) with respect to the drain voltage $V_{ds}=1.0$ V was approximated by the following equation (36).

$$\tau_{cndt2}=8\times10-8(coth(5.2\times V_{gs})-1)+\tau_{min} \quad (36)$$

In this equation (36), a minimum value $\tau_{min}$ of $\tau_{cndt2}$ at the gate voltage $V_{gs}=1.5$ V can be changed. In the present embodiment, values of 2 ps, 10 ps were used as the value of $\tau_{min}$ in addition to original 4.5 ps obtained by the equation (22). FIG. 29 shows changes of $\tau_{cndt2}$ with respect to the value of $\tau_{min}$ used this time in the graph.

FIG. 30 shows displacement currents in a case where $\tau_{min}$ is used as a parameter. $\tau_{cndt2}$ has a function of determining a response of the carrier density of the drain 6 after the channel 8 is formed. Therefore, any influence of the change of $\tau_{cndt2}$ on the displacement current is not seen at or before 13 ps before the channel is formed as intended. When $\tau_{min}$, that is, $\tau_{cndt2}$ us large, as seen from the equation (19), it is meant that the increase of the channel density of the drain-side end portion 8b of the channel 8 is small. This means that while the gate voltage $V_{gs}$ is rising, the increase of the carrier density in the drain-side end portion 8b of the channel 8 by inflow of a charge amount into the channel is substantially equal to the decrease of the carrier density in the drain-side end portion 8b of the channel 8. As a result, the change of the charge amount of the whole carrier 4 in the channel 8 is reduced. Therefore, as seen in a broken-line graph between 13 ps and 20 ps in FIG. 30, in a case where $\tau_{min}=10$ ps, the displacement current is reduced as compared with other cases.

On the other hand, when there is hardly change in the gate voltage $V_{gs}$, and the voltage is substantially constant, the inflow of the electric charge amount into the channel 8 becomes constant, only outflow of the carrier 4 from the drain 6 appears as a change amount of the whole carrier 4. In this case, when $\tau_{cndt2}$ is large, that is, when the change of the carrier density of the drain-side end portion 8b of the channel 8 is reduced, it is meant that the outflow of the carrier 4 is suppressed, or the carrier 4 remains long in the channel 8. This is because much time is required until the graph in a case where $\tau_{min}=10$ ps indicates a substantially constant value as seen in the broken-line graph of and after 20 ps in FIG. 30.

As described above, according to the third embodiment, effects similar to those of the first and second embodiments can be obtained. As shown in FIG. 23 and equation (28), validities of the charging delay $\tau_{chrg}$ and conductive delays $\tau_{cndt1}$, $\tau_{cndt2}$ for use in the NQS simulation model of the present embodiment were sufficiently confirmed. Moreover, the validities of the transient carrier density distribution model by the conduction current using the NQS simulation model of the present embodiment, and the transient carrier density distribution model by the displacement current were sufficiently verified.

Fourth Embodiment

Figure 31:
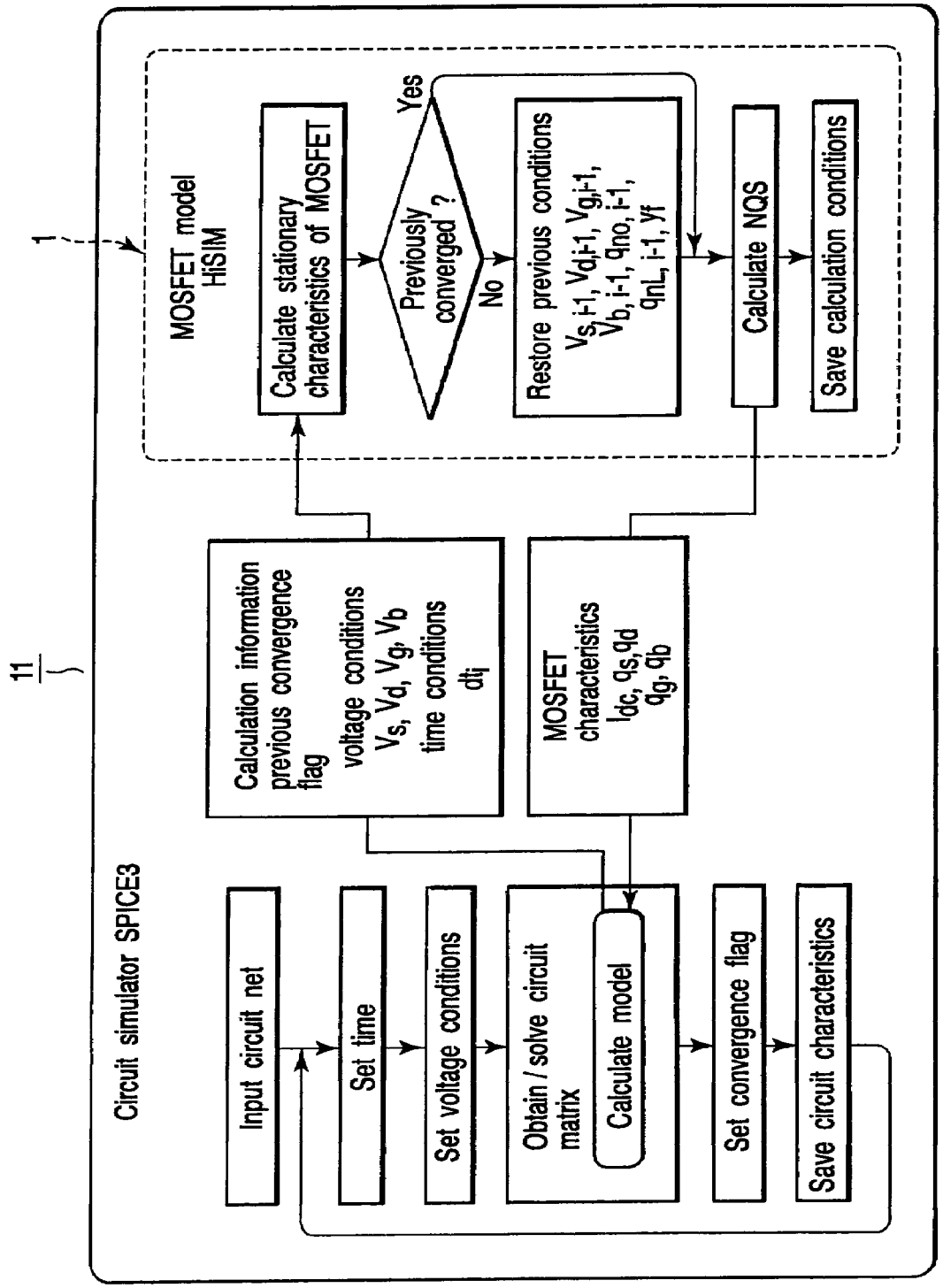
FIG. 31 is a block diagram schematically showing simulation apparatus and method for designing the semiconductor device, into which the simulation model for designing the semiconductor device according to a fourth embodiment is incorporated.
Figure 32A:
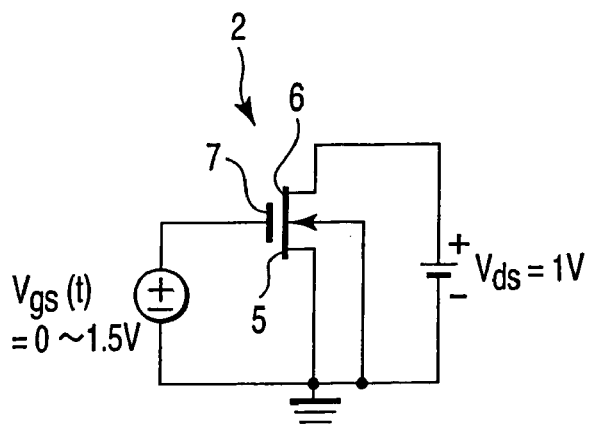
FIGS. 32A and 32B are diagrams showing a circuit for transient analysis by the simulation apparatus for designing the semiconductor device according to the fourth embodiment, and its turn-on input voltage.
Figure 32B:
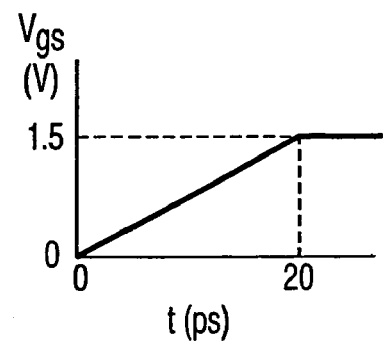
Figure 33:
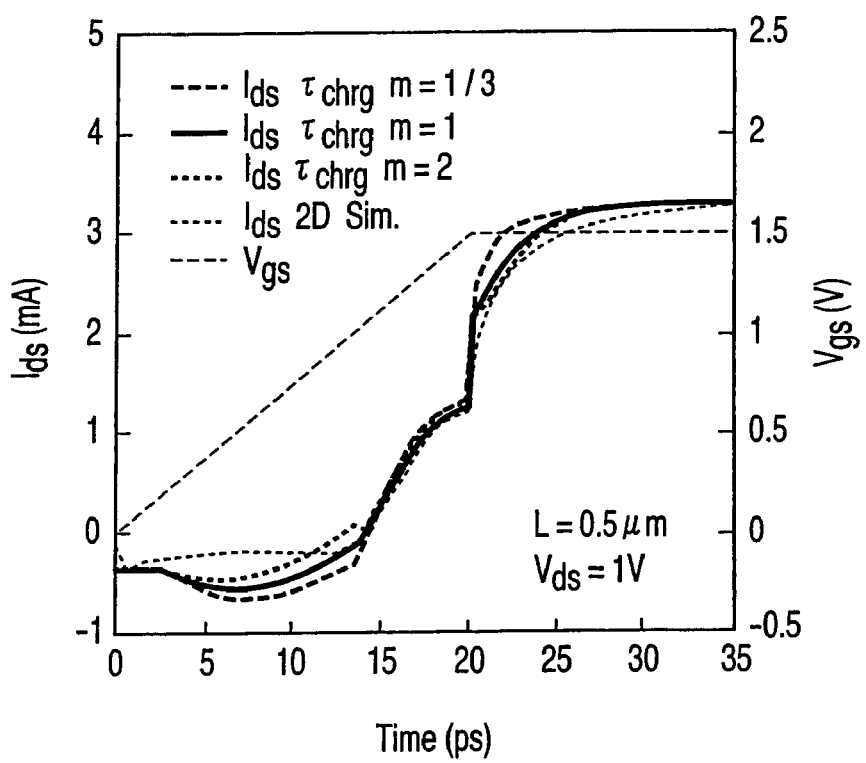
FIG. 33 is a graph showing dependence of a turn-on drain current by the simulation apparatus for designing the semiconductor device according to the fourth embodiment with respect to the charging delay, and calculation results of the turn-on drain current by the two-dimensional device simulation.
Figure 34:
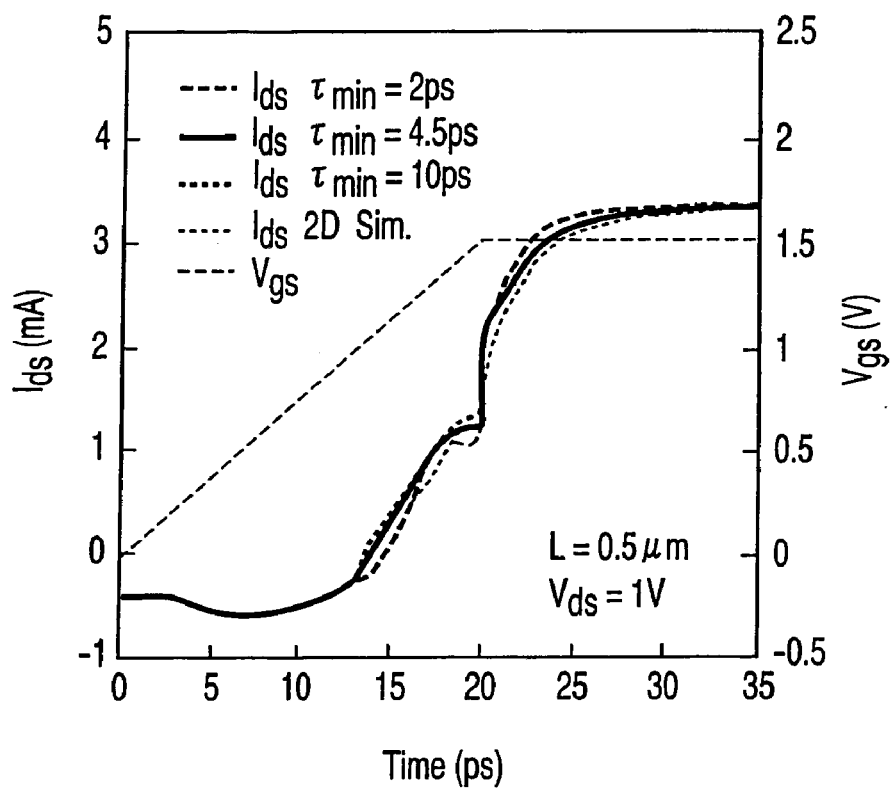
FIG. 34 is a graph showing dependence of the turn-on drain current by the simulation apparatus for designing the semiconductor device according to the fourth embodiment with respect to the conductive delay, and calculation results of the turn-on drain current by the two-dimensional device simulation.
Figures 35A, 35B:
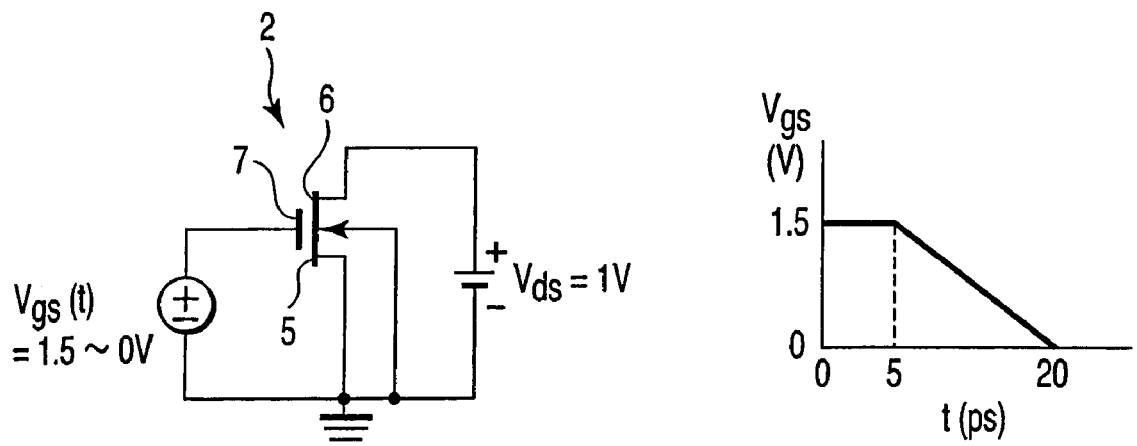
FIGS. 35A and 35B are diagrams showing the circuit for transient analysis by the simulation apparatus for designing the semiconductor device according to the fourth embodiment, and its turn-off input voltage.
Figure 36:
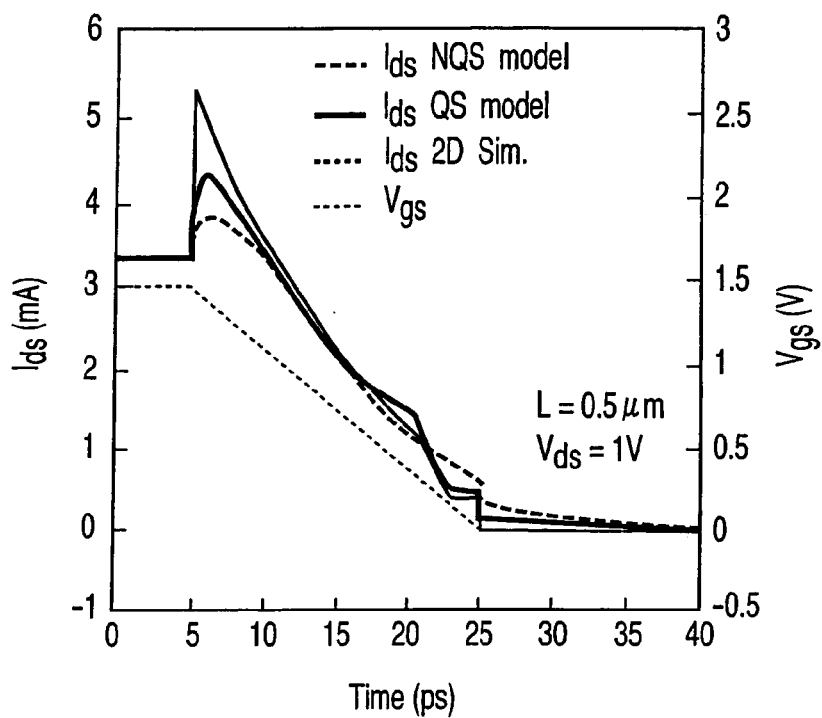
FIG. 36 is a graph showing calculation results of a turn-off drain current by the simulation apparatus for designing the semiconductor device according to the fourth embodiment and the two-dimensional device simulation.
Figure 37:
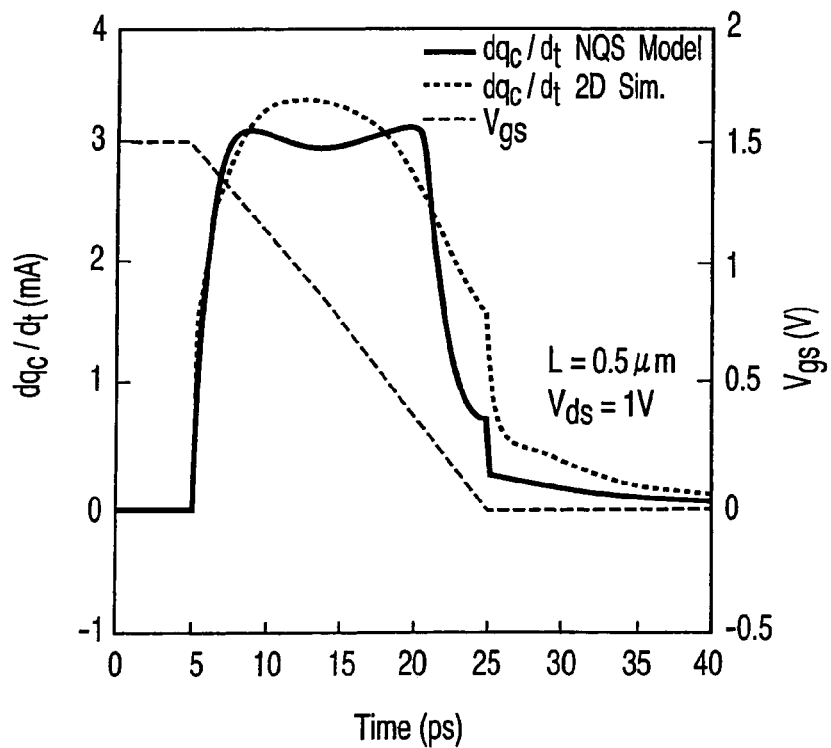
FIG. 37 is a graph showing calculation results of the displacement current in the turn-off by the simulation apparatus for designing the semiconductor device according to the fourth embodiment and the two-dimensional device simulation.

Next, a fourth embodiment of the present invention will be described with reference to FIGS. 31 to 37. FIG. 31 is a block diagram schematically showing simulation apparatus and method for designing a semiconductor device, into which a simulation model for designing the semiconductor device according to the present embodiment is incorporated. FIGS. 32A and 32B are diagrams showing a circuit for transient analysis by the simulation apparatus for designing the semiconductor device according to the present embodiment, and its turn-on input voltage. FIG. 33 is a graph showing dependence of a turn-on drain current by the simulation apparatus for designing the semiconductor device according to the present embodiment with respect to charging delay, and calculation results of the turn-on drain current by the two-dimensional device simulation. FIG. 34 is a graph showing dependence of the turn-on drain current by the simulation apparatus for designing the semiconductor device according to the present embodiment with respect to conductive delay, and calculation results of the turn-on drain current by the two-dimensional device simulation. FIGS. 35A and 35B are diagrams showing the circuit for transient analysis by the simulation apparatus for designing the semiconductor device according to the present embodiment, and its turn-off input voltage. FIG. 36 is a graph showing calculation results of a turn-off drain current by the simulation apparatus for designing the semiconductor device according to the present embodiment and the two-dimensional device simulation. FIG. 37 is a graph showing calculation results of the displacement current in the turn-off by the simulation apparatus for designing the semiconductor device according to the present embodiment and the two-dimensional device simulation. It is to be noted that the same components as those of the first to third embodiments are denoted with the same reference numerals, and detailed description is omitted.

In the present embodiment, the simulation apparatus and simulation method for designing the semiconductor device using the NQS simulation model described in the first to third embodiments will be described hereinafter in detail.

First, HiSIM which is an NQS simulation model 1 incorporated into an existing representative circuit simulator SPICE 3 will be described. Input/output information of the NQS simulation model HiSIM with respect to SPICE 3 will be described. FIG. 31 shows a relation between the NQS simulation model HiSIM developed by the present inventors and the circuit simulator SPICE 3. A part surrounded with a broken-line frame is HiSIM 1 (MOSFET model HiSIM 1). This HiSIM 1 is combined with the circuit simulator SPICE 3 to constitute a circuit simulator 11 which is a simulation apparatus for designing a semiconductor device according to the present embodiment. Moreover, the simulation method for designing the semiconductor device according to the present embodiment is performed by the circuit simulator 11.

In the transient analysis of the SPICE 3, voltage conditions are set for each time step, and calculation results of a MOSFET model with respect to the conditions are obtained. In the MOSFET model HiSIM 1, a flag indicating a time interval and previous convergence state in the circuit simulator 11 is input from the SPICE 3 together with the voltage conditions. In the HiSIM 1, a stationary state is first calculated under the input voltage conditions. Subsequently, the previously convergence flag is checked. This flag indicates whether or not the previous circuit matrix calculation has normally converged in the circuit simulator. When abnormal convergence is indicated, it is meant that the previous calculation is invalid. When the flag indicates the abnormal convergence, voltage conditions before the previous conditions and a state of a transient electric charge density are set again in such a manner that they are usable as the previous state. The present transient electric charge density is calculated using the previous transient electric charge density. However, when the previous calculation is invalid, the previous state is also invalid, and is not usable. Therefore, the state before the previous state needs to be set as the previous state. When the flag indicates normal convergence, NQS calculation is performed. Subsequently, the previous state is set as the state before the previous state, a newly calculated state is set as the previous state, and they are saved for use in the next calculation. After the NQS calculation, the conduction current and a transient electric charge of each electrode are returned to the circuit simulator 11. The SPICE 3 of the circuit simulator 11 obtains a current and voltage of the whole circuit by matrix calculation using information obtained from the MOSFET model HiSIM 1. Subsequently, the convergence flag is set, the circuit characteristics are saved, and the process shifts to calculation in the next time step.

Next, an electric charge amount of each of electrodes 5, 6, 7 of a transistor 2 and charge partitioning will be described. In transient analysis of the circuit simulator 11 of the present embodiment, an electric charge amount $Q_{a0}$ and conduction current $I_{a0}$ of each electrode, calculated by a transistor model, are received, and a current flowing through each electrode is calculated in accordance with a predetermined equation. A gate charge $Q_G$ is represented by a sum of a channel charge $Q_C$ and a substrate charge $Q_B$. Additionally, the channel charge $Q_C$ corresponds to the channel charge $q_c$ calculated by the equations (32) and (33) of the NQS simulation model 1 of the present embodiment. Therefore, the gate charge $Q_G$ can be represented by the following equation (37):

$$Q_G = -(Q_B + q_c) \tag{37}$$

Moreover, the channel charge $q_c$ is a sum of a source charge $q_s$ and a drain charge $q_D$, and can be represented by the following equation (38):

$$q_c = q_s + q_D \tag{38}$$

Therefore, the channel charge $q_c$ obtained by the NQS simulation model 1 of the present embodiment needs to be partitioned into the source charge $q_s$ and the drain charge $q_D$ and transferred to the circuit simulator SPICE 3. In the circuit simulator BSIM3 described in the background technique, as setting of default of the MOSFET, the partitioning is set to 60/40 and transferred to the circuit simulator. In the present embodiment, a partitioning ratio was calculated as 60/40 for simplicity. Assuming that there is little transient influence of the substrate charge $Q_B$ on the gate voltage $V_{gs}$, the electric charge calculated in the stationary state is transferred as such to the circuit simulator.

Next, turn-on transient calculation of NMOSFET by the SPICE 3 using the NQS simulation model HiSIM 1 of the present embodiment will be described.

Transient analysis of a circuit shown in FIGS. 32A and 32B were performed by the SPICE 3 using the NQS simulation model of the present embodiment. In this case, the gate length of the MOSFET 2 was set to about 0.5 μm, a drain voltage $V_{DS}=1.0$ V (constant) was set, and a source voltage $V_S$=bulk voltage $V_B=0$ V (constant) was set. Moreover, turn-on characteristics in a case where the gate voltage $V_{GS}$ was raised to about 1.5 V from 0 V over about 20 ps were calculated.

FIG. 33 shows output results of the drain current by the SPICE 3. FIG. 33 also shows a drain current using m defined in the equation (35) as a parameter, and a drain current by the two-dimensional simulator in order to check an influence of the charging delay $\tau_{chrg}$ on the drain current. When the current by the two-dimensional simulator is negative for about 14 ps, it is indicated that the current flows into the MOSFET 2 from the drain through an overlap capacity. A negative current also flows through the NQS simulation model HiSIM 1 for about 14 ps, but characteristics are rounded downwards. This is supposedly because a bonding capacity model incorporated in the HiSIM 1 has a dependence on the gate voltage. In the NQS simulation model HiSIM 1, the current jumps in about 20 ps. A jump width increases, when $\tau_{chrg}$ is small. This corresponds to a jump seen even in the displacement current shown in FIG. 30 used in the third embodiment. A cause for the jump is not clarified, but it is considered that the jump is caused by a problem in calculating the circuit simulator SPICE 3.

Moreover, in FIG. 33, the channel is not formed, and the carriers are only stored in the transistor (MOSFET) 2 for about 14 ps. In this state, when $\tau_{chrg}$ increases, the drain current is large. For about 20 ps after about 14 ps, the channel 8 is formed, and the inflow of the carrier 4 from the source 5 and the outflow of the carrier 4 from the drain 6 simultaneously occur. As a result, it is seen that the influence of $\tau_{chrg}$ on the drain current is small. At and after about 20 ps at which the rising of the gate voltage $V_{GS}$ has stopped, when $\tau_{chrg}$ is large, supply of the carrier 4 from the source 5 delays. Therefore, it is seen that a time is required until each simulation result reaches the stationary state. As apparent from FIG. 33, it is seen that the simulation result of the NQS simulation model HiSIM 1 entirely matches that of the two-dimensional simulation in a case where m=1.

Next, in FIG. 34, the drain current by the NQS simulation model HiSIM 1 using $\tau_{min}$ defined in the equation (36) as the parameter is superimposed upon the drain current by the two-dimensional simulator in order to check the influence of the conductive delay $\tau_{cndt2}$ onto the drain current. Since $\tau_{cndt2}$ is a delay that works in a region where the channel 8 is formed, a difference of $\tau_{min}$ appears at and after about 14 ps. Especially, a large difference appears immediately before about 20 ps. When $\tau_{min}$ is small in this case, as shown in FIG. 30 used in the third embodiment, the case corresponds to a case where the changes of the carriers 4 accumulated in the channel 8 are large, and it is meant that less carriers 4 flow out of the drain 6 as compared with other cases. The transient electric charge density in the drain end is set to be brought close to the stationary state, when $\tau_{min}$ is smaller at and after about 20 ps at which the rising of the gate voltage $V_{gs}$ has stopped as shown in the equation (19). Therefore, the drain current is brought into the stationary state soon, when $\tau_{min}$ is smaller.

Next, turn-on transient calculation of an NMOSFET 2 by the SPICE 3 using the NQS simulation model HiSIM 1 of the present embodiment will be described.

It is important to check turn-off characteristics together with the above-described turn-on characteristics in evaluating the model. Here, the transient analysis of the circuit shown in FIGS. 35A and 35B was performed by the SPICE 3 using the NQS simulation model HiSIM 1 of the present embodiment. In this case, the gate length of the MOSFET 2 was set to about 0.5 μm, and the drain voltage $V_{DS}$=1.0 V (constant) and the source voltage $V_S$=bulk voltage $V_B$=0 V (constant) were set. Moreover, the turn-off characteristic in a case where the gate voltage $V_{GS}$ was lowered to 0 V from about 1.5 V in about 20 ps was calculated.

FIG. 36 shows the turn-off characteristics of the drain current by the NQS simulation model HiSIM 1 of the present embodiment together with results of a QS model and two-dimensional simulation. At the same time the gate voltage $V_{GS}$ starts dropping at about 5 ps, jumps are seen in the drain currents of the NQS model HiSIM 1 and the QS model. This jump is also seen in the two-dimensional simulation, but is small as compared with the jumps in the HiSIM 1 and the QS model. The jump is similarly generated even at about 25 ps at which the dropping of the gate voltage $V_{GS}$ stops. This phenomenon is generally known. The jump is generated in any case, and is therefore considered to be caused by a peculiar problem in calculating numerical values. A peak appears in the vicinity of about 7 ps at which the gate voltage $V_{GS}$ starts dropping in the comparison of the NQS model HiSIM 1 with the two-dimensional simulation. In this case, when the value of the NQS model HiSIM 1 is large, the current smoothly decreases from about 17 ps until about 25 ps in the two-dimensional simulation. On the other hand, the current rapidly decreases after the decrease of the current is moderated once in the NQS model HiSIM 1. In FIG. 37, the displacement current in the turn-on of the NQS model HiSIM 1 is superimposed upon the result of the two-dimensional simulation in order to check the state of this time zone in contrast to the displacement current.

As apparent from FIG. 37, in the NQS model HiSIM 1, rapid increase turns to constant increase in the vicinity of about 7 ps, and the constant increase turns to the rapid decrease in the vicinity of about 17 ps. However, in the two-dimensional simulation, smooth increase and decrease are shown in each time. The following causes are supposed. In general, the carrier density distribution by the two-dimensional simulation at a turn-off time is set to upward rounded distribution. On the other hand, the NQS model HiSIM 1 of the present embodiment was approximated as a distribution in which the electric charge density of a source end was linearly connected to that of a drain end. Accordingly, the channel charge amount of the upward rounded distribution has a value larger than that of the linearly approximated channel charge amount. Therefore, as to the change amount of the channel charge from the next time step, a linearly approximated amount, that is, the charge amount of the NQS model HiSIM 1 of the present embodiment appears as a large amount, and it is considered that the rapid change is indicated. It has been seen from the above-described considerations that appropriate approximation should be applied in a case where various carrier density distributions largely appearing with respect to turn-off deviate from linear approximation.

As described above, according to the fourth embodiment, effects similar to those of the first to third embodiments can be obtained. According to the NQS simulation model HiSIM 1 of the present embodiment, and the simulation apparatus 2 and simulation method using this HiSIM 1, precisions in analyzing the behaviors of the carrier 4 in the source 5, drain 6, and channel 8 of the transistor 2 including not only the stationary state but also the transient state can be enhanced. Moreover, a possibility that the time required for predicting or reproducing the operation of the semiconductor device 3 increases can be almost eliminated. Therefore, the operation of the semiconductor device 3 can be simulated quickly within a practically allowable time and with a high precision.

Moreover, it has been confirmed that the simulation result of the NQS simulation model HiSIM 1 of the present embodiment matches that of the two-dimensional simulation which is high-precision numerical simulation very well. Especially, in the NQS simulation model HiSIM 1 of the present embodiment, the high-precision simulation result can be analytically derived within the practically sufficiently allowable time.

Thus, according to the NQS simulation model HiSIM 1 of the present embodiment, the carrier density distribution satisfying the current continuity equation and the current density equation was modeled, and combined with the carrier running delay, and accordingly it was possible to first clarify that the transient phenomenon of the MOSFET 2 could be represented by an analytical equation. It was also possible to clarify the carrier delay to be considered concerning the carrier running of the MOSFET 2. This is expected to be remarkably effectively utilized as an index in designing a fine device or a circuit in future. Furthermore, it has been confirmed that the NQS simulation model HiSIM 1 of the present embodiment is sufficiently usable in transient analysis of a high-speed circuit, when incorporated into the general circuit simulator SPICE 3.

Fifth Embodiment

Figure 39:
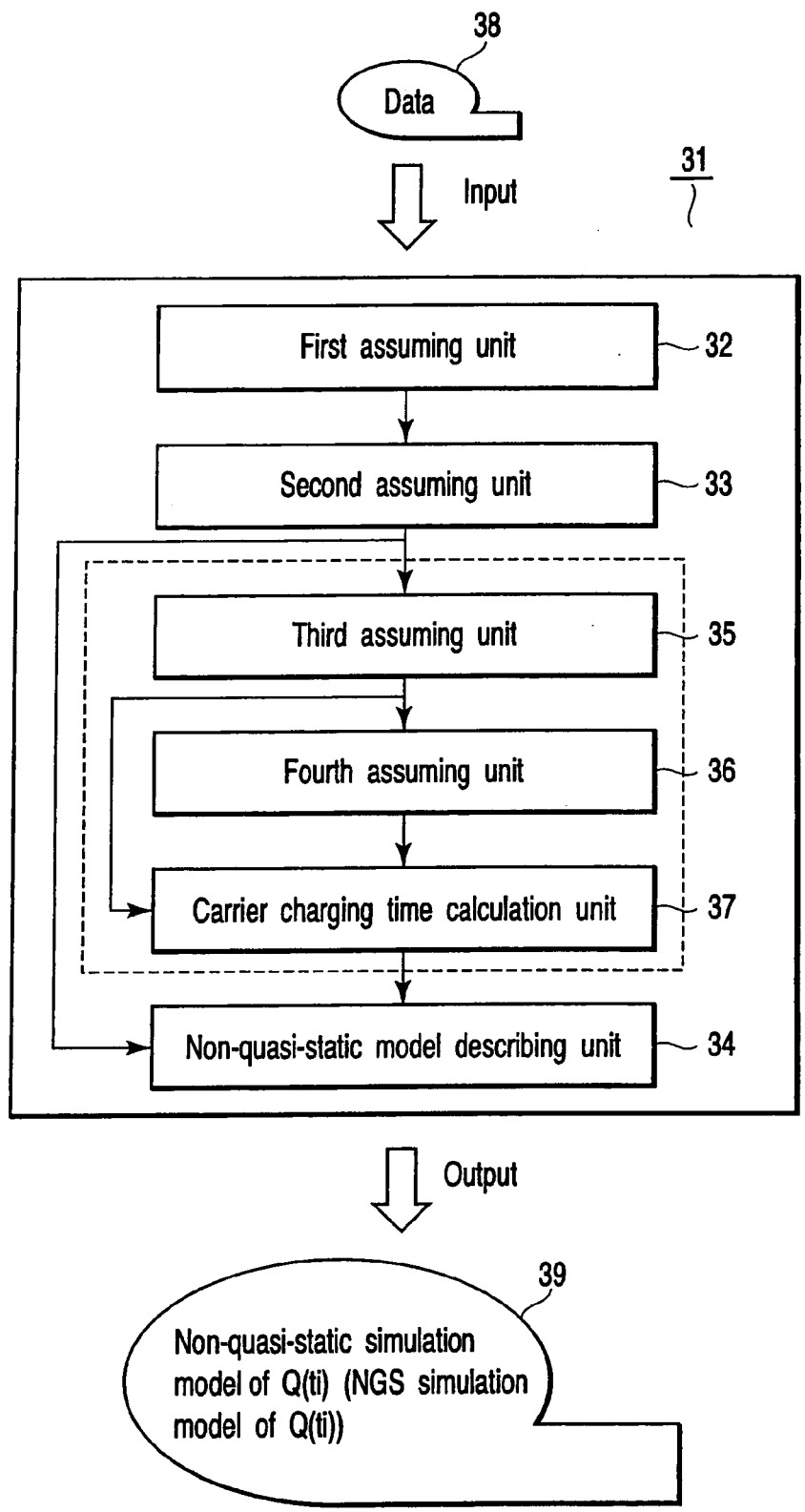
FIG. 39 is a block diagram simplifying and schematically showing another simulation apparatus for designing the semiconductor device according to the fifth embodiment.
Figure 40:
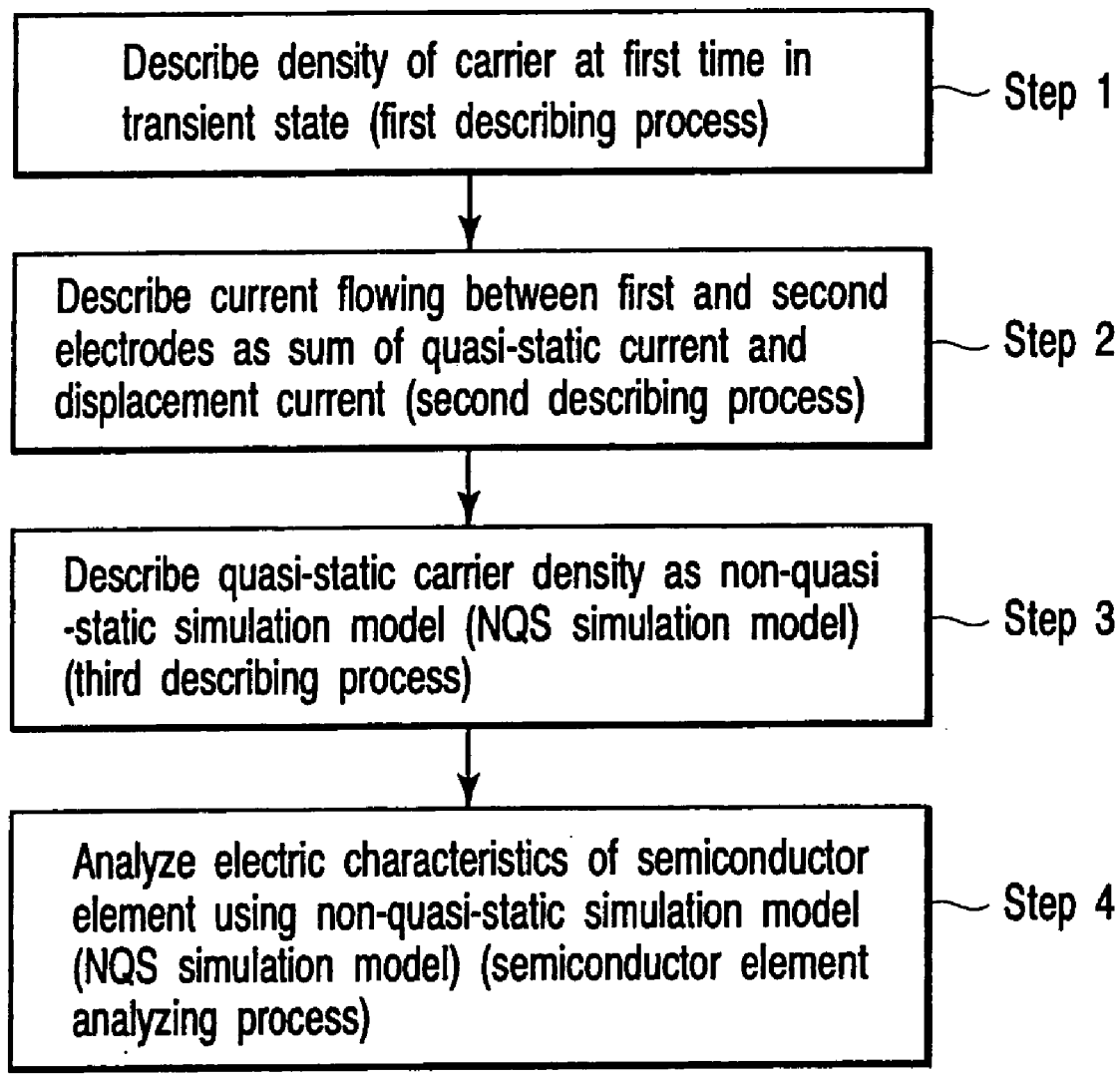
FIG. 40 is a flowchart schematically showing a simulation method for designing the semiconductor device according to the fifth embodiment.
Figure 41:
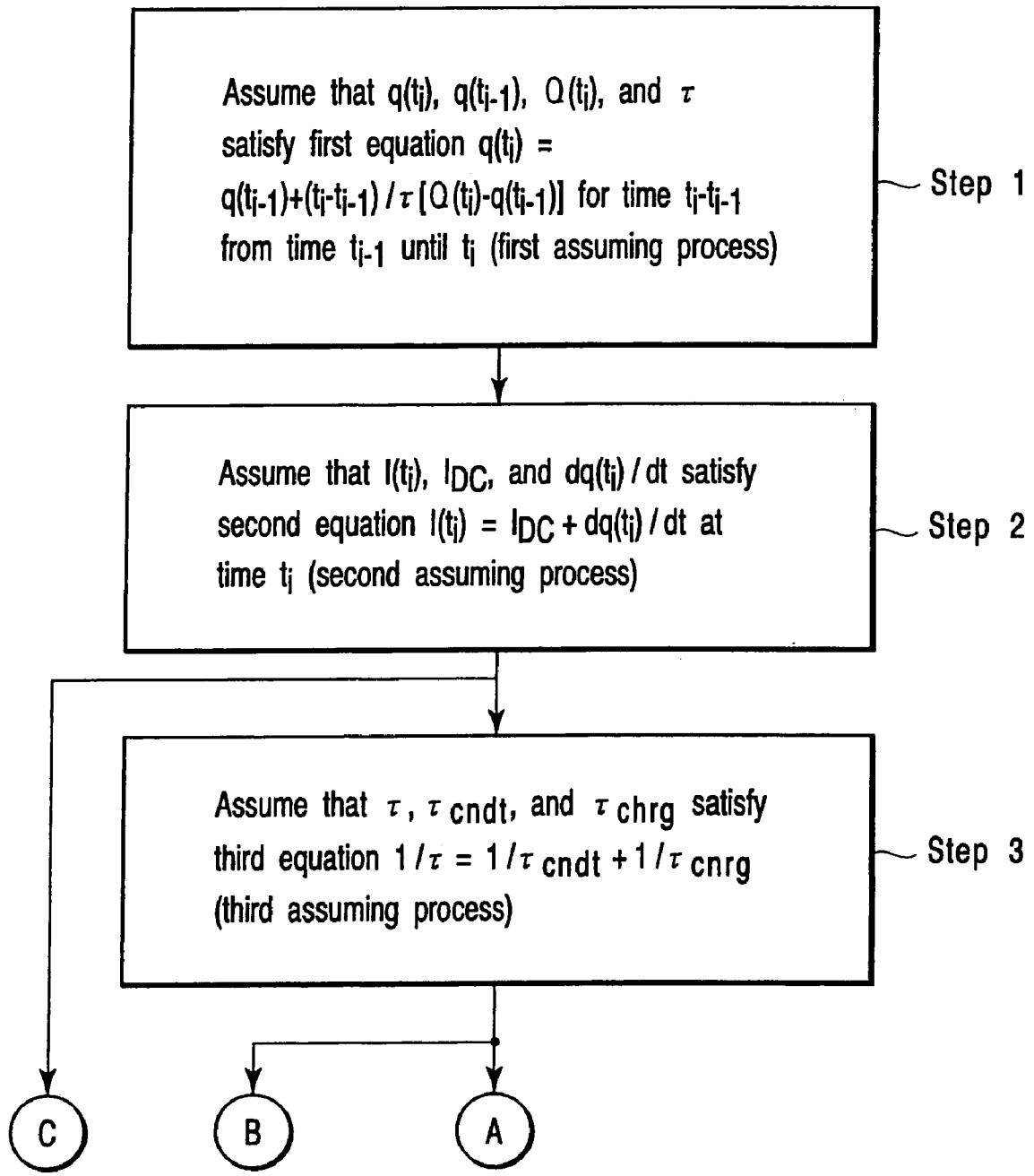
FIG. 41 is a flowchart schematically showing another simulation method for designing the semiconductor device according to the fifth embodiment.
Figure 42:
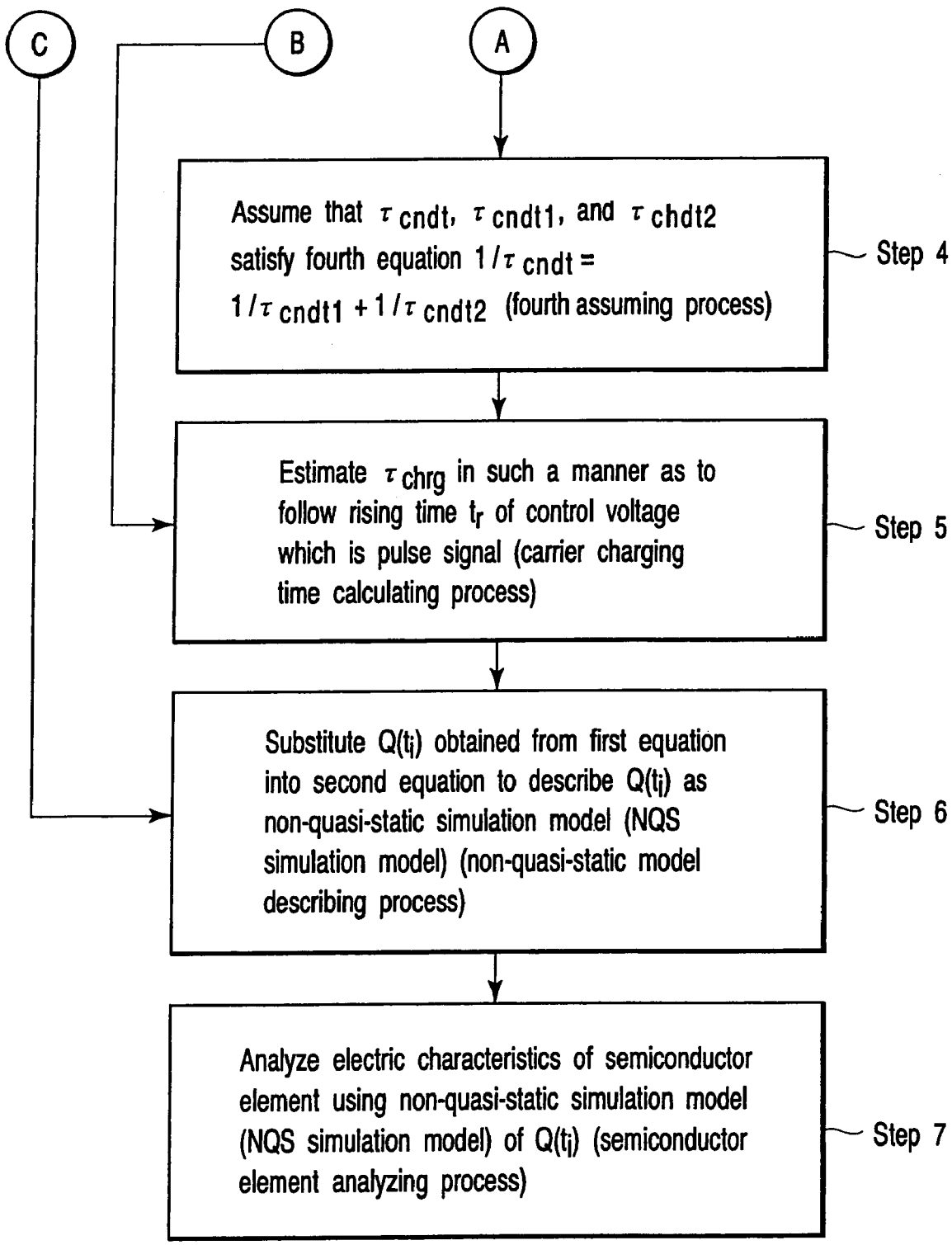
FIG. 42 is a flowchart continued from FIG. 41, schematically showing the simulation method for designing the semiconductor device according to the fifth embodiment.

Next, a fifth embodiment of the present invention will be described with reference to FIGS. 38 to 42. FIG. 38 is a block diagram simplifying and schematically showing a simulation apparatus for designing a semiconductor device according to the present embodiment. FIG. 39 is a block diagram simplifying and schematically showing another simulation apparatus for designing the semiconductor device according to the present embodiment. FIG. 40 is a flowchart schematically showing a simulation method for designing the semiconductor device according to the present embodiment. FIG. 41 is a flowchart schematically showing another simulation method for designing the semiconductor device according to the present embodiment. FIG. 42 is a flowchart continued from FIG. 41, schematically showing the simulation method for designing the semiconductor device according to the present embodiment. It is to be noted that the same components as those of the first to fourth embodiments are denoted with the same reference numerals, and detailed description is omitted.

In the present embodiment, the simulation apparatus and simulation method for designing the semiconductor device according to the present invention will be described from viewpoints different from those of the fourth embodiment.

First, a simulation apparatus 21 for designing the semiconductor device, shown in FIG. 38, (simulator for designing the semiconductor device, simulation system for designing the semiconductor device) will be described. This simulation apparatus 21 for designing the semiconductor device will be referred to also as the NQS simulation apparatus for the MOSFET (non-quasi-static simulation apparatus, simulation apparatus for designing the semiconductor element, simulation apparatus for designing the semiconductor circuit). As shown in FIG. 38, the simulation apparatus 21 comprises a first describing unit 22, a second describing unit 23, and a third describing unit 24.

When various data 25 concerning a semiconductor element 2 (semiconductor device 3) to be simulated are input into the simulation apparatus 21, these input data 25 are first processed in the first describing unit 22. The first describing unit 22 adds at least a part of a difference between a density of a carrier 4 described in a quasi-static manner with respect to a voltage applied between a first electrode 5 and a second electrode 6 at a predetermined first time and a density of the carrier 4 described in a transient state at a predetermined second time before the first time to the density of the carrier 4 described in the transient state at the second time in accordance with a delay by the running of the carrier 4 between the first electrode 5 and the second electrode 6 from the first time until the second time with respect to at least one semiconductor element 2 having at least two first and second electrodes 5, 6. Accordingly, the unit describes the density of the carrier 4 at the first time in the transient state.

Next, the second describing unit 23 describes a current flowing between the first electrode 5 and the second electrode 6 as a sum of a current flowing between the first electrode 5 and the second electrode 6 in the quasi-static manner, and a displacement current which is a ratio of a change of the quasi-static density of the carrier 4 with time between the first electrode 5 and the second electrodes 6.

Next, the third describing unit 24 assumes that the density of the carrier 4 in the transient state satisfies the current flowing between the first electrode 5 and the second electrode 6 to thereby describe the quasi-static density of the carrier 4 as a non-quasi-static model (NQS model).

Moreover, the simulation apparatus 21 outputs the density of the carrier 4 described as the non-quasi-static simulation model (NQS simulation model) in the third describing unit 24 as output data 26.

Next, a simulation apparatus 31 for designing another semiconductor device, shown in FIG. 39, (simulator for designing the semiconductor device, simulation system for designing the semiconductor device) will be described. This simulation apparatus 31 for designing the semiconductor device will be referred to also as the NQS simulation apparatus for the MOSFET (non-quasi-static simulation apparatus, simulation apparatus for designing the semiconductor element, simulation apparatus for designing the semiconductor circuit) in the same manner as in the simulation apparatus 21 for designing the semiconductor device, shown in FIG. 38. As shown in FIG. 39, the simulation apparatus 31 comprises a first assuming unit 32, a second assuming unit 33, and a non-quasi-static model describing unit 34. A third assuming unit 35, a fourth assuming unit 36, and a carrier charging time calculation unit 37 are disposed between the second assuming unit 33 and the non-quasi-static model describing unit 34.

When various data 38 concerning a semiconductor element 2 (semiconductor device 3) to be simulated are input into the simulation apparatus 31, these input data 38 are first processed in the first assuming unit 32. The first assuming unit 32 assumes that a transient density at a predetermined time $t_i$ including a delay of the carrier 4 running between the first electrode 5 and the second electrode 6 is $q(t_i)$ with respect to at least one semiconductor element 2 having at least two first and second electrodes 5, 6. The unit also assumes that a transient density of the carrier 4 at a predetermined time $t_{i-1}$ before the time $t_i$ is $q(t_{i-1})$. The unit also assumes that a density of the carrier 4 between the first electrode 5 and the second electrode 6 in a quasi-static state assumed at the time $t_i$ is $Q(t_i)$. The unit further assumes that a time required for the carrier 4 to reach the other electrode from one of the first electrode 5 and the second electrode 6 is $\tau$. Moreover, the unit assumes that $q(t_i)$, $q(t_{i-1})$, $Q(t_i)$, and $\tau$ satisfy the following first equation for a time $(t_i - t_{i-1})$ from the time $t_{i-1}$ until the time $t_i$: $q(t_i) = q(t_{i-1}) + (t_i - t_{i-1})/\tau[Q(t_i) - q(t_{i-1})]$.

$$q(t_i) = q(t_{i-1}) + \frac{t_i - t_{i-1}}{\tau}[Q(t_i) - q(t_{i-1})] \quad \text{(the first equation)}$$

Next, the second assuming unit 33 assumes that a current flowing between the first electrode 5 and the second electrode 6 at the time $t_i$ is $I(t_i)$. The unit also assumes that a quasi-static conduction current between the first electrode 5 and the second electrode 6, determined by the voltage applied at the time $t_i$, is $I_{DC}$. The unit further assumes that a displacement current flowing between the first electrode 5 and the second electrode 6 is $dq(t_i)/dt$. Moreover, the unit assumes that $I(t_i)$, $I_{DC}$, and $dq(t_i)/dt$ satisfy the following second equation at $t_i$: $I(t_i) = I_{DC} + dq(t_i)/dt$.

$$I(t_i) = I_{DC} + \frac{dq(t_i)}{dt} \quad \text{(the second equation)}$$

Next, the third assuming unit 35 assumes that a time required until the head of the carrier 4 reaches the other electrode from one of the first electrode 5 and the second electrode 6 is $\tau_{cndt}$. The unit also assumes that a time required until the carrier 4 is charged between the first electrode 5 and the second electrode 6 from one of the first electrode 5 and the second electrode 6 is $\tau_{chrg}$, and $\tau$, $\tau_{cndt}$, and $\tau_{chrg}$ satisfy the following third equation: $1/\tau = 1/\tau_{cndt} + 1/\tau_{chrg}$.

$$\frac{1}{\tau} = \frac{1}{\tau_{cndt}} + \frac{1}{\tau_{chrg}} \quad \text{(the third equation)}$$

Next, the fourth assuming unit 36 assumes that a time required until the head of the carrier 4 charged between the first electrode 5 and the second electrode 6 from one of the first electrode 5 and the second electrode 6 reaches the other electrode from one of the first electrode 5 and the second electrode 6 is $\tau_{cndt1}$ in a state in which a conductive region 8 capable of passing the carrier 4 is not formed between the first electrode 5 and the second electrode 6. The unit also assumes that a time required until the carrier 4 charged between the first electrode 5 and the second electrode 6 from one of the first electrode 5 and the second electrode 6 moves to the other electrode from one of the first electrode 5 and the second electrode 6 is $\tau_{cndt2}$ in a state in which the carrier 4 fills between the first electrode 5 and the second electrode 6 to form the conductive region 8. Moreover, the unit assumes that $\tau_{cndt}$, $\tau_{cndt1}$, and $\tau_{cndt2}$ satisfy the following fourth equation: $1/\tau_{cndt}=1/\tau_{cndt1}+1/\tau_{cndt2}$.

$$\frac{1}{\tau_{cndt}(t_i)} = \frac{1}{\tau_{cndt1}(t_i)} + \frac{1}{\tau_{cndt2}(t_i)} \quad \text{(the fourth equation)}$$

Next, the carrier charging time calculation unit 37 receives the result of at least one of the third assuming unit 35 and the fourth assuming unit 36 to estimate $\tau_{chrg}$ in such a manner as to follow a rising time $t_r$ of a control voltage which is a pulse signal applied to a third electrode 7 of the semiconductor element 2.

Next, the non-quasi-static model describing unit 34 receives the result of at least one of the second assuming unit 33 and the carrier charging time calculation unit 37, and substitutes $q(t_i)$ obtained from the first equation into the second equation to thereby describe $Q(t_i)$ as a non-quasi-static model (NQS model).

Moreover, the simulation apparatus 31 outputs the density $Q(t_i)$ of the carrier 4 described as the non-quasi-static simulation model (NQS simulation model) in the non-quasi-static model describing unit 34 as output data 39.

It is to be noted that in the simulation apparatus 31, the third assuming unit 35, fourth assuming unit 36, and carrier charging time calculation unit 37 surrounded with a broken line shown in FIG. 39 may not be disposed. Alternatively, the third assuming unit 35, fourth assuming unit 36, and carrier charging time calculation unit 37 do not have to be operated. That is, the result (output) of the second assuming unit 33 may be input directly into the non-quasi-static model describing unit 34 and processed without being input into the third assuming unit 35, fourth assuming unit 36, or carrier charging time calculation unit 37. In the simulation apparatus 31, the only fourth assuming unit 36 may not have to be disposed among the third assuming unit 35, fourth assuming unit 36, and carrier charging time calculation unit 37 surrounded with the broken line shown in FIG. 39. Alternatively, the only fourth assuming unit 36 may not be operated. That is, the result (output) of the third assuming unit 35 may be input directly into the carrier charging time calculation unit 37 and processed without being input into the fourth assuming unit 36.

Next, a simulation method for designing a semiconductor device, shown in FIG. 40, will be described. First, with respect to at least one semiconductor element 2 having at least two first and second electrodes 5, 6, at least a part of a difference between a density of a carrier 4 described in a quasi-static manner with respect to a voltage applied between the first electrode 5 and the second electrode 6 at a predetermined first time and a density of the carrier 4 described in a transient state at a predetermined second time before the first time is added to the density of the carrier 4 described in the transient state at the second time in accordance with a delay by the running of the carrier 4 between the first time and the second time. Accordingly, the density of the carrier 4 at the first time is described in the transient state. That is, a first describing process is performed. This is referred to as Step 1.

Next, a current flowing between the first electrode 5 and the second electrode 6 is described as a sum of a current flowing between the first electrode 5 and the second electrode 6 in the quasi-static manner, and a displacement current which is a ratio of a change of the quasi-static density of the carrier 4 with time between the first electrode 5 and the second electrodes 6. That is, a second describing process is performed. This is referred to as Step 2.

Next, assuming that the quasi-static density of the carrier 4 satisfies the current flowing between the first electrode 5 and the second electrode 6, the quasi-static density of the carrier 4 is described as a non-quasi-static model (NQS model). That is, a third describing process is performed. This is referred to as Step 3.

Moreover, electric characteristics of the semiconductor element 2 are analyzed using the non-quasi-static simulation model (NQS simulation model) obtained in Step 3. That is, an analyzing process of the semiconductor element 2 is performed. This is referred to as Step 4.

It is assumed here that the simulation method for designing the semiconductor device, shown in FIG. 40, ends.

Next, a simulation method for designing a semiconductor device, shown in FIGS. 41 and 42 will be described. First, as shown in FIG. 41, it is first assumed that a transient density at a predetermined time $t_i$ including a delay of the carrier 4 running between the first electrode 5 and the second electrode 6 is $q(t_i)$ with respect to at least one semiconductor element 2 having at least two first and second electrodes 5, 6. It is also assumed that a transient density of the carrier 4 at a predetermined time $t_{i-1}$ before the time $t_i$ is $q(t_{i-1})$. It is also assumed that a density of the carrier 4 between the first electrode 5 and the second electrode 6 in a quasi-static state assumed at the time $t_i$ is $Q(t_i)$. It is further assumed that a time required for the carrier 4 to reach the other electrode from one of the first electrode 5 and the second electrode 6 is $\tau$. Moreover, it is assumed that $q(t_i)$, $q(t_{i-1})$, $Q(t_i)$, and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$. That is, a first assuming process is performed. This is referred to as Step 1.

Next, it is assumed that a current flowing between the first electrode 5 and the second electrode 6 at the time $t_i$ is $I(t_i)$. It is also assumed that a conduction current flowing between the first electrode 5 and the second electrode 6 in a quasi-static manner, determined by the voltage applied at the time $t_i$, is $I_{DC}$. It is further assumed that a displacement current flowing between the first electrode 5 and the second electrode 6 is $dq(t_i)/dt$. Moreover, it is assumed that $I(t_i)$, $I_{DC}$, and $dq(t_i)/dt$ satisfy the following second equation at $t_i$: $I(t_i)=I_{DC}+dq(t_i)/dt$. That is, a second assuming process is performed. This is referred to as Step 2.

Next, as shown in FIG. 41, two paths can be selected as post steps of Step 2. Here, the process advances to Step 3 after Step 2. In Step 3, it is assumed that a time required until the head of the carrier 4 reaches the other electrode from one of the first electrode 5 and the second electrode 6 is $\tau_{cndt}$. It is also assumed that a time required until the carrier 4 is charged between the first electrode 5 and the second electrode 6 from one of the first electrode 5 and the second electrode 6 is $\tau_{chrg}$, and $\tau$, $\tau_{cndt}$, and $\tau_{chrg}$ satisfy the following third equation: $1/\tau=1/\tau_{cndt}+1/\tau_{chrg}$. That is, a third assuming process is performed. This is referred to as Step 3.

Next, as shown in FIG. 41, two paths can be selected as post steps of Step 3. Here, the process advances to Step 4 shown in FIG. 42 after Step 3. In Step 4, as shown in FIG. 42, it is assumed that a time required until the head of the carrier 4 charged between the first electrode 5 and the second electrode 6 from one of the first electrode 5 and the second electrode 6 reaches the other electrode from one of the first electrode 5 and the second electrode 6 is $\tau_{cndt1}$ in a state in which a conductive region 8 capable of passing the carrier 4 is not formed between the first electrode 5 and the second electrode 6. It is also assumed that a time required until the carrier 4 charged between the first electrode 5 and the second electrode 6 from one of the first electrode 5 and the second electrode 6 moves to the other electrode from one of the first electrode 5 and the second electrode 6 is $\tau_{cndt2}$ in a state in which the carrier 4 fills between the first electrode 5 and the second electrode 6 to form the conductive region 8. Moreover, it is assumed that $\tau_{cndt}$, $\tau_{cndt1}$, and $\tau_{cndt2}$ satisfy the following fourth equation: $1/\tau_{cndt}=1/\tau_{cndt1}+1/\tau_{cndt2}$. That is, a fourth assuming process is performed. This is referred to as Step 4.

Next, $\tau_{chrg}$ is estimated in such a manner as to follow a rising time $t_r$ of a control voltage which is a pulse signal applied to a third electrode 7 of the semiconductor element 2. That is, a carrier charging time calculating process is performed. This is referred to as Step 5. It is to be noted that path B shown in FIGS. 41 and 42 is selected, and the process advances directly to Step 5 from Step 3 without performing Step 4.

Next, $q(t_i)$ obtained from the first equation is substituted into the second equation to thereby describe $Q(t_i)$ as a non-quasi-static simulation model (NQS simulation model). That is, a non-quasi-static model describing process is performed. This is referred to as Step 6. It is to be noted that path C shown in FIGS. 41 and 42 is selected, and the process may advance directly to Step 6 from Step 2 without performing Step 3, 4, or 5.

Moreover, electric characteristics of the semiconductor element 2 are analyzed using the non-quasi-static simulation model (NQS simulation model) obtained in Step 6. That is, an analyzing process of the semiconductor element 2 is performed. This is referred to as Step 7.

It is assumed here that the simulation method for designing the semiconductor device, shown in FIGS. 41 and 42, ends.

As described above, according to the fifth embodiment, an effect similar to that of the fourth embodiment can be obtained. That is, the operation of the semiconductor element 2 can be simulated quickly within a practically allowable time regardless of a high/low operation speed and with a high precision.

Sixth Embodiment

Figure 43:
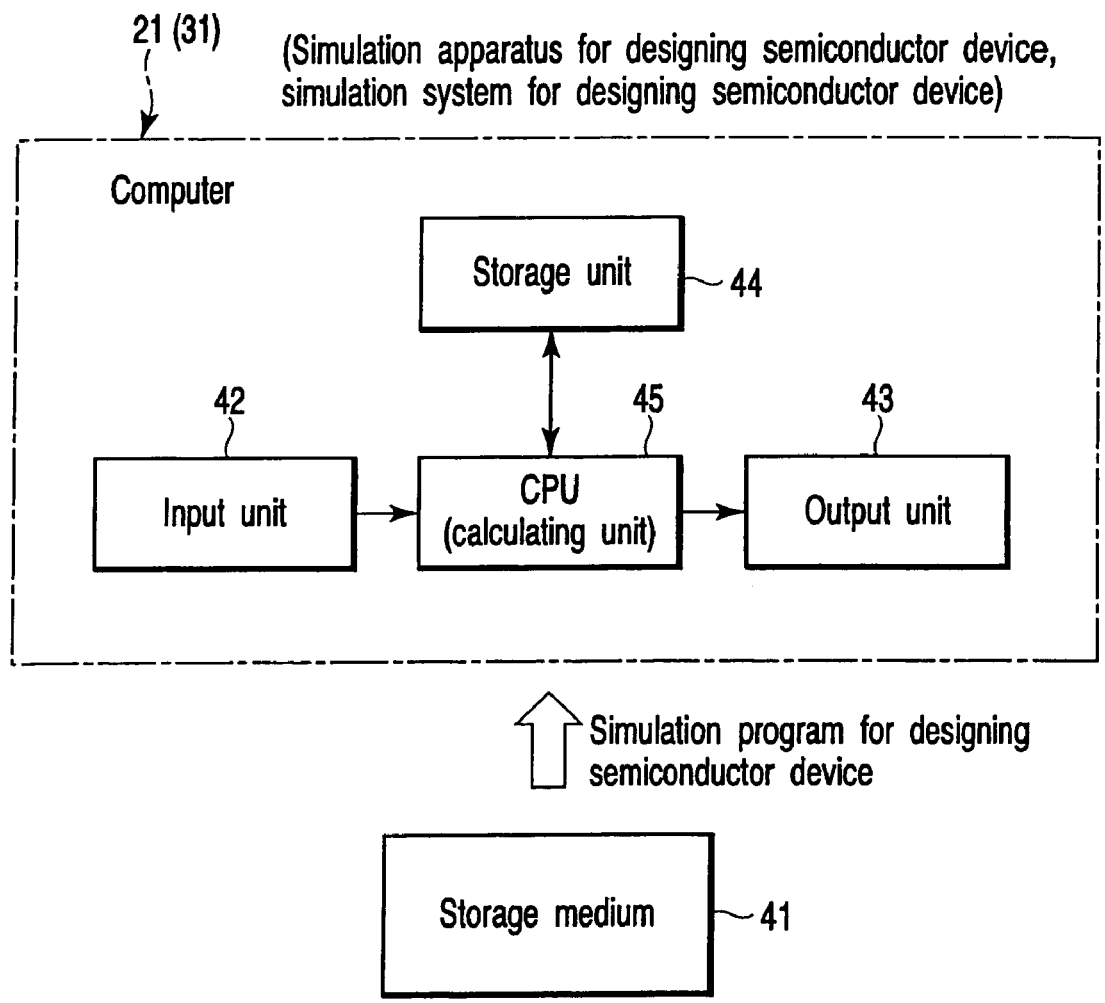
FIG. 43 is a block diagram schematically showing a relation between a simulation program for designing the semiconductor device and a computer-readable recording medium in which the program is recorded, and a computer according to a sixth embodiment.

Next, a sixth embodiment according to the present invention will be described with reference to FIG. 43. FIG. 43 is a block diagram schematically showing a relation between a simulation program for designing a semiconductor device and a computer-readable recording medium in which the program is recorded, and a computer according to the present embodiment. It is to be noted that the same components as those of the first to fifth embodiments are denoted with the same reference numerals, and detailed description is omitted.

In the present embodiment, the simulation program for designing the semiconductor device, for operating and controlling the simulation apparatus for designing the semiconductor device in the fifth embodiment, or executing the simulation method for designing the semiconductor device in the fifth embodiment, and the computer-readable recording medium in which the program is recorded will be described hereinafter in detail.

In the present embodiment, a relation between a\the simulation program for designing the semiconductor device according to the present embodiment and a computer-readable recording medium 41 in which the program is recorded, and a computer 21 (31) will be described mainly with reference to FIG. 43.

The simulation program for designing the semiconductor device and the recording medium 41 according to the present embodiment allow the computer 21 to execute the simulation method for designing the semiconductor device, shown in FIG. 41. More concretely, the simulation program for designing the semiconductor device and the recording medium 41 according to the present embodiment operate the simulation apparatus 21 for designing the semiconductor device (simulation system for designing the semiconductor device), shown in FIG. 38, which is the computer, and control the operation. Accordingly, the simulation method for designing the semiconductor device, shown in FIG. 40, is realized. Alternatively, the simulation program for designing the semiconductor device and the recording medium 41 allows the computer 31 to execute the simulation method for designing the semiconductor device, shown in FIGS. 41 and 42. More concretely, the simulation program for designing the semiconductor device and the recording medium 41 according to the present embodiment operate the simulation apparatus 31 for designing the semiconductor device (simulation system for designing the semiconductor device), shown in FIG. 39, which is the computer, and control the operation. Accordingly, the simulation method for designing the semiconductor device, shown in FIGS. 41 and 42, is realized.

That is, the simulation apparatus 21 or 31 for designing the semiconductor device (simulation system for designing the semiconductor device) is also realized as the computer 21 or 31 whose operation is controlled by a pattern correction program recorded in and read from the recording medium 41, for example, a magnetic disk, an optical disk, or a semiconductor memory. As described above, the simulation method for designing the semiconductor device, including Steps 1 to 4 shown in FIG. 40, and the simulation method for designing the semiconductor device, including Steps 1 to 7 shown in FIGS. 41 and 42 are data processing steps substantially all processable by the computer 21 or 31. Therefore, the simulation apparatus (simulation system) 21 or 31 itself, for executing each simulation method, can be regarded as the computer 21 or 31 which is operated and controlled by the simulation program recorded in and read from the recording medium 41. The simulation apparatus (simulation system) 21 or 31 itself surrounded with a broken line shown in FIG. 43 will be regarded as the computer 21 or 31, and described hereinafter.

Moreover, in FIG. 43, for simplicity, data input units disposed in the respective simulation apparatuses (simulation systems) 21, 31 are integrated and shown simply as an input unit 42 of the computer 21 or 31. Moreover, data input units of the first describing unit 22, second describing unit 23, third describing unit 24, first assuming unit 32, second assuming unit 33, non-quasi-static model describing unit 34, third assuming unit 35, fourth assuming unit 36, and carrier charging time calculation unit 37 disposed in the respective simulation apparatuses 21, 31 are also integrated and shown simply as the input unit 42 of the computer 21 or 31.

Similarly, data output units disposed in the respective simulation apparatuses 21, 31 are integrated and shown simply as an output unit 43 of the computer 21 or 31. Moreover, data output units of the first describing unit 22, second describing unit 23, third describing unit 24, first assuming unit 32, second assuming unit 33, non-quasi-static model describing unit 34, third assuming unit 35, fourth assuming unit 36, and carrier charging time calculation unit 37 disposed in the respective simulation apparatuses 21, 31 are also integrated and shown simply as the output unit 43 of the computer 21 or 31.

Moreover, similarly, storage units disposed in the respective simulation apparatuses 21, 31 to store the simulation program and the like read from the recording medium 41 by the respective simulation apparatuses 21, 31 are integrated and shown simply as a storage unit 44 of the computer 21 or 31. Moreover, storage units of the first describing unit 22, second describing unit 23, third describing unit 24, first assuming unit 32, second assuming unit 33, non-quasi-static model describing unit 34, third assuming unit 35, fourth assuming unit 36, and carrier charging time calculation unit 37 disposed in the respective simulation apparatuses 21, 31 are also integrated and shown simply as the storage unit 44 of the computer 21 or 31.

Furthermore, calculating units disposed in the respective simulation apparatuses 21, 31 to calculate and execute the simulation program and the like read from the recording medium 41 by the respective simulation apparatuses 21, 31 are integrated and shown simply as a calculating unit (program executing unit, data processing unit, CPU) 45 of the computer 21 or 31. Moreover, calculating units of the first describing unit 22, second describing unit 23, third describing unit 24, first assuming unit 32, second assuming unit 33, non-quasi-static model describing unit 34, third assuming unit 35, fourth assuming unit 36, and carrier charging time calculation unit 37 disposed in the respective simulation apparatuses 21, 31 are also integrated and shown simply as the calculating unit (program executing unit, data processing unit, CPU) 45 of the computer 21 or 31.

First, a case where the simulation method for designing the semiconductor device, shown in FIG. 40, is executed by the simulation apparatus 21 for designing the semiconductor device, shown in FIG. 38, (simulation system for designing the semiconductor device, computer) will be described.

First, as shown by a white arrow in FIG. 43, the simulation program for designing the semiconductor device, recorded in the recording medium 41, is read by the computer 21. Concretely, the CPU 45 of the computer 21 is allowed to read the simulation program for designing the semiconductor device, recorded in the recording medium 41, via the input unit 42 of the computer 21. The simulation program for designing the semiconductor device, read by the CPU 45, is sent to the storage unit 44 of the computer 21 from the CPU 45, and stored. The various data 25 of the semiconductor element (MOSFET) 2 is input into the storage unit 44 of the computer 21 via the input unit 42, and stored.

The CPU 45 executes simulation for designing the semiconductor device based on the simulation program for designing the semiconductor device and each input data 25 stored in the storage unit 44.

First, when the various data 25 concerning the semiconductor element 2 (semiconductor device 3) to be simulated is input into the input unit 42 of the computer 21, the CPU 45 (program) allows the first describing unit 22 to execute the processing of the input data 25. Concretely, the CPU 45 allows the first describing unit 22 to execute a process of adding at least a part of a difference between a density of a carrier 4 described in a quasi-static manner with respect to a voltage applied between a first electrode 5 and a second electrode 6 at a predetermined first time and a density of the carrier 4 described in a transient state at a predetermined second time before the first time to the density of the carrier 4 described in the transient state at the second time in accordance with a delay by the running of the carrier 4 between the first time and the second time with respect to at least one semiconductor element 2 having at least two first and second electrodes 5, 6. Accordingly, the density of the carrier 4 at the first time is described in the transient state. That is, the CPU 45 (program) allows the first describing unit 22 in FIG. 38 to execute a first describing process corresponding to Step 1 in FIG. 40.

Next, the CPU 45 allows the second describing unit 23 to execute a process of describing a current flowing between the first electrode 5 and the second electrode 6 as a sum of a current flowing between the first electrode 5 and the second electrode 6 in the quasi-static manner, and a displacement current which is a ratio of a change of the quasi-static density of the carrier 4 with time between the first electrode 5 and the second electrodes 6. That is, the CPU 45 (program) allows the second describing unit 23 in FIG. 38 to execute a second describing process corresponding to Step 2 in FIG. 40.

Next, the CPU 45 allows the third describing unit 24 to execute a process of assuming that the quasi-static density of the carrier 4 satisfies the current flowing between the first electrode 5 and the second electrode 6 to thereby describe the quasi-static density of the carrier 4 as a non-quasi-static simulation model (NQS simulation model). That is, the CPU 45 (program) allows the third describing unit 24 in FIG. 38 to execute a third describing process corresponding to Step 3 in FIG. 40.

Next, the CPU 45 allows an analyzing unit (not shown) to execute a process of analyzing electric characteristics of the semiconductor element 2 using the non-quasi-static simulation model (NQS simulation model) obtained in Step 3. That is, the CPU 45 (program) allows the analyzing unit (not shown) disposed in the simulation apparatus (computer) 21 for designing the semiconductor device to execute the process of analyzing the semiconductor element 2, corresponding to Step 4 in FIG. 40.

Moreover, the CPU 45 (program) sends (outputs) analysis results of the electric characteristics of the semiconductor element 2 obtained in Step 4 as the output data 26 to the output unit 43 of the computer 21. Concretely, by the CPU 45 (program), the analysis results of the electric characteristics of the semiconductor element 2 obtained in Step 4 are recorded in various recording mediums other than the recording medium 41, printed by a printing apparatus (not shown), or displayed in a display unit such as a display (not shown).

Here, it is assumed that the simulation method for designing the semiconductor device, shown in FIG. 40, ends using the simulation apparatus (computer) 21 for designing the semiconductor device, operated and controlled by the simulation program for designing the semiconductor device according to the present embodiment as shown in FIG. 38.

Next, a case where the simulation method for designing the semiconductor device, shown in FIGS. 41 and 42, is executed by the simulation apparatus 31 for designing the semiconductor device, shown in FIG. 39, (simulation system for designing the semiconductor device, computer) will be described.

First, as shown by a white arrow in FIG. 43, the simulation program for designing the semiconductor device, recorded in the recording medium 41, is read by the computer 31. Concretely, the CPU 45 of the computer 31 is allowed to read the simulation program for designing the semiconductor device, recorded in the recording medium 41, via the input unit 42 of the computer 31. The simulation program for designing the semiconductor device, read by the CPU 45, is sent to the storage unit 44 of the computer 31 from the CPU 45, and stored. The various data 38 of the semiconductor element (MOSFET) 2 is input into the storage unit 44 of the computer 31 via the input unit 42, and stored.

The CPU 45 executes simulation for designing the semiconductor device based on the simulation program for designing the semiconductor device and each input data 38 stored in the storage unit 44.

First, when the various data 38 concerning the semiconductor element 2 (semiconductor device 3) to be simulated is input into the input unit 42 of the computer 31, the CPU 45

(program) allows the first assuming unit 32 to execute the processing of the input data 38. Concretely, the CPU 45 allows the first assuming unit 32 to execute a process of assuming that a transient density at a predetermined time $t_i$ including a delay of the carrier 4 running between the first electrode 5 and the second electrode 6 is $q(t_i)$ with respect to at least one semiconductor element 2 having at least two first and second electrodes 5, 6. The CPU 45 allows the first assuming unit 32 to execute a process of assuming that a transient density of the carrier 4 at a predetermined time $t_{i-1}$ before the time $t_i$ is $q(t_{i-1})$. The CPU 45 allows the first assuming unit 32 to execute a process of assuming that a density of the carrier 4 between the first electrode 5 and the second electrode 6 in a quasi-static state assumed at the time $t_i$ is $Q(t_i)$. The CPU 45 further allows the first assuming unit 32 to execute a process of assuming that a time required for the carrier 4 to reach the other electrode from one of the first electrode 5 and the second electrode 6 is $\tau$. Moreover, the CPU 45 allows the first assuming unit 32 to execute a process of assuming that $q(t_i)$, $q(t_{i-1})$, $Q(t_i)$, and $\tau$ satisfy the following first equation for a time $(t_i - t_{i-1})$ from the time $t_{i-1}$ until the time $t_i$: $q(t_i) = q(t_{i-1}) + (t_i - t_{i-1})/\tau[Q(t_i) - q(t_{i-1})]$. That is, the CPU 45 (program) allows the first assuming unit 32 in FIG. 39 to execute a first assuming process corresponding to Step 1 in FIG. 41.

Next, the CPU 45 allows the second assuming unit 33 to execute a process of assuming that a current flowing between the first electrode 5 and the second electrode 6 at the time $t_i$ is $I(t_i)$. The CPU 45 also allows the second assuming unit 33 to execute a process of assuming that a quasi-static current flowing between the first electrode 5 and the second electrode 6, determined by the voltage applied at the time $t_i$, is $I_{DC}$. The CPU 45 further allows the second assuming unit 33 to execute a process of assuming that a displacement current flowing between the first electrode 5 and the second electrode 6 is $dq(t_i)/dt$. Moreover, the CPU 45 allows the second assuming unit 33 to execute a process of assuming that $I(t_i)$, $I_{DC}$, and $dq(t_i)/dt$ satisfy the following second equation at $t_i$: $I(t_i) = I_{DC} + dq(t_i)/dt$. That is, the CPU 45 (program) allows the second assuming unit 33 in FIG. 39 to execute a second assuming process corresponding to Step 2 in FIG. 41.

Next, as shown in FIG. 41, the CPU 45 (program) can select two paths as a post step of Step 2. Here, it is assumed that the process advances to Step 3 after Step 2.

In this case, the CPU 45 allows the third assuming unit 35 to execute a process of assuming that a time required until the head of the carrier 4 reaches the other electrode from one of the first electrode 5 and the second electrode 6 is $\tau_{cndt}$. The CPU 45 also allows the third assuming unit 35 to execute a process of assuming that a time required until the carrier 4 is charged between the first electrode 5 and the second electrode 6 from one of the first electrode 5 and the second electrode 6 is $\tau_{chrg}$, and $\tau$, $\tau_{cndt}$, and $\tau_{chrg}$ satisfy the following third equation: $1/\tau = 1/\tau_{cndt} + 1/\tau_{chrg}$. That is, the CPU 45 (program) allows the third assuming unit 35 in FIG. 39 to execute a third assuming process corresponding to Step 3 in FIG. 41.

Next, as shown in FIG. 41, the CPU 45 (program) can select two paths as post steps of Step 3. Here, it is assumed that the process advances to Step 4 shown in FIG. 42 after Step 3.

In this case, the CPU 45 allows the fourth assuming unit 36 to execute a process of assuming that a time required until the head of the carrier 4 charged between the first electrode 5 and the second electrode 6 reaches the other electrode from one of the first electrode 5 and the second electrode 6 is $\tau_{cndt1}$ in a state in which a conductive region 8 capable of passing the carrier 4 is not formed between the first electrode 5 and the second electrode 6. The CPU 45 also allows the fourth assuming unit 36 to execute a process of assuming that a time required until the carrier 4 charged between the first electrode 5 and the second electrode 6 from one of the first electrode 5 and the second electrode 6 moves to the other electrode from one of the first electrode 5 and the second electrode 6 is $\tau_{cndt2}$ in a state in which the carrier 4 fills between the first electrode 5 and the second electrode 6 to form the conductive region 8. Moreover, the CPU 45 allows the fourth assuming unit 36 to execute a process of assuming that $\tau_{cndt}$, $\tau_{cndt1}$ and $\tau_{cndt2}$ satisfy the following fourth equation: $1/\tau_{cndt} = 1/\tau_{cndt1} + 1/\tau_{cndt2}$. That is, the CPU 45 (program) allows the fourth assuming unit 36 in FIG. 39 to execute a fourth assuming process corresponding to Step 4 in FIG. 42.

Next, the CPU 45 allows the carrier charging time calculation unit 37 to execute a process of receiving the result (output) of the fourth assuming unit 36 to estimate $\tau_{chrg}$ in such a manner as to follow a rising time $t_r$ of a control voltage which is a pulse signal applied to a third electrode 7 of the semiconductor element 2. That is, the CPU 45 (program) allows the carrier charging time calculation unit 37 in FIG. 39 to execute a carrier charging time calculating process corresponding to Step 5 in FIG. 42. It is to be noted that path B shown in FIGS. 41 and 42 is selected, and Step 3 may directly advance to Step 5 without advancing to Step 4. That is, the CPU 45 (program) may allow the carrier charging time calculation unit 37 to directly process the processing result (output) of the third assuming unit 35 without allowing the fourth assuming unit 36 to process the result. In other words, the CPU 45 (program) may allow the carrier charging time calculation unit 37 to execute the process of Step 5 based on the processing result (output) of at least one of the third assuming unit 35 and the fourth assuming unit 36.

Next, the CPU 45 allows the non-quasi-static model describing unit 34 to execute a process of receiving the result of the carrier charging time calculation unit 37 and substituting $q(t_i)$ obtained from the first equation into the second equation to thereby describe $Q(t_i)$ as a non-quasi-static model (NQS model). That is, the CPU 45 (program) allows the non-quasi-static model describing unit 34 in FIG. 39 to execute a non-quasi-static model describing process corresponding to Step 6 in FIG. 42. It is to be noted that path C shown in FIGS. 41 and 42 is selected, and Step 2 may directly advance to Step 6 without shifting to Steps 3, 4, or 5. That is, the CPU 45 (program) may allow the non-quasi-static model describing unit 34 to directly process the processing result (output) of the second assuming unit 33 without allowing the third assuming unit 35, fourth assuming unit 36, and carrier charging time calculation unit 37 to process the result. In other words, the CPU 45 (program) may allow the non-quasi-static model describing unit 34 to execute the process of Step 6 based on the processing result (output) of at least one of the second assuming unit 33 and the carrier charging time calculation unit 37.

Next, the CPU 45 allows an analyzing unit (not shown) to execute a process of analyzing electric characteristics of the semiconductor element 2 using the density $Q(t_i)$ of the carrier 4, described as a non-quasi-static model (NQS model) obtained in Step 6. That is, the CPU 45 (program) allows the analyzing unit (not shown) disposed in the simulation apparatus (computer) 31 for designing the semiconductor device to execute the process of analyzing the semiconductor element 2, corresponding to Step 7 in FIG. 42.

Moreover, the CPU 45 (program) sends (outputs) analysis results of the electric characteristics of the semiconductor element 2 obtained in Step 7 as the output data 39 to the output unit 43 of the computer 31. Concretely, by the CPU 45 (program), the analysis results of the electric characteristics of the semiconductor element 2 obtained in Step 7 are recorded in various recording mediums other than the recording medium 41, printed by a printing apparatus (not shown), or displayed in a display unit such as a display (not shown).

Here, it is assumed that the simulation method for designing the semiconductor device, shown in FIGS. 41 and 42, ends using the simulation apparatus (computer) 31 for designing the semiconductor device, operated and controlled by the simulation program for designing the semiconductor device according to the present embodiment as shown in FIG. 39.

As described above, according to the sixth embodiment, effects similar to those of the fourth and fifth embodiments can be obtained. That is, the operation of the semiconductor element 2 can be simulated quickly within a practically allowable time regardless of a high/low operation speed and with a high precision.

It is to be noted that as the program executable by the computer (simulation apparatus for designing the semiconductor device, simulation system for designing the semiconductor device) 21, 31, the technique described in the present embodiment may be written into magnetic disks such as a flexible disk and a hard disk, optical disks such as CD, DVD, and MO, or the recording medium 41 including a semiconductor memory, and applied to various devices, or transmitted via a communication medium and applied to various devices. The computer 21 or 31 which realizes the simulation apparatus 21 or 31 for designing the semiconductor device (simulation system for designing the semiconductor device) executes the above-described process, when the simulation program for designing the semiconductor device, recorded in various types of recording mediums 41, and the operation is controlled by the simulation program for designing the semiconductor device.

Moreover, also in the storage unit 44 of the computer 21 or 31, a recording medium (storage device) capable of appropriately writing (updating) data or program recorded therein is preferably used, for example, magnetic disks such as a flexible disk and a hard disk, optical disks such as CD, DVD, and MO, and a semiconductor memory.

Seventh Embodiment

Figure 44A:
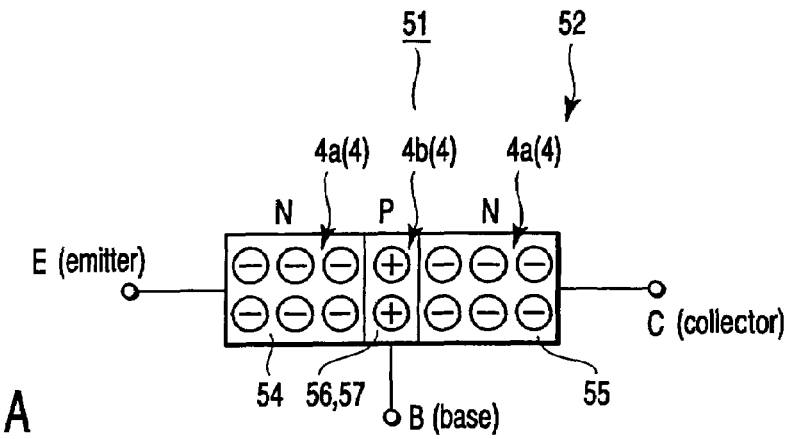
FIGS. 44A, 44B, and 44C are diagrams simplifying and schematically showing the NQS model in an NPN bipolar transistor which is a semiconductor element according to a seventh embodiment.
Figure 44B:
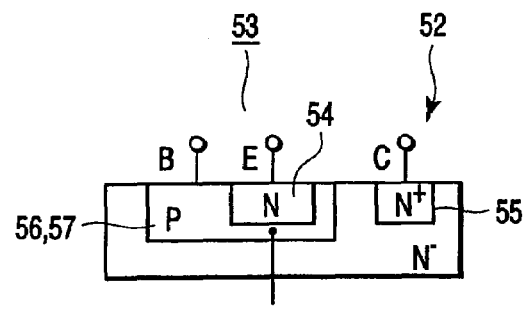
Figure 44C:
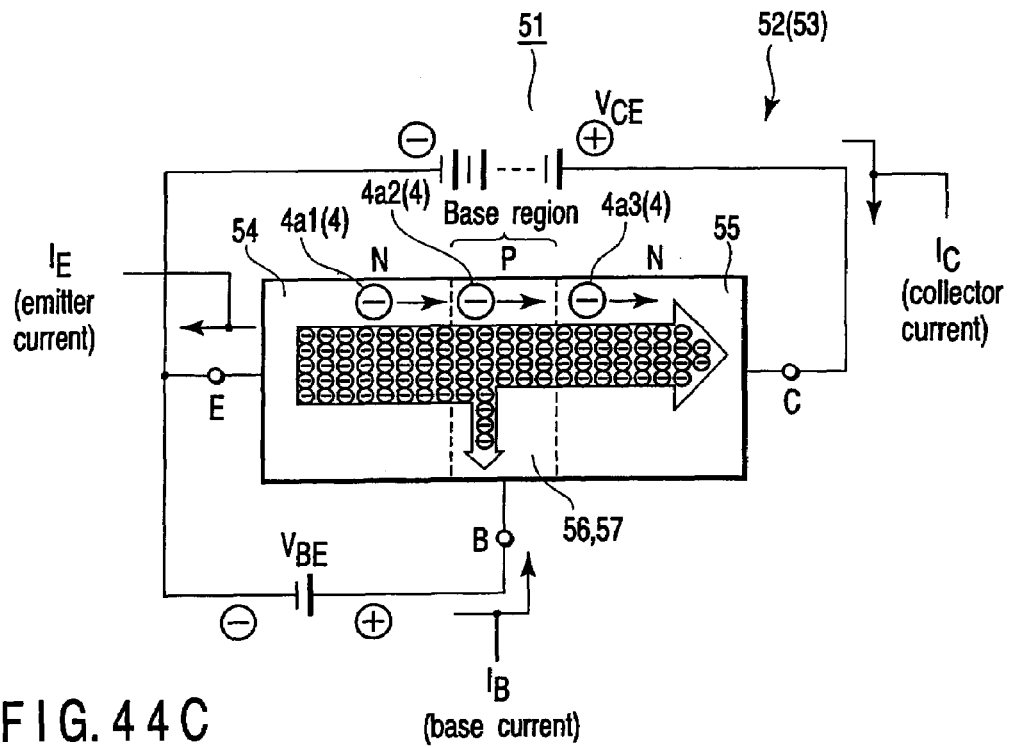
Figure 45A:
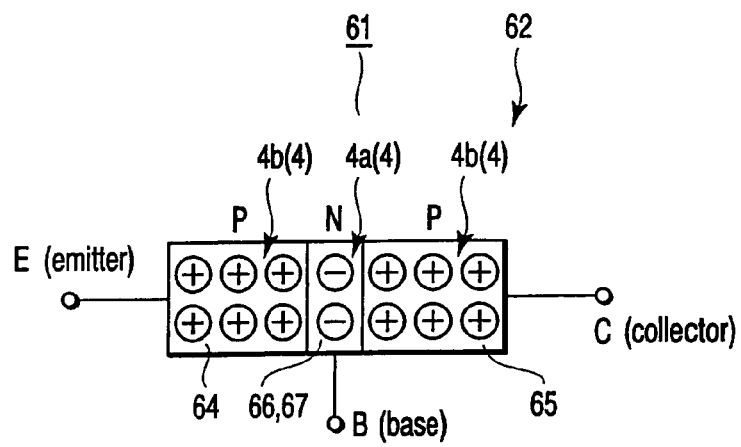
FIGS. 45A, 45B, and 45C are diagrams simplifying and schematically showing the NQS model in a PNP bipolar transistor which is another semiconductor element according to the seventh embodiment.
Figure 45B:
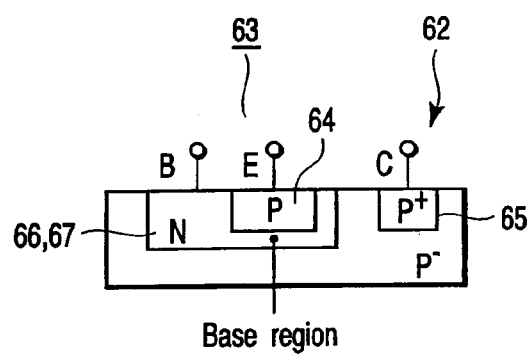
Figure 45C:
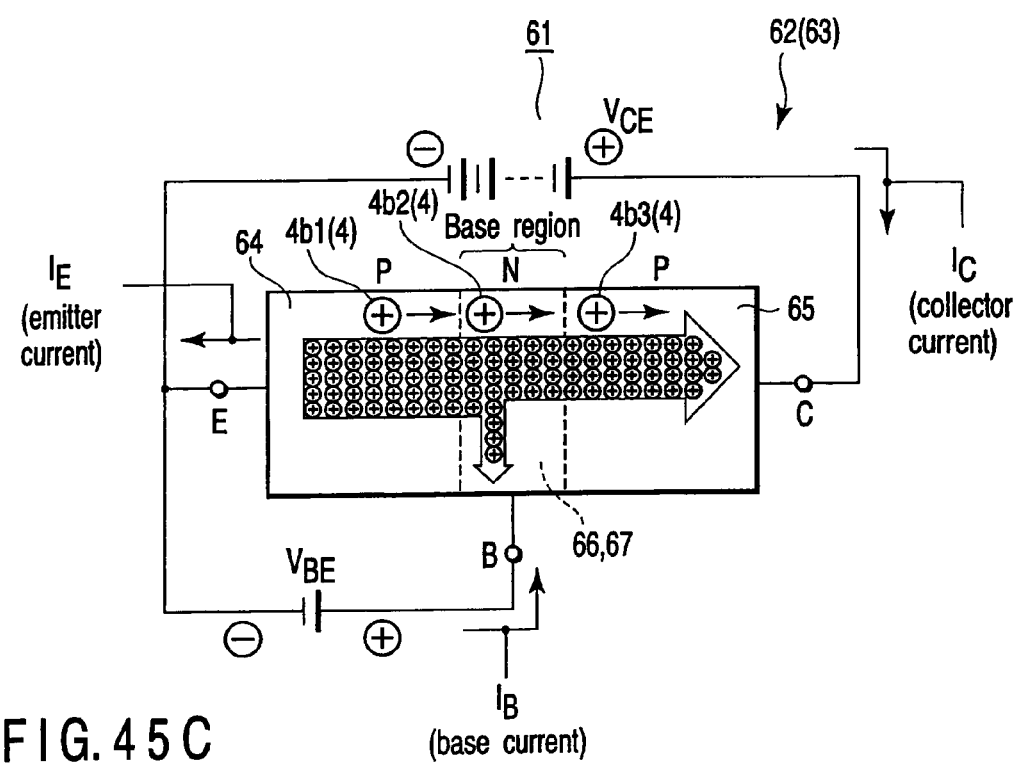
Figure 46A:
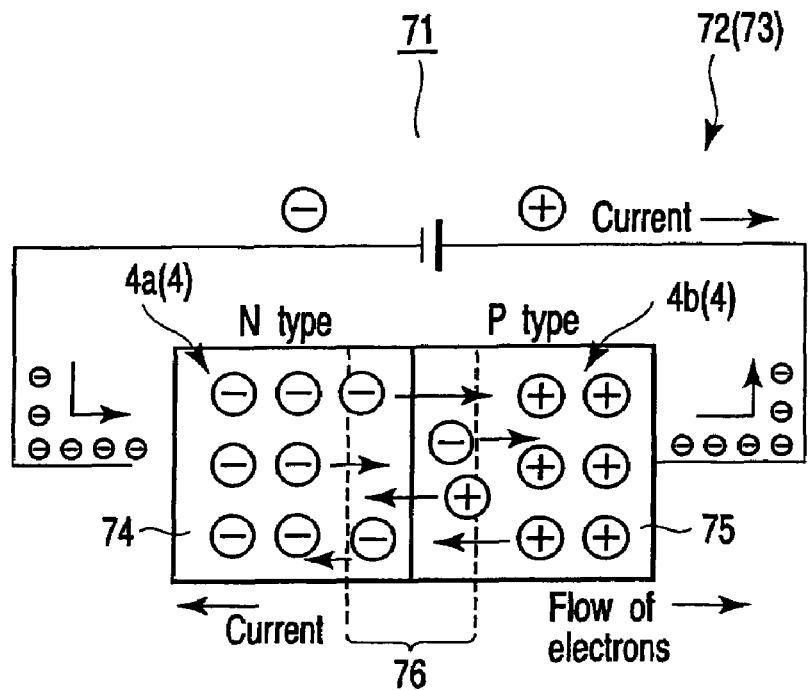
FIGS. 46A and 46B are diagrams simplifying and schematically showing the NQS model in a diode which is another semiconductor element according to the seventh embodiment.
Figure 46B:
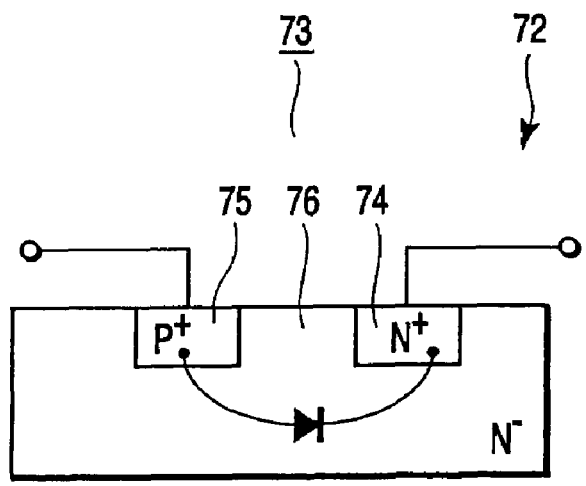

A seventh embodiment of the present invention will be described with reference to FIGS. 44A to 46B. FIGS. 44A, 44B, and 44C are diagrams simplifying and schematically showing an NQS model in an NPN bipolar transistor which is a semiconductor element according to the present embodiment. FIGS. 45A, 45B, and 45C are diagrams simplifying and schematically showing the NQS model in a PNP bipolar transistor which is another semiconductor element according to the present embodiment. FIGS. 46A and 46B are diagrams simplifying and schematically showing the NQS model in a diode which is another semiconductor element according to the present embodiment. It is to be noted that the same components as those of the first to sixth embodiments are denoted with the same reference numerals, and detailed description is omitted.

In the present embodiment, a case will be described where an NQS simulation model for designing the semiconductor device according to the present invention is applied with respect to the semiconductor device comprising semiconductor elements other than a MOSFET 2 instead of the semiconductor device 3 comprising the MOSFET 2 of each of the first to sixth embodiments.

First, as shown in FIGS. 44A, 44B, and 44C, a case will be described where an NQS simulation model 51 for designing a semiconductor device according to the present embodiment is applied to a semiconductor device 53 comprising an NPN bipolar transistor 52 which is a semiconductor element.

As shown in FIGS. 44A, 44B, and 44C, in the NPN bipolar transistor 52, an emitter (N region) is regarded as a first electrode 54, a collector (N region) is regarded as a second electrode 55, and a base is regarded as a third electrode 56. A base region (P region) connected to the base 56 is regarded as a conductive region 57 between the first electrode 54 and the second electrode 55.

As shown in FIG. 44A, in the NPN bipolar transistor 52, a carrier 4 is constituted of two types of electrons $4a$ and a hole $4b$ unlike an MOSFET 2. Therefore, after applying the NQS simulation model 1 for designing the semiconductor device according to each of the first to sixth embodiments with respect to these electrons $4a$ and hole $4b$, results are superimposed, and accordingly effects similar to those of the MOSFET 2 of each of the first to sixth embodiments. Additionally, as shown in FIG. 44C, movements of the carriers 4 in the NPN bipolar transistor 52 can be substantially approximated by the movements of a large number of electrons $4a$.

Therefore, as shown in FIG. 44C, when the NQS simulation model 51 for designing the semiconductor device according to the present embodiment is applied to the NPN bipolar transistor 52 (semiconductor device 53), the electrons $4a$ moving in the NPN bipolar transistor 52 are sufficiently roughly classified into three types and considered in the same manner as in the MOSFET 2. Concretely, the electrons $4a$ moving in the NPN bipolar transistor 52 are roughly classified into an electron $4a_1$ moving to the base 56 (base region 57, P region 57) from the emitter (N region) 54, an electron $4a_2$ moving in the base region (P region) 57, and an electron $4a_3$ moving to the collector (N region) 55 from the base region (P region) 57. Accordingly, even in the NPN bipolar transistor 52 of the present embodiment, results similar to those of the MOSFET 2 of the first to sixth embodiments can be remarkably easily obtained.

Next, as shown in FIGS. 45A, 45B, and 45C, a case will be described where an NQS simulation model 61 for designing another semiconductor device according to the present embodiment is applied to a semiconductor device 63 comprising a PNP bipolar transistor 62 which is a semiconductor element.

As shown in FIGS. 45A, 45B, and 45C, even in the PNP bipolar transistor 62, an emitter (P region) is regarded as a first electrode 64, a collector (P region) is regarded as a second electrode 65, and a base is regarded as a third electrode 66 in the same manner as in the NPN bipolar transistor 52. A base region (N region) connected to the base 66 is regarded as a conductive region 67 between the first electrode 64 and the second electrode 65.

As shown in FIG. 45A, also in the PNP bipolar transistor 62, a carrier 4 is constituted of two types of an electron $4a$ and holes $4b$. Therefore, in the PNP bipolar transistor 62, the carriers 4 in the emitter (P region) 64, collector (P region) 65, and base 66 (base region 57, N region 67) are simply reversed with respect to the carriers of the NPN bipolar transistor 52. Therefore, after applying the NQS simulation model 1 for designing the semiconductor device according to each of the first to sixth embodiments with respect to these electron $4a$ and holes $4b$, results are superimposed, and accordingly effects similar to those of the NPN bipolar transistor 52 can be obtained even in the PNP bipolar transistor 62. Additionally, as shown in FIG. 45C, movements of the carriers 4 in the PNP bipolar transistor 62 can be substantially approximated by the movements of a large number of holes 4b.

Therefore, as shown in FIG. 45C, when the NQS simulation model 61 for designing the semiconductor device according to the present embodiment is applied to the PNP bipolar transistor 62 (semiconductor device 63), the holes 4b moving in the PNP bipolar transistor 62 are sufficiently roughly classified into three types and considered in the same manner as in the MOSFET 2 and the NPN bipolar transistor 52. Concretely, the holes 4b moving in the PNP bipolar transistor 62 are roughly classified into three types including a hole $4b_1$ moving to the base 66 (base region 67, N region 67) from the emitter (P region) 64, a hole $4b_2$ moving in the base region (N region) 67, and a hole $4b_3$ moving to the collector (P region) 65 from the base region (N region) 67. Accordingly, even in the PNP bipolar transistor 62 of the present embodiment, results similar to those of the MOSFET 2 of each of the first to sixth embodiments and the NPN bipolar transistor 52 of the present embodiment can be remarkably easily obtained.

Next, as shown in FIGS. 46A and 46B, a case will be described where an NQS simulation model 71 for designing another semiconductor device according to the present embodiment is applied to a semiconductor device 73 comprising a diode 72 which is a semiconductor element.

As shown in FIGS. 46A and 46B, even in the diode 72, an N region (N-type conductive region) is regarded as a first electrode 74, and a P region (P-type conductive region) is regarded as a second electrode 75. A depletion region in the vicinity of a bonding interface between the N region 74 and the P region 75 is regarded as a conductive region 76 between the N region 74 and the P region 75.

As shown in FIG. 46A, also in the diode 72, a carrier 4 is constituted of two types of an electron 4a and a hole 4b in the same manner as in the NPN bipolar transistor 52 and the PNP bipolar transistor 62. In the diode 72, the carrier 4 in the N region 74 is the electron 4a, and the carrier 4 in the P region 75 is the hole 4b. Moreover, the carriers 4 in the depletion region (conductive region) 76 are the electrons 4a and holes 4b. Therefore, after applying the NQS simulation model 1 for designing the semiconductor device according to each of the first to sixth embodiments with respect to these electrons 4a and holes 4b, results are superimposed, and accordingly effects similar to those of the NPN bipolar transistor 52 and the PNP bipolar transistor 62 can be obtained even in the diode 72.

Moreover, although not shown, even in a case where the NQS simulation model 71 for designing the semiconductor device according to the present embodiment is applied to the diode 72, the carriers 4 moving in the diode 72 are similarly sufficiently roughly classified into three types and considered in the same manner as in the MOSFET 2, the NPN bipolar transistor 52, and the PNP bipolar transistor 62. Concretely, the carriers 4 moving in the diode 72 are roughly classified into three types including a carrier moving to the depletion region (conductive region) 76 from the N region 74, a carrier moving in the depletion region 60, and a carrier moving to the P region 75 from the depletion region 76, and considered. Accordingly, even in the diode 72 of the present embodiment, results similar to those of the MOSFET 2 of each of the first to sixth embodiments, and the NPN bipolar transistor 52 and the PNP bipolar transistor 62 of the present embodiment can be remarkably easily obtained.

As described above, according to the seventh embodiment, effects similar to those of the first to sixth embodiments can be obtained. That is, the operation of the semiconductor element 2 can be simulated quickly within a practically allowable time regardless of a high/low operation speed and with a high precision.

Eighth Embodiment

Next, an eighth embodiment according to the present invention will be described with reference to FIG. 47. It is to be noted that the same components as those of the first to seventh embodiments are denoted with the same reference numerals, and detailed description is omitted.

In the present embodiment, another configuration will be described concerning the above-described simulation model for designing the semiconductor device, the simulation apparatus for designing the semiconductor device, the simulation method for designing the semiconductor device, and the computer-readable recording medium in which simulation program for designing the semiconductor device is recorded according to the present invention.

For example, needless to say, the NQS simulation models 1, 51, 61, 71 and the like developed by the present inventors can be used alone, and may also be incorporated into the existing circuit simulator 11 and the like represented by the SPICE 3 as described in the fourth embodiment.

Moreover, for example, when $(t_i-t_{i-1})/\tau>1$ in the equation (11), this is, in the first equation, the NQS simulation models 1, 51, 61, 71 according to the present invention collapse. In this case, when $t_i$ is set to $\Delta+t_{i-1}$, NQS simulation models 1, 51, 61, 71 can be prevented from being broken. That is, by this setting, carrier density in a transient state can be handled as a quasi-static carrier density in a self-matching manner (naturally) in a case where delay $\tau$ by running of carriers 4, 4a, 4b is shorter than an interval between times $t_i$ and $t_{i-1}$. Conversely, when the delay $\tau$ is longer than the interval between the times $t_i$ and $t_{i-1}$ a difference between the carrier density in the transient state and the quasi-static carrier density increases with an increase of the delay $\tau$. Concretely, when the delay $\tau$ is longer than the interval between the times $t_i$ and $t_{i-1}$, the carrier density in the transient state is smaller than the quasi-static carrier density with an increase of the delay $\tau$.

Furthermore, the present inventors have also developed a simplified NQS simulation model which does not require an additional calculation time and which is capable of can saving the calculation time. In the first to fourth embodiments, the delay model $\tau$ has been roughly classified into three types of $\tau_{chrg}, \tau_{cndt}$ ($\tau_{cndt1}, \tau_{cndt2}$), and $\tau_{dsch}$, and considered. Additionally, as a result of further researches by the present inventors, it has been found that results similar to those of the first to fourth embodiments can be obtained, even when $\tau_{chrg}$ is incorporated into $\tau_{cndt1}$ and simplified. That is, $\tau_{chrg}$ is added to $\tau_{cndt1}$ to constitute $\tau_{diff}$. Accordingly, it has been found that the results similar to those of the first to fourth embodiments can be obtained, even when $\tau_{chrg}$ is omitted from the calculation.

Here, $\tau_{diff}$ is handled as an amount determined by running velocities of the carriers 4, 4a, 4b by diffusion, and represented by the following equation (39).

$$\tau_{diff} = \frac{L^2}{\mu Kt} \quad (39)$$

It is to be noted that in the equation (39), $\mu$ denotes mobility of the carriers 4, 4a, 4b.

Figure 47:
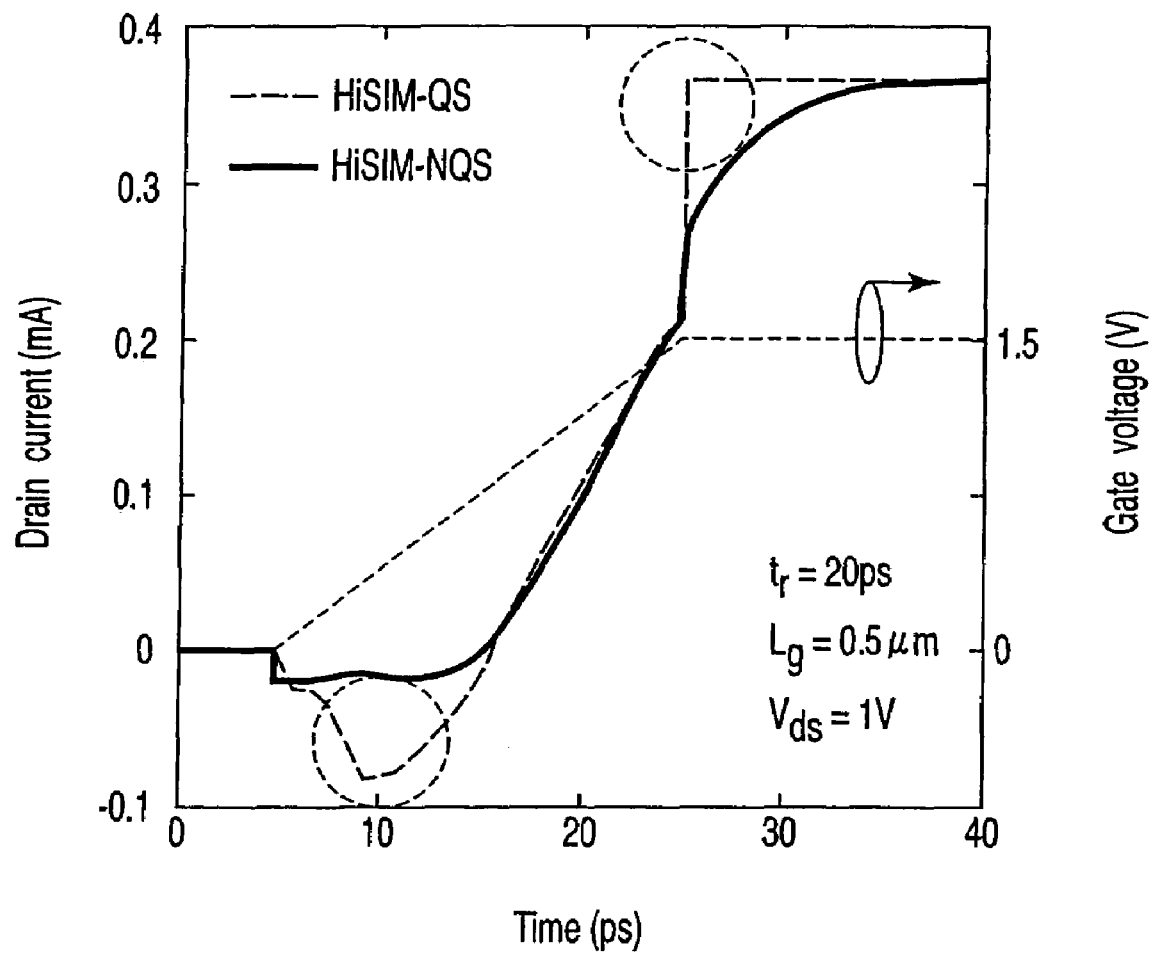
FIG. 47 is a graph showing simulation results of an HiSIM-NQS simulation model according to an eighth embodiment, and a general HiSIM-QS simulation model.

FIG. 47 shows simulation results of an HiSIM-NQS simulation model calculated using $\tau_{diff}$ with respect to the simplified model in which the positions of the carriers 4, 4a, 4b in the channel 8 are not considered by the present inventors, and a general HiSIM-QS simulation model in a graph According to the graph shown in FIG. 47, it has been found that transient phenomenon of the carrier density can be reproduced in the same manner as in the first to fourth embodiments even by a calculation method using $\tau_{diff}$ of the present embodiment.

It is to be noted that in the first equation (11), $Q(t_i)$ denotes a whole carrier density in a quasi-static state calculated by SPICE 3, and $q(t_i)$ denotes a whole carrier density successively calculated by transient carrier calculation.

As described above, according to the eighth embodiment, effects similar to those of the first to seventh embodiments can be obtained. When parameters for use in the calculation are reduced, the calculation time can be further reduced. That is, behaviors of the carriers 4, 4a, 4b in at least two electrodes 5, 6, 54, 55, 64, 65, 74, 75 of semiconductor elements 2, 52, 62, 72 including not only the stationary state but also the transient state and in conductive regions 8, 57, 67, 76 between the electrodes 5, 6, 54, 55, 64, 65, 74, 75 can be analyzed remarkably quickly within a practically allowable time.

Ninth Embodiment

Next, a ninth embodiment according to the present invention will be described although not shown. Concretely, a semiconductor device and a method of manufacturing the semiconductor device according to the present embodiment will be described although not shown. The same components as those of the first to eighth embodiments are denoted with the same reference numerals, and detailed description is omitted.

In semiconductor devices 3, 53, 63, 73 of the present embodiment, at least one of designing and inspecting of semiconductor elements 2, 52, 62, 72 disposed in the semiconductor devices 3, 53, 63, 73 is performed using at least one of the above-described simulation model 1, 51, 61, 71 for designing the semiconductor device, the simulation apparatus 21, 31 for designing the semiconductor device, the simulation method for designing the semiconductor device, the simulation program for designing the semiconductor device, and the computer-readable recording medium 41 in which the program is recorded. Accordingly, analysis precisions of the behaviors of the carriers 4, 4a, 4b in at least two electrodes 5, 6, 54, 55, 64, 65, 74, 75 of the semiconductor elements 2, 52, 62, 72 including not only the stationary state but also the transient state and in the conductive regions 8, 57, 67, 76 between the electrodes 5, 6, 54, 55, 64, 65, 74, 75 are enhanced. Additionally, the analysis is performed quickly within a practically allowable time.

Moreover, in the method of manufacturing the semiconductor device of the present embodiment, at least one of the designing and the inspecting of the semiconductor elements 2, 52, 62, 72 disposed in the semiconductor devices 3, 53, 63, 73 is performed using at least one of the above-described simulation model 1, 51, 61, 71 for designing the semiconductor device, the simulation apparatus 21, 31 for designing the semiconductor device, the simulation method for designing the semiconductor device, the simulation program for designing the semiconductor device, and the computer-readable recording medium 41 in which the program is recorded. Accordingly, the analysis precisions of the behaviors of the carriers 4, 4a, 4b in at least two electrodes 5, 6, 54, 55, 64, 65, 74, 75 of the semiconductor elements 2, 52, 62, 72 including not only the stationary state but also the transient state and in the conductive regions 8, 57, 67, 76 between the electrodes 5, 6, 54, 55, 64, 65, 74, 75 are enhanced. Additionally, the analysis can be performed quickly within the practically allowable time.

As described above, according to the ninth embodiment, effects similar to those of the first to eighth embodiments can be obtained. In the semiconductor device of the present embodiment, at least one of the designing and the inspecting of the semiconductor elements 2, 52, 62, 72 disposed in the semiconductor devices 3, 53, 63, 73 is performed using at least one of the above-described simulation model 1, 51, 61, 71 for designing the semiconductor device, the simulation apparatus 21, 31 for designing the semiconductor device, the simulation method for designing the semiconductor device, the simulation program for designing the semiconductor device, and the computer-readable recording medium 41 in which the program is recorded. Accordingly, the semiconductor devices 3, 53, 63, 73 of the present embodiment are capable of exerting performances substantially as desired. Performances, qualities, and reliabilities of the semiconductor devices 3, 53, 63, 73 are enhanced, and yields are enhanced. Additionally, production efficiencies are enhanced, and the devices can be produced at low costs.

Similarly, in the method of manufacturing the semiconductor device of the present embodiment, at least one of the designing and the inspecting of the semiconductor elements 2, 52, 62, 72 disposed in the semiconductor devices 3, 53, 63, 73 is performed using at least one of the above-described simulation model 1, 51, 61, 71 for designing the semiconductor device, the simulation apparatus 21, 31 for designing the semiconductor device, the simulation method for designing the semiconductor device, the simulation program for designing the semiconductor device, and the computer-readable recording medium 41 in which the program is recorded. Accordingly, the semiconductor devices 3, 53, 63, 73 capable of exerting the performances substantially as desired can be manufactured efficiently and easily. That is, the semiconductor devices 3, 53, 63, 73 whose performances, qualities, and reliabilities are enhanced and whose yields are enhanced can be produced with high production efficiencies and at low costs.

Finally, as described above, one of reasons why the NQS simulation model according to the present invention has to be considered, a response of the carrier hardly follows a voltage operation of an MOSFET operating at a high speed in a conventional NQS simulation model or QS simulation model. To design the semiconductor device capable of exerting the desired performance, the device needs to be designed avoiding this situation. According to researches performed by the present inventors, it has been seen that a quick and satisfactory carrier response can be realized, for example, when a channel length is shortened. However, it is actually remarkably difficult to simply reduce the channel length. Since the channel length largely influences the performance of the semiconductor device, the setting of the length requires remarkably deliberate study.

Therefore, when simulation is performed using the NQS simulation model 1 according to the present invention in designing the semiconductor device, these difficulties can be overcome. That is, when the simulation is performed using the NQS simulation model 1 according to the present invention before actually manufacturing the semiconductor device, a degree of shortening of the channel length for realizing the quick and satisfactory carrier response can be known, for example, in order to design the semiconductor device 3 having the MOS transistor 2 capable of exerting the performance as desired. Accordingly, the semiconductor device 3 comprising the transistor 2 capable of exerting the substantially desired performance and having an appropriate channel length can be efficiently and easily manufactured.

It is to be noted that the simulation model for designing the semiconductor device, the simulation apparatus for designing the semiconductor device, the simulation method for designing the semiconductor device, the computer-readable recording medium in which the simulation program for designing the semiconductor device is recorded, the semiconductor device, and the method of manufacturing the device according to the present invention are not limited to the above-described first to ninth embodiments. Some of the constitutions or manufacturing steps may be changed to various settings without departing from the scope of the present invention, or various settings can be appropriately combined, used, and performed.

For example, the circuit simulator capable of incorporating the NQS simulation model HiSIM 1 according to one embodiment of the present invention is not limited to the SPICE 3 described in the fourth embodiment. The NQS simulation model HiSIM 1 according to one embodiment of the present invention can be used together with other various circuit simulators. In turn-off transient calculation of the MOSFET, a carrier density distribution does not have to be necessarily linearly approximated. When various carrier density distributions appearing with respect to turn-off deviate from linear approximation, corresponding appropriate approximation may be appropriately performed.

Furthermore, the semiconductor element to which the NQS simulation model according to the present invention is applicable is not limited to the above-described MOSFET 2, the NPN bipolar transistor 52, the PNP bipolar transistor 62, and the diode 72. The NQS simulation model according to the present invention can be applied to any semiconductor element as long as the movement of the carrier moving in the semiconductor element can be approximated in a non-quasi-static process regardless of the stationary state or the transient state. Examples of the semiconductor element include capacitors such as DRAM and FeRAM, and various semiconductor elements such as various types of light receiving elements, light emitting diode, semiconductor laser, thyristor and CCD.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A simulation model for designing a semiconductor device being used for a simulation apparatus for designing a semiconductor device, comprising:

assuming that, with respect to at least one semiconductor element having at least two first and second electrodes, a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and said $q(t_i)$, $q(t_{i-1})$, $Q(t_i)$, and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$, and these processes are processed by a first assuming unit included in the simulation apparatus;

assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and said $I(t_i)$, $I_{DC}$, and $dq(t_i)/dt$ satisfy the following second equation at the time $t_i$: $I(t_i)=I_{DC}+dq(t_i)/dt$, and these processes are processed by a second assuming unit included in the simulation apparatus; and substituting said $q(t_i)$ obtained from the first equation into the second equation to thereby describe said $Q(t_i)$ as a non-quasi-static model, and this process is processed by a non-quasi-static model describing unit included in the simulation apparatus.

2. The model according to claim 1, wherein assuming that a time required until a head of the carrier reaches the other electrode from one of the first and second electrodes is $\tau_{cndt}$, and a time required until the carrier is charged between the first and second electrodes from one of the first and second electrodes is $\tau_{chrg}$, it is assumed that said $\tau$, $\tau_{cndt}$, and $\tau_{chrg}$ further satisfy the following third equation: $1/\tau=1/\tau_{cndt}+1/\tau_{chrg}$.

3. The model according to claim 2, wherein assuming that a time required until a head of the carrier charged between the first and second electrodes from one of the first and second electrodes reaches the other electrode from one of the first and second electrodes is $\tau_{cndt1}$ in a state in which any conductive region capable of passing the carrier is not formed between the first and second electrodes, and assuming that a time required until the carrier charged between the first and second electrodes from one of the first and second electrodes moves to the other electrode from one of the first and second electrodes in a state in which the carrier fills between the first and second electrodes to form the conductive region is $\tau_{chrg2}$, it is assumed that said $\tau_{cndt}$, $\tau_{cndt1}$, and $\tau_{cndt2}$ further satisfy the following fourth equation: $1/\tau_{cndt}=1/\tau_{cndt1}+1/\tau_{chrg2}$.

4. The model according to claim 2 or 3, wherein said $\tau_{chrg}$ is estimated in such a manner as to follow a rising time $t_r$ of a control voltage which is a pulse signal applied to a third electrode of the semiconductor element.

5. A simulation apparatus for designing a semiconductor device, comprising:

a first assuming unit which assumes that, with respect to at least one semiconductor element having at least two first and second electrodes, a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and said $q(t_i)$, $q(t_{i-1})$, $Q(t_i)$, and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$;

a second assuming unit which assumes that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and said $I(t_i)$, $I_{DC}$, and $dq(t_i)/dt$ satisfy the following second equation at the time $t_i$: $I(t_i)=I_{DC}+dq(t_i)/dt$; and a non-quasi-static model describing unit which substitutes said $q(t_i)$ obtained from the first equation into the second equation to thereby describe said $Q(t_i)$ as a non-quasi-static model.

6. The apparatus according to claim 5, further comprising:
a third assuming unit which assumes that a time required until a head of the carrier reaches the other electrode from one of the first and second electrodes is $\tau_{cndt}$ and a time required until the carrier is charged between the first and second electrodes from one of the first and second electrodes is $\tau_{chrg}$ to assume that said $\tau$, $\tau_{cndt}$, and $\tau_{chrg}$ further satisfy the following third equation: $1/\tau=1/\tau_{cndt}+1/\tau_{chrg}$.

7. The apparatus according to claim 6, further comprising:
a fourth assuming unit which assumes that a time required until a head of the carrier charged between the first and second electrodes from one of the first and second electrodes reaches the other electrode from one of the first and second electrodes is $\tau_{cndt1}$ in a state in which any conductive region capable of passing the carrier is not formed between the first and second electrodes and which assumes that a time required until the carrier charged between the first and second electrodes from one of the first and second electrodes moves to the other electrode from one of the first and second electrodes is $\tau_{chrg2}$ in a state in which the carrier fills between the first and second electrodes to form the conductive region to assume that said $\tau_{cndt}$, $\tau_{cndt1}$, and $\tau_{cndt2}$ further satisfy the following fourth equation: $1/\tau_{cndt}=1/\tau_{cndt1}+1/\tau_{chrg2}$.

8. The apparatus according to claim 6 or 7, further comprising:
a carrier charging time calculation unit to estimate said $\tau_{chrg}$ in such a manner as to follow a rising time $t_r$ of a control voltage which is a pulse signal applied to a third electrode of the semiconductor element.

9. A simulation method for designing a semiconductor device being executed by a simulation apparatus for designing a semiconductor device, comprising:
assuming that, with respect to at least one semiconductor element having at least two first and second electrodes, a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and said $q(t_i)$, $q(t_{i-1})$, $Q(t_i)$, and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$, and these processes are processed by a first assuming unit included in the simulation apparatus;
assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and said $I(t_i)$, $I_{DC}$, and $dq(t_i)/dt$ satisfy the following second equation at the time $t_i$: $I(t_i)=I_{DC}+dq(t_i)/dt$, and these processes are processed by a second assuming unit included in the simulation apparatus;

substituting said $q(t_i)$ obtained from the first equation into the second equation to thereby describe said $Q(t_i)$ as a non-quasi-static model, and this process is processed by a non-quasi-static model describing unit included in the simulation apparatus; and
analyzing electric characteristics of the semiconductor element using the non-quasi-static model, and this process is processed by the simulation apparatus.

10. The method according to claim 9, further comprising: assuming that a time required until a head of the carrier reaches the other electrode from one of the first and second electrodes is $\tau_{cndt}$, and a time required until the carrier is charged between the first and second electrodes from one of the first and second electrodes is $\tau_{chrg}$, to assume that said $\tau$, $\tau_{cndt}$, and $\tau_{chrg}$ further satisfy the following third equation: $1/\tau=1/\tau_{cndt}+1/\tau_{chrg}$.

11. The method according to claim 10, further comprising: assuming that a time required until a head of the carrier charged between the first and second electrodes from one of the first and second electrodes reaches the other electrode from one of the first and second electrodes is $\tau_{cndt1}$ in a state in which any conductive region capable of passing the carrier is not formed between the first and second electrodes, and assuming that a time required until the carrier charged between the first and second electrodes from one of the first and second electrodes moves to the other electrode from one of the first and second electrodes in a state in which the carrier fills between the first and second electrodes to form the conductive region is $\tau_{chrg2}$, to assume that said $\tau_{cndt}$, $\tau_{cndt1}$, and $\tau_{cndt2}$ further satisfy the following fourth equation: $1/\tau_{cndt}=1/\tau_{cndt1}+1/\tau_{chrg2}$.

12. The method according to claim 10 or 11, further comprising: estimating said $\tau_{chrg}$ in such a manner as to follow a rising time $t_r$ of a control voltage which is a pulse signal applied to a third electrode of the semiconductor element.

13. A computer-readable recording medium recording a simulation program for designing a semiconductor device being used for a simulation apparatus for designing a semiconductor device, the program allowing a computer as the simulation apparatus to execute:
a first assuming process processed by a first assuming unit included in the simulation apparatus of assuming that, with respect to at least one semiconductor element having at least two first and second electrodes, a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and said $q(t_i)$, $q(t_{i-1})$, $Q(t_i)$ and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$;
a second assuming process processed by a second assuming unit included in the simulation apparatus of assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and said $I(t_i)$, $I_{DC}$, and $dq(t_i)/dt$ satisfy the following second equation at the time $t_i$: $I(t_i)=I_{DC}+dq(t_i)/dt$; and
a non-quasi-static model describing process processed by a non-quasi-static model describing unit included in the simulation apparatus of substituting said $q(t_i)$ obtained from the first equation into the second equation to thereby describe said $Q(t_i)$ as a non-quasi-static model.

14. The recording medium according to claim 13, which records the simulation program for designing the semiconductor device, the program allowing the computer to further execute a third assuming process of assuming that a time required until a head of the carrier reaches the other electrode from one of the first and second electrodes is $\tau_{cndt}$, and a time required until the carrier is charged between the first and second electrodes from one of the first and second electrodes is $\tau_{chrg}$, to assume that said $\tau$, $\tau_{cndt}$, and $\tau_{chrg}$ further satisfy the following third equation: $1/\tau = 1/\tau_{cndt} + 1/\tau_{chrg}$.

15. The recording medium according to claim 14, which records the simulation program for designing the semiconductor device, the program allowing the computer to further execute a fourth assuming process of assuming that a time required until a head of the carrier charged between the first and second electrodes from one of the first and second electrodes reaches the other electrode from one of the first and second electrodes is $\tau_{cndt1}$ in a state in which any conductive region capable of passing the carrier is not formed between the first and second electrodes, and assuming that a time required until the carrier charged between the first and second electrodes from one of the first and second electrodes moves to the other electrode from one of the first and second electrodes in a state in which the carrier fills between the first and second electrodes to form the conductive region is $\tau_{chrg2}$, to assume that said $\tau_{cndt}$, $\tau_{cndt1}$, and $\tau_{cndt2}$ further satisfy the following fourth equation: $1/\tau_{cndt} = 1/\tau_{cndt1} + 1/\tau_{chrg2}$.

16. The recording medium according to claim 14 or 15, which records the simulation program for designing the semiconductor device, the program allowing the computer to further execute a carrier charging time calculating process of estimating said $\tau_{chrg}$ in such a manner as to follow a rising time $t_r$ of a control voltage which is a pulse signal applied to a third electrode of the semiconductor element.

17. A semiconductor device comprising:
at least one semiconductor element having at least two first and second electrodes, at least one of designing and inspecting of the semiconductor element being performed using a simulation model for designing the semiconductor device being used for a simulation apparatus for designing a semiconductor device,
the simulation model for designing the semiconductor device, comprising:
assuming that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and said $q(t_i)$, $q(t_{i-1})$, $Q(t_i)$ and $\tau$ satisfy the following first equation for a time $(t_i - t_{i-1})$ from the time $t_{i-1}$ until the time $t_i$: $q(t_i) = q(t_{i-1}) + (t_i - t_{i-1})/\tau[Q(t_i) - q(t_{i-1})]$, and these processes are processed by a first assuming unit included in the simulation apparatus;
assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and said $I(t_i)$, $I_{DC}$, and $dq(t_i)/dt$ satisfy the following second equation at the time $t_i$: $I(t_i) = I_{DC} + dq(t_i)/dt$, and these processes are processed by a second assuming unit included in the simulation apparatus; and
substituting said $q(t_i)$ obtained from the first equation into the second equation to thereby describe said $Q(t_i)$ as a non-quasi-static model, and this process is processed by a non-quasi-static model describing unit included in the simulation apparatus.

18. A semiconductor device comprising:
at least one semiconductor element having at least two first and second electrodes, at least one of designing and inspecting of the semiconductor element being performed using a simulation apparatus for designing the semiconductor device,
the simulation apparatus for designing the semiconductor device, comprising:
a first assuming unit which assumes that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and said $q(t_i)$, $q(t_{i-1})$, $Q(t_i)$, and $\tau$ satisfy the following first equation for a time $(t_i - t_{i-1})$ from the time $t_{i-1}$ until the time $t_i$: $q(t_i) = q(t_{i-1}) + (t_i - t_{i-1})/\tau[Q(t_i) - q(t_{i-1})]$;
a second assuming unit which assumes that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and said $I(t_i)$, $I_{DC}$, and $dq(t_i)/dt$ satisfy the following second equation at the time $t_i$: $I(t_i) = I_{DC} + dq(t_i)/dt$; and
a non-quasi-static model describing unit which substitutes said $q(t_i)$ obtained from the first equation into the second equation to thereby describe said $Q(t_i)$ as a non-quasi-static model.

19. A semiconductor device comprising:
at least one semiconductor element having at least two first and second electrodes, at least one of designing and inspecting of the semiconductor element being performed by a simulation method for designing the semiconductor device being executed by a simulation apparatus for designing a semiconductor device,
the simulation method for designing the semiconductor device, comprising:
assuming that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and said $q(t_i)$, $q(t_{i-1})$, $Q(t_i)$ and $\tau$ satisfy the following first equation for a time $(t_i - t_{i-1})$ from the time $t_{i-1}$ until the time $t_i$: $q(t_i) = q(t_{i-1}) + (t_i - t_{i-1})/\tau[Q(t_i) - q(t_{i-1})]$, and these processes are processed by a first assuming unit included in the simulation apparatus;
assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and said $I(t_i)$, $I_{DC}$, and $dq(t_i)/dt$ satisfy the following second equation at the time $t_i$: $I(t_i)=I_{DC}+dq(t_i)/dt$, and these processes are processed by a second assuming unit included in the simulation apparatus;

substituting said $q(t_i)$ obtained from the first equation into the second equation to thereby describe said $Q(t_i)$ as a non-quasi-static model, and this process is processed by a non-quasi-static model describing unit included in the simulation apparatus; and analyzing electric characteristics of the semiconductor element using the non-quasi-static model, and this process is processed by the simulation apparatus.

20. A semiconductor device comprising:

at least one semiconductor element having at least two first and second electrodes, at least one of designing and inspecting of the semiconductor element being performed by a computer operating based on a simulation program for designing the semiconductor device being used for a simulation apparatus for designing a semiconductor device as the computer, which is read from a computer-readable recording medium, the recording medium recording the simulation program for designing the semiconductor device, which allows the computer to execute:

a first assuming process processed by a first assuming unit included in the simulation apparatus of assuming that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and said $q(t_i)$, $q(t_{i-1})$, $Q(t_i)$ and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$;

a second assuming process processed by a second assuming unit included in the simulation apparatus of assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and said $I(t_i)$, $I_{DC}$, and $dq(t_i)/dt$ satisfy the following second equation at the time $t_i$: $I(t_i)=I_{DC}+dq(t_i)/dt$; and a non-quasi-static model describing process processed by a non-quasi-static model describing unit included in the simulation apparatus of substituting said $q(t_i)$ obtained from the first equation into the second equation to thereby describe said $Q(t_i)$ as a non-quasi-static model.

21. A method of manufacturing a semiconductor device, comprising:

performing at least one of designing and inspecting with respect to at least one semiconductor element having at least two first and second electrodes using a simulation model for designing the semiconductor device being used for a simulation apparatus for designing a semiconductor device, the simulation model for designing the semiconductor device, comprising:

assuming that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and said $q(t_i)$, $q(t_{i-1})$, $Q(t_i)$ and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$, and these processes are processed by a first assuming unit included in the simulation apparatus;

assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and said $I(t_i)$, $I_{DC}$, and $dq(t_i)/dt$ satisfy the following second equation at the time $t_i$: $I(t_i)=I_{DC}+dq(t_i)/dt$, and these processes are processed by a second assuming unit included in the simulation apparatus; and substituting said $q(t_i)$ obtained from the first equation into the second equation to thereby describe said $Q(t_i)$ as a non-quasi-static model, and this process is processed by a non-quasi-static model describing unit including in the simulation apparatus.

22. A method of manufacturing a semiconductor device, comprising:

performing at least one of designing and inspecting with respect to at least one semiconductor element having at least two first and second electrodes using a simulation apparatus for designing the semiconductor device, the simulation apparatus for designing the semiconductor device, comprising:

a first assuming unit which assumes that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and said $q(t_i)$, $q(t_{i-1})$, $Q(t_i)$, and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$;

a second assuming unit which assumes that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and said $I(t_i)$, $I_{DC}$, and $dq(t_i)/dt$ satisfy the following second equation at the time $t_i$: $I(t_i)=I_{DC}+dq(t_i)/dt$; and a non-quasi-static model describing unit which substitutes said $q(t_i)$ obtained from the first equation into the second equation to thereby describe said $Q(t_i)$ as a non-quasi-static model.

23. A method of manufacturing a semiconductor device, comprising:

performing at least one of designing and inspecting with respect to at least one semiconductor element having at least two first and second electrodes using a simulation method for designing the semiconductor device being executed by a simulation apparatus for designing a semiconductor device, the simulation method for designing the semiconductor device, comprising:

assuming that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and said $q(t_i)$, $q(t_{i-1})$, $Q(t_i)$ and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$, and these processes are processed by a first assuming unit included in the simulation apparatus;

assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and said $I(t_i)$, $I_{DC}$, and $dq(t_i)/dt$ satisfy the following second equation at the time $t_i$: $I(t_i)=I_{DC}+dq(t_i)/dt$, and these processes are processed by a second assuming unit included in the simulation apparatus;

substituting said $q(t_i)$ obtained from the first equation into the second equation to thereby describe said $Q(t_i)$ as a non-quasi-static model, and this process is processed by a non-quasi-static model describing unit included in the simulation apparatus; and analyzing electric characteristics of the semiconductor element using the non-quasi-static model, and this process is processed by the simulation apparatus.

24. A method of manufacturing a semiconductor device, comprising:

performing at least one of designing and inspecting with respect to at least one semiconductor element having at least two first and second electrodes by a computer operating based on a simulation program for designing the semiconductor device being used for a simulation apparatus for designing a semiconductor device as the computer, which is read from a computer-readable recording medium, the recording medium recording the simulation program for designing the semiconductor device, which allows the computer to execute:

a first assuming process processed by a first assuming unit included in the simulation apparatus of assuming that a transient density of a carrier at a predetermined time $t_i$ including a delay of the carrier running between the first and second electrodes is $q(t_i)$, a transient density of the carrier at a predetermined time $t_{i-1}$ before the time $t_i$ is $q(t_{i-1})$, a density of the carrier between the first and second electrodes in a quasi-static state assumed at the time $t_i$ is $Q(t_i)$, further a time required for the carrier to reach the other electrode from one of the first and second electrodes is $\tau$, and said $q(t_i)$, $q(t_{i-1})$, $Q(t_i)$, and $\tau$ satisfy the following first equation for a time $(t_i-t_{i-1})$ from the time $t_{i-1}$ until the time $t_i$: $q(t_i)=q(t_{i-1})+(t_i-t_{i-1})/\tau[Q(t_i)-q(t_{i-1})]$;

a second assuming process processed by a second assuming unit included in the simulation apparatus of assuming that a current flowing between the first and second electrodes at the time $t_i$ is $I(t_i)$, a quasi-static conduction current between the first and second electrodes, determined by the voltage applied at the time $t_i$, is $I_{DC}$, further a displacement current flowing between the first and second electrodes is $dq(t_i)/dt$, and said $I(t_i)$, $I_{DC}$, and $dq(t_i)/dt$ satisfy the following second equation at the time $t_i$: $I(t_i)=I_{DC}+dq(t_i)/dt$; and a non-quasi-static model describing process processed by a non-quasi-static model describing unit included in the simulation apparatus of substituting said $q(t_i)$ obtained from the first equation into the second equation to thereby describe said $Q(t_i)$ as a non-quasi-static model.

* * * * *